(12) United States Patent
Umezaki et al.

(10) Patent No.: US 11,373,615 B2
(45) Date of Patent: Jun. 28, 2022

(54) SEMICONDUCTOR DEVICE

(71) Applicant: Semiconductor Energy Laboratory Co., Ltd., Atsugi (JP)

(72) Inventors: Atsushi Umezaki, Kanagawa (JP); Ryo Arasawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/070,128

(22) Filed: Oct. 14, 2020

(65) Prior Publication Data

US 2021/0118392 A1 Apr. 22, 2021

Related U.S. Application Data

(63) Continuation of application No. 15/866,514, filed on Jan. 10, 2018, now Pat. No. 10,810,961, which is a
(Continued)

(30) Foreign Application Priority Data

Jul. 24, 2009 (JP) ................................. 2009-172949

(51) Int. Cl.
*G09G 3/36* (2006.01)
*G11C 19/18* (2006.01)
(Continued)

(52) U.S. Cl.
CPC ......... *G09G 3/3677* (2013.01); *G11C 19/184* (2013.01); *H01L 27/124* (2013.01);
(Continued)

(58) Field of Classification Search
None
See application file for complete search history.

(56) References Cited

U.S. PATENT DOCUMENTS 5,323,357 A 6/1994 Kaneko
5,612,228 A 3/1997 Shieh et al.
(Continued)

FOREIGN PATENT DOCUMENTS

CN 100480827 C 4/2009
EP 0508652 A 10/1992
(Continued)

OTHER PUBLICATIONS

International Search Report (Application No. PCT/JP2010/061367) dated Sep. 7, 2010.
(Continued)

*Primary Examiner* — Nicholas J Lee
(74) *Attorney, Agent, or Firm* — Fish & Richardson P.C.

(57) ABSTRACT

It is an object to provide a semiconductor device which can supply a signal with sufficient amplitude to a scan line while power consumption is kept small. Further, it is an object to provide a semiconductor device which can suppress distortion of a signal supplied to the scan line and shorten a rising time and a falling time while power consumption is kept small. A semiconductor device which includes a plurality of pixels each including a display element and at least one first transistor and a scan line driver circuit supplying a signal for selecting the plurality of pixels to a scan line. A light-transmitting conductive layer is used for a pixel electrode layer of the display element, a gate electrode layer of the first transistor, source and drain electrode layers of the first transistor, and the scan line. The scan line driver circuit includes a second transistor and a capacitor for holding a voltage between a gate electrode layer of the second transistor and a source electrode layer of the second transistor. The source electrode of the second transistor is connected to the scan line.

12 Claims, 19 Drawing Sheets

Related U.S. Application Data continuation of application No. 15/412,263, filed on Jan. 23, 2017, now Pat. No. 9,875,713, which is a continuation of application No. 12/835,273, filed on Jul. 13, 2010, now Pat. No. 9,779,679.

(51) Int. Cl.
  *H01L 27/12*   (2006.01)
  *H01L 49/02*   (2006.01)
  *G09G 3/3266*  (2016.01)
  *G09G 3/34*    (2006.01)

(52) U.S. Cl.
  CPC ...... *H01L 27/1225* (2013.01); *H01L 27/1251* (2013.01); *H01L 27/1255* (2013.01); *H01L 28/40* (2013.01); *G09G 3/3266* (2013.01); *G09G 3/344* (2013.01); *G09G 2300/0809* (2013.01); *G09G 2310/0213* (2013.01); *G09G 2310/0267* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,295,046 B1 | 9/2001 | Hebiguchi |
| 6,528,816 B1 | 3/2003 | Jackson et al. |
| 6,563,174 B2 | 5/2003 | Kawasaki et al. |
| 6,630,920 B1 | 10/2003 | Maekawa et al. |
| 6,727,522 B1 | 4/2004 | Kawasaki et al. |
| 6,730,970 B1 | 5/2004 | Katoh et al. |
| 6,738,109 B2 | 5/2004 | Jeon |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,092,047 B2 | 8/2006 | Jeon |
| 7,105,868 B2 | 9/2006 | Nause et al. |
| 7,157,321 B2 | 1/2007 | Arao et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,443,202 B2 | 10/2008 | Kimura et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,522,146 B2 | 4/2009 | Edo et al. |
| 7,528,410 B2 | 5/2009 | Arao et al. |
| 7,674,650 B2 | 3/2010 | Akimoto et al. |
| 7,687,808 B2 | 3/2010 | Umezaki |
| 7,732,251 B2 | 6/2010 | Hoffman et al. |
| 7,732,819 B2 | 6/2010 | Akimoto et al. |
| 7,738,623 B2 | 6/2010 | Tobita |
| 7,749,825 B2 | 7/2010 | Honda |
| 7,760,846 B2 | 7/2010 | Peng et al. |
| 7,859,510 B2 | 12/2010 | Umezaki |
| 7,910,490 B2 | 3/2011 | Akimoto et al. |
| 7,932,521 B2 | 4/2011 | Akimoto et al. |
| 7,964,876 B2 | 6/2011 | Umezaki |
| 7,982,215 B2 | 7/2011 | Inoue et al. |
| 8,030,195 B2 | 10/2011 | Inoue et al. |
| 8,110,436 B2 | 2/2012 | Hayashi et al. |
| 8,168,983 B2 | 5/2012 | Yagi |
| 8,203,144 B2 | 6/2012 | Hoffman et al. |
| 8,212,247 B2 | 7/2012 | Kang et al. |
| 8,222,098 B2 | 7/2012 | Honda |
| 8,274,077 B2 | 9/2012 | Akimoto et al. |
| 8,319,214 B2 | 11/2012 | Imai |
| 8,330,492 B2 | 12/2012 | Umezaki |
| 8,456,396 B2 | 6/2013 | Umezaki |
| 8,456,400 B2 | 6/2013 | Fujita et al. |
| 8,462,100 B2 | 6/2013 | Umezaki |
| 8,466,463 B2 | 6/2013 | Akimoto et al. |
| 8,598,591 B2 | 12/2013 | Umezaki |
| 8,605,027 B2 | 12/2013 | Pak et al. |
| 8,629,069 B2 | 1/2014 | Akimoto et al. |
| 8,643,586 B2 | 2/2014 | Umezaki |
| 8,647,031 B2 | 2/2014 | Hoffman et al. |
| 8,669,550 B2 | 3/2014 | Akimoto et al. |
| 8,785,990 B2 | 7/2014 | Honda |
| 8,790,959 B2 | 7/2014 | Akimoto et al. |
| 8,796,069 B2 | 8/2014 | Akimoto et al. |
| 9,245,891 B2 | 1/2016 | Umezaki |
| 9,312,393 B2 | 4/2016 | Honda |
| 9,583,513 B2 | 2/2017 | Umezaki |
| 10,062,716 B2 | 8/2018 | Umezaki |
| 10,134,775 B2 | 11/2018 | Umezaki |
| 10,553,618 B2 | 2/2020 | Umezaki |
| 10,685,987 B2 | 6/2020 | Umezaki |
| 10,978,497 B2 | 4/2021 | Umezaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0043104 A1 | 3/2003 | Lee et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carola et al. |
| 2004/0189585 A1 | 9/2004 | Moon |
| 2005/0017302 A1 | 1/2005 | Hoffman |
| 2005/0199959 A1 | 9/2005 | Chiang et al. |
| 2006/0007102 A1 | 1/2006 | Yasuoka et al. |
| 2006/0035452 A1 | 2/2006 | Carola et al. |
| 2006/0043377 A1 | 3/2006 | Hoffman et al. |
| 2006/0061535 A1 | 3/2006 | Kim et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0141685 A1 | 6/2006 | Kim et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0040786 A1 | 2/2007 | Chung |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063211 A1 | 3/2007 | Iwasaki |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0229409 A1 | 10/2007 | Shin |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0007296 A1 | 1/2008 | Umezaki |
| 2008/0038882 A1 | 2/2008 | Takechi et al. |
| 2008/0038929 A1 | 2/2008 | Chang |
| 2008/0042963 A1 | 2/2008 | Fujita |

(56) References Cited

U.S. PATENT DOCUMENTS

| | | | |
|---|---|---|---|
| 2008/0050595 A1 | 2/2008 | Nakagawara et al. |
| 2008/0062112 A1 | 3/2008 | Umezaki |
| 2008/0067528 A1 | 3/2008 | Choi et al. |
| 2008/0073653 A1 | 3/2008 | Iwasaki |
| 2008/0079001 A1 | 4/2008 | Umezaki et al. |
| 2008/0079685 A1 | 4/2008 | Umezaki et al. |
| 2008/0080661 A1 | 4/2008 | Tobita |
| 2008/0083950 A1 | 4/2008 | Pan et al. |
| 2008/0106191 A1 | 5/2008 | Kawase |
| 2008/0123002 A1 | 5/2008 | Yeh |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0231617 A1 | 9/2008 | Miyake et al. |
| 2008/0246716 A1 | 10/2008 | Miyake et al. |
| 2008/0246717 A1 | 10/2008 | Miyake et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0017569 A1 | 1/2009 | Moon et al. |
| 2009/0051839 A1 | 2/2009 | Lin et al. |
| 2009/0068773 A1 | 3/2009 | Lai et al. |
| 2009/0073325 A1 | 3/2009 | Kuwabara et al. |
| 2009/0104723 A1 | 4/2009 | Hosoya et al. |
| 2009/0114910 A1 | 5/2009 | Chang |
| 2009/0114918 A1 | 5/2009 | Wang et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0231310 A1 | 9/2009 | Tsai et al. |
| 2009/0278122 A1 | 11/2009 | Hosono et al. |
| 2009/0280600 A1 | 11/2009 | Hosono et al. |
| 2009/0284449 A1 | 11/2009 | Lee et al. |
| 2009/0305461 A1 | 12/2009 | Akimoto et al. |
| 2009/0310734 A1 | 12/2009 | Umezaki |
| 2010/0026619 A1* | 2/2010 | Umezaki | G09G 3/3648 345/100 |
| 2010/0134396 A1 | 6/2010 | Umezaki |
| 2010/0141642 A1 | 6/2010 | Furuta et al. |
| 2010/0321372 A1* | 12/2010 | Iwamoto | G09G 3/3677 345/212 |
| 2011/0104851 A1 | 5/2011 | Akimoto et al. |
| 2011/0121290 A1 | 5/2011 | Akimoto et al. |
| 2013/0107154 A1 | 5/2013 | Umezaki |
| 2014/0145187 A1 | 5/2014 | Umezaki |
| 2021/0320129 A1 | 10/2021 | Umezaki |

FOREIGN PATENT DOCUMENTS

| | | |
|---|---|---|
| EP | 1737044 A | 12/2006 |
| EP | 1770788 A | 4/2007 |
| EP | 1895545 A | 3/2008 |
| EP | 1933293 A | 6/2008 |
| EP | 1995787 A | 11/2008 |
| EP | 1998373 A | 12/2008 |
| EP | 1998374 A | 12/2008 |
| EP | 1998375 A | 12/2008 |
| EP | 2061087 A | 5/2009 |
| EP | 2169711 A | 3/2010 |
| EP | 2189988 A | 5/2010 |
| EP | 2226847 A | 9/2010 |
| EP | 2278618 A | 1/2011 |
| JP | 51-025580 B | 7/1976 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-125525 A | 5/1990 |
| JP | 04-298895 A | 10/1992 |
| JP | 05-053147 A | 3/1993 |
| JP | 05-251705 A | 9/1993 |
| JP | 07-235678 A | 9/1995 |
| JP | 08-264794 A | 10/1996 |
| JP | 11-505377 | 5/1999 |
| JP | 11-296129 A | 10/1999 |
| JP | 2000-044236 A | 2/2000 |
| JP | 2000-150900 A | 5/2000 |
| JP | 2001-144298 A | 5/2001 |
| JP | 2002-076356 A | 3/2002 |
| JP | 2002-518844 | 6/2002 |
| JP | 2002-289859 A | 10/2002 |
| JP | 2002-311879 A | 10/2002 |
| JP | 2003-086000 A | 3/2003 |
| JP | 2003-086808 A | 3/2003 |
| JP | 2003-243658 A | 8/2003 |
| JP | 2003-273361 A | 9/2003 |
| JP | 2004-103957 A | 4/2004 |
| JP | 2004-273614 A | 9/2004 |
| JP | 2004-273732 A | 9/2004 |
| JP | 2005-123360 A | 5/2005 |
| JP | 2005-189819 A | 7/2005 |
| JP | 2005-352147 A | 12/2005 |
| JP | 2006-024350 A | 1/2006 |
| JP | 2006-278621 A | 10/2006 |
| JP | 2007-096055 A | 4/2007 |
| JP | 2007-123861 A | 5/2007 |
| JP | 2007-134687 A | 5/2007 |
| JP | 2007-194628 A | 8/2007 |
| JP | 2007-529119 | 10/2007 |
| JP | 2008-046661 A | 2/2008 |
| JP | 2008-083692 A | 4/2008 |
| JP | 2008-089874 A | 4/2008 |
| JP | 2008-287134 A | 11/2008 |
| JP | 2009-099847 A | 5/2009 |
| JP | 2009-099953 A | 5/2009 |
| JP | 2009-124124 A | 6/2009 |
| JP | 2009-141342 A | 6/2009 |
| JP | 2011-023695 A | 2/2011 |
| KR | 2008-0031114 A | 4/2008 |
| TW | 200730985 | 8/2007 |
| TW | 200818215 | 4/2008 |
| TW | 200917490 | 4/2009 |
| TW | 200919432 | 5/2009 |
| TW | 200937377 | 9/2009 |
| WO | WO-1999/066540 | 12/1999 |
| WO | WO-2004/114391 | 12/2004 |
| WO | WO-2005/093850 | 10/2005 |
| WO | WO-2007/043493 | 4/2007 |
| WO | WO-2009/034750 | 3/2009 |
| WO | WO-2009/041713 | 4/2009 |

OTHER PUBLICATIONS

Written Opinion (Application No. PCT/JP2010/061367) dated Sep. 7, 2010.

Coates.D et al., "Optical Studies of the Amorphous Liquid-Cholesteric Liquid Crystal Transition:the "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated By TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven By Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW'09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga⇒Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies In ZnO", Appl. Phys. Lett. (Applied Physics Letters), 2005, vol. 87, pp. 122102-1-122102-3.
Clark.S et al., "First Principles Methods Using Castep", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects In ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Taiwanese Office Action (Application No. 99122983) dated Aug. 28, 2014.
Taiwanese Office Action (Application No. 104110677) dated Jul. 4, 2016.
Korean Office Action (Application No. 2012-7004253) dated Dec. 30, 2016.
Taiwanese Office Action (Application No. 107105639) dated Sep. 25, 2018.
Taiwanese Office Action (Application No. 108104606) dated Dec. 5, 2019.
Taiwanese Office Action (Application No. 109116743) dated Mar. 3, 2021.

\* cited by examiner

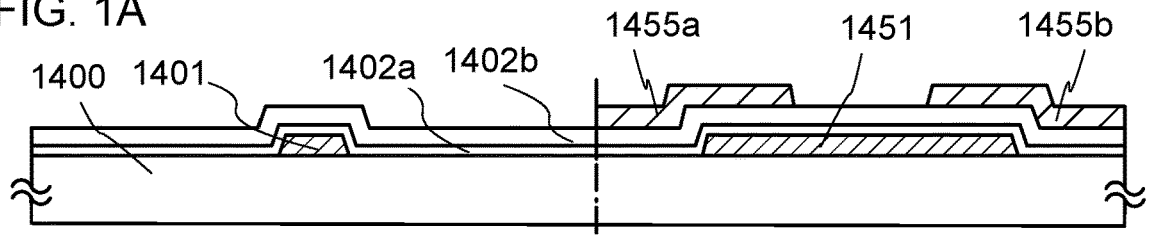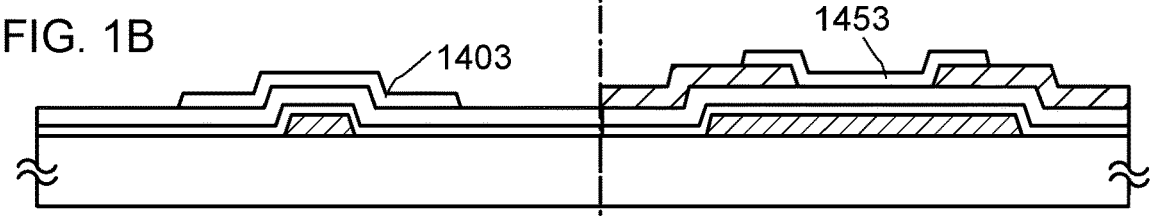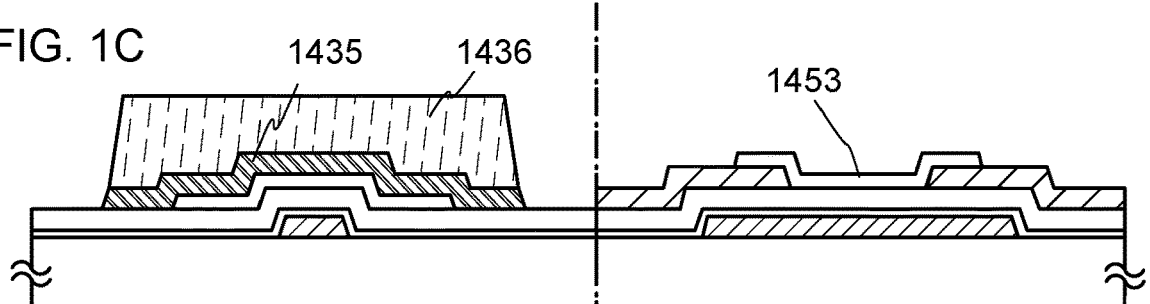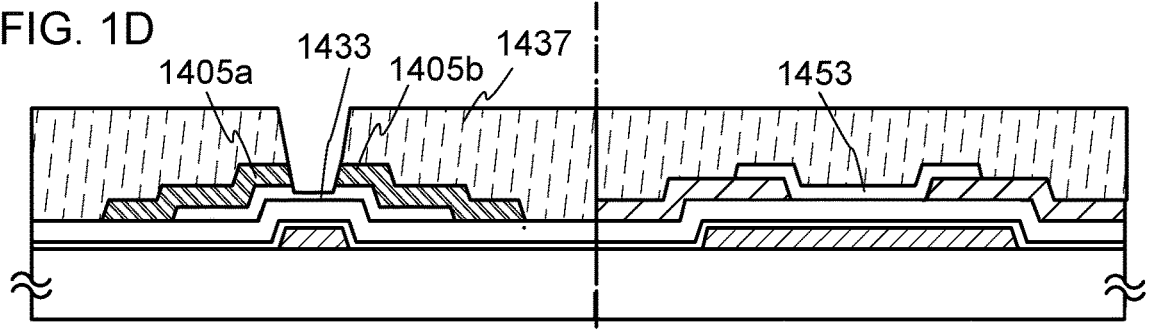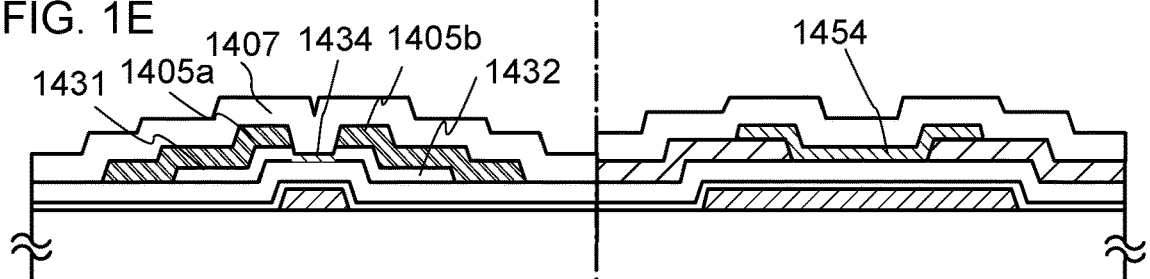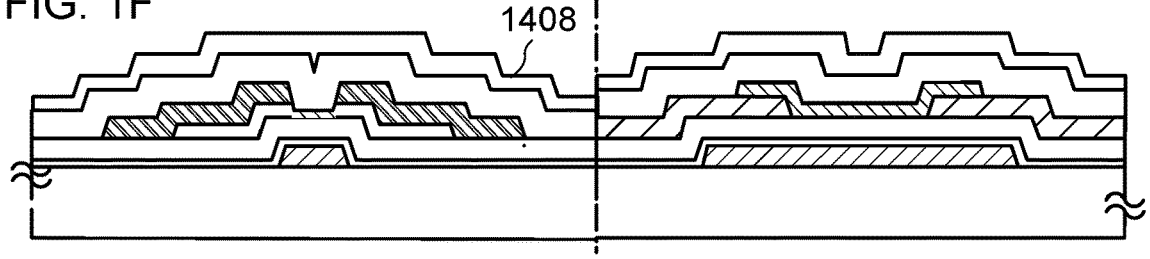

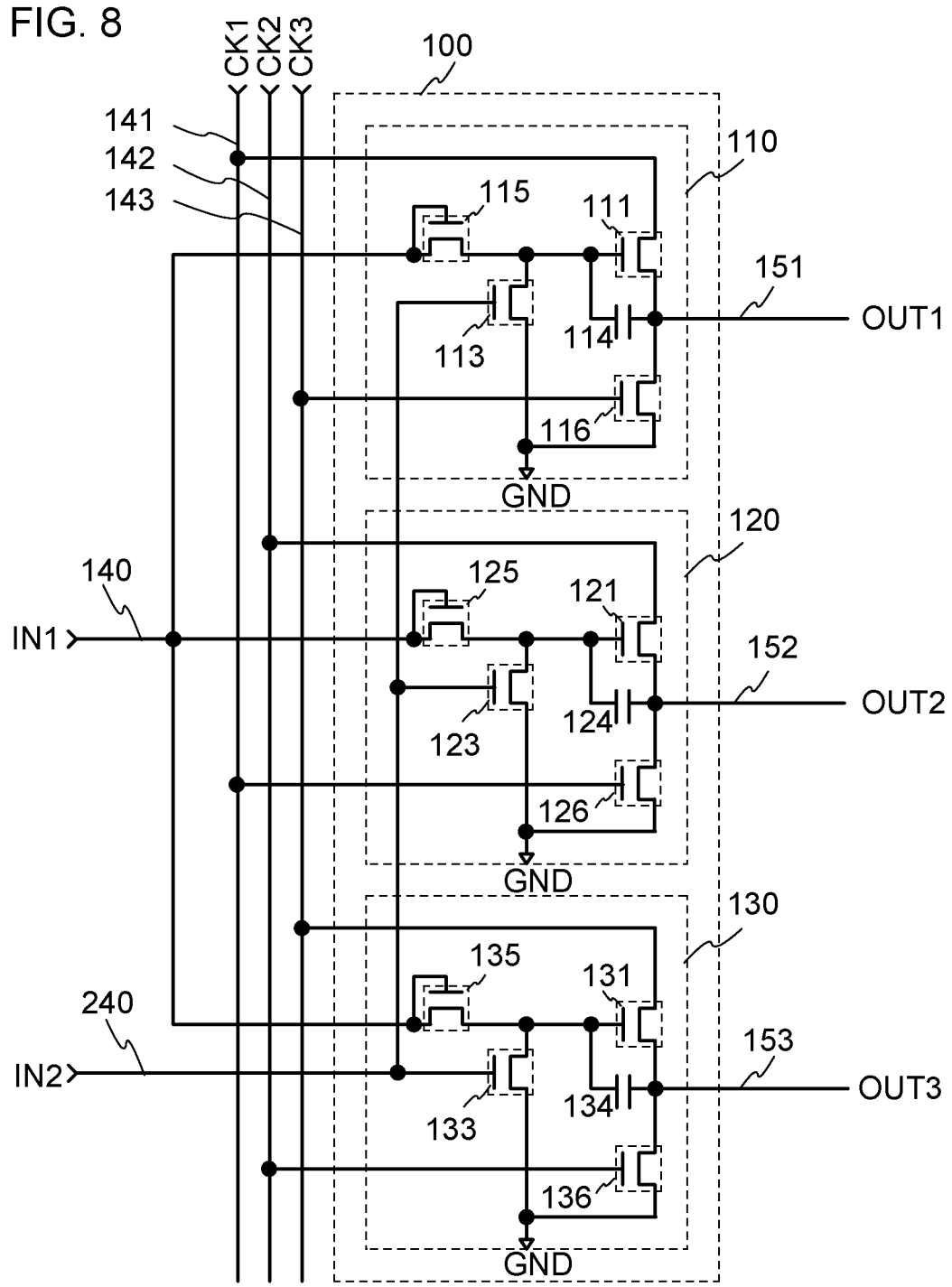

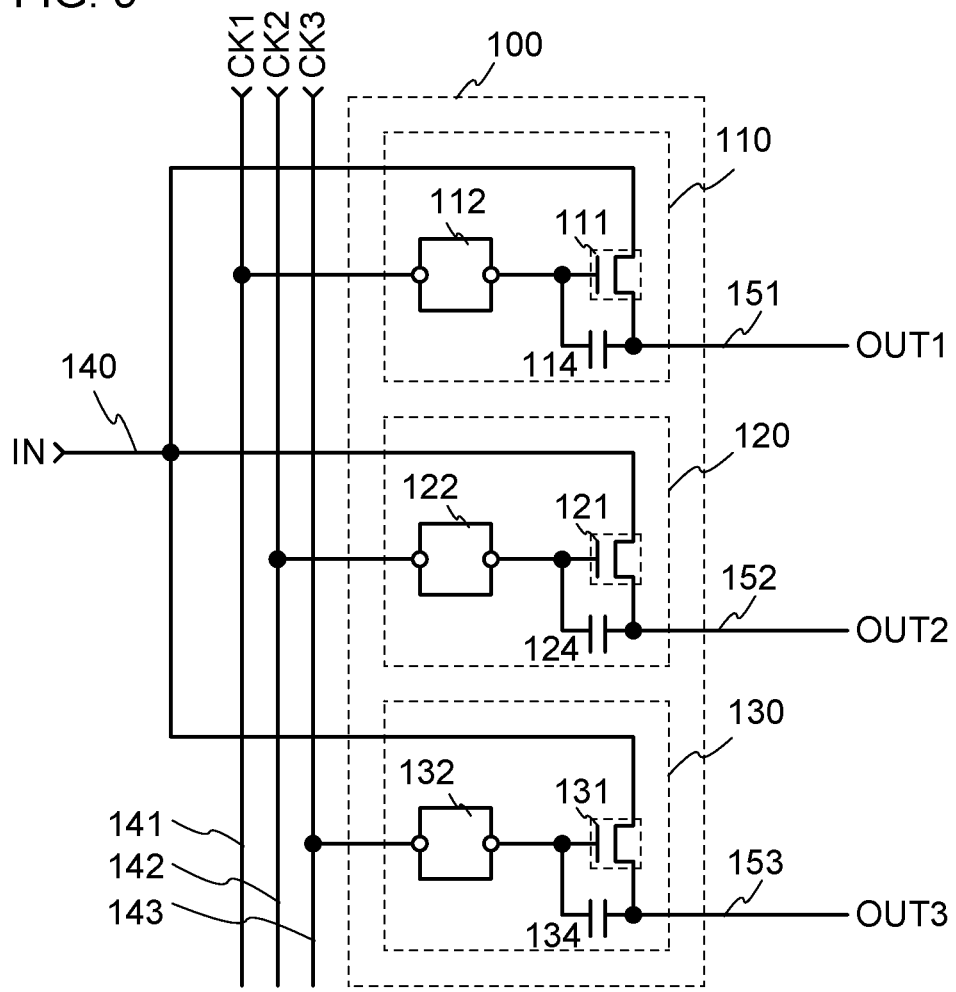

SEMICONDUCTOR DEVICE

CROSS-REFERENCE TO RELATED APPLICATIONS

This application is a continuation of U.S. application Ser. No. 15/866,514, filed Jan. 10, 2018, now allowed, which is a continuation of U.S. application Ser. No. 15/412,263, filed Jan. 23, 2017, now U.S. Pat. No. 9,875,713, which is a continuation of U.S. application Ser. No. 12/835,273, filed Jul. 13, 2010, now U.S. Pat. No. 9,779,679, which claims the benefit of a foreign priority application filed in Japan as Serial No. 2009-172949 on Jul. 24, 2009, all of which are incorporated by reference.

TECHNICAL FIELD

This invention is related to an active matrix semiconductor device.

BACKGROUND ART

In an active matrix display device, a plurality of scan lines are led to intersect with a plurality of signal lines in a row direction and a column direction, and pixels each including a transistor, a pixel electrode, and a storage capacitor are provided at the intersections. The pixels are controlled by the plurality of scan lines which sequentially drives the pixels and the plurality of signal lines which supplies display signals to pixel electrodes. The scan line is connected to a scan line driver circuit for controlling the scan line. The signal line is connected to a signal line driver circuit for controlling the signal line. In order to control a plurality of pixels sequentially, the scan line driver circuit includes as many output terminals as the scan lines. The signal line driver circuit includes as many output terminals as the signal lines.

Note that, in recent years, a display device has come to have high definition and to be larger in size, and it is a problem that power consumption is increased as the number of scan lines and signal lines are increased. Meanwhile, reduction in power consumption is highly needed. A technique in which power consumption is reduced by reduction of the number of outputs of an external driver circuit is disclosed.

Specifically, there is a technique described in Patent Document 1 below: a plurality of scan line switching element and a scan line driver circuit including a scan line driver IC and a scan line signal branch circuit are manufactured, whereby the number of output terminals of the scan line driver IC, so that driving of low power consumption can be realized and the duty ratio of the scan line switching element can be reduced to improve reliability.

REFERENCE

[Patent Document 1] Japanese Published Patent Application No. 2002-311879

DISCLOSURE OF INVENTION

In the conventional technique, in the case where a unipolar scan line switching element is employed, the amplitude of a scan line selection signal is often smaller than that of an output signal of a scan line driver circuit by the threshold voltage (Vth) of the scan line switching element (the scan line selection signal=the output signal of the scan line driver circuit−Vth of the scan line switching element) when an output signal of a scan line driver circuit is supplied to a scan line through a scan line switching element. A transistor can be used as the scan line switching element, for example; here, the scan line switching element is described as a transistor.

The output signal of the scan line driver circuit is inputted to a gate electrode of the transistor and one of source and drain electrodes, which decrease the amplitude of the output signal of the scan line driver circuit by the Vth of the transistor (such a signal is a scan line selection signal). For example, the output signal of the scan line driver circuit is inputted to the gate electrode of the transistor and one of the source and drain electrodes, and the transistor is turned on. Since the transistor is turned on, the potential of the other of the source and drain electrodes is changed so as to be the same as the potential of the output signal of the scan line driver circuit. However, a voltage Vgs between the gate electrode and the source electrode of the transistor sometimes becomes Vth before the potential of the other of the source and drain electrodes becomes the same as that of the output signal of the scan line driver circuit. In this case, since the transistor is turned off, the potential of the other of the source and drain electrodes stops changing, which results in making the amplitude of a scan line selection signal supplied to the scan line smaller than that of the output signal of the scan line driver circuit by of the transistor.

In another example, a scan line selection signal is sometimes distorted. Further, a rising time and a falling time of the scan line selection signal are sometimes long. The above reason brings these phenomena. For example, an output signal of the scan line driver circuit is inputted to the gate electrode of the transistor and one of the source and drain electrodes and the transistor is turned on. Since the transistor is turned on, the potential of the other of the source and drain electrodes is changed so as to be the same as that of the output signal of the scan line driver circuit. At that time, Vgs of the transistor sometimes becomes small in accordance with a change of the potential of the other of the source and drain electrodes of the transistor, so that the scan line selection signal is often distorted and a rising time and a falling time often become long.

In order to solve the above problem, a signal with higher amplitude than an output signal of the scan line driver circuit or a power supply voltage is additionally needed but it causes an increase in power consumption.

It is an object to provide a semiconductor device which can supply a signal with sufficient amplitude to a scan line while power consumption is kept small. Further, it is an object to provide a semiconductor device which can suppress distortion of a signal supplied to the scan line and can make a rising time and a falling time shorten while power consumption is kept small.

An embodiment of this invention is a semiconductor device including a display element, a plurality of pixels each including at least one transistor, a scan line driver circuit for supplying a signal for selecting a specific pixel from among the plurality of pixels to a scan line. A pixel electrode layer of the display element, a gate electrode layer of a transistor, source and drain electrode layers of the transistor, and a scan line are formed using a light-transmitting conductive layer. The scan line driver circuit includes a transistor and a capacitor for holding voltage between the gate electrode layer and the source electrode layer of the transistor. The source electrode layer of the transistor is connected to the scan line.

An embodiment of this invention is a semiconductor device including a display element, a plurality of pixels each including at least one first transistor, and a scan line driver circuit supplying a signal for selecting a specific pixel from among the plurality of pixels to a scan line. A pixel electrode layer of the display element, a gate electrode layer of the first transistor, source and drain electrode layers of the transistor, and the scan line are formed using a light-transmitting conductive layer. A scan line driver circuit includes a second transistor, a capacitor for holding voltage between a gate electrode layer of the second transistor and a source electrode layer of the second transistor, and a third transistor for controlling connection between the gate electrode layer of the second transistor and a ground electrode. The source electrode of the second transistor is connected to the scan line.

An embodiment of this invention enables a signal with sufficient amplitude to be supplied to a scan line by bootstrap operation. Further, an embodiment of this invention can suppress distortion of a signal and shorten a rising time and a falling time. Furthermore, an embodiment of this invention does not need to have a power supply voltage which is higher than the voltage of an input signal, which results in low power consumption driving.

BRIEF DESCRIPTION OF DRAWINGS

In the accompanying drawings:

FIGS. 1A to 1F are cross-sectional views illustrating Embodiment 1;

FIGS. 3A-1 and 3A-2 are plan views and FIGS. 3B and 3C are cross-sectional views each illustrating Embodiment 1;

FIG. 8 is a circuit diagram for illustrating Embodiment 5;

FIG. 9 is a circuit diagram for illustrating Embodiment 6;

BEST MODE FOR CARRYING OUT THE INVENTION

Embodiments of this invention will be described with reference to the drawings. Note that this invention is not limited to the following description, and it will be easily understood by those skilled in the art that various changes and modifications can be made without departing from the spirit and scope of this invention. Thus, this invention should not be interpreted as being limited to the following description of the embodiments.

Embodiment 1

Figure 2A:
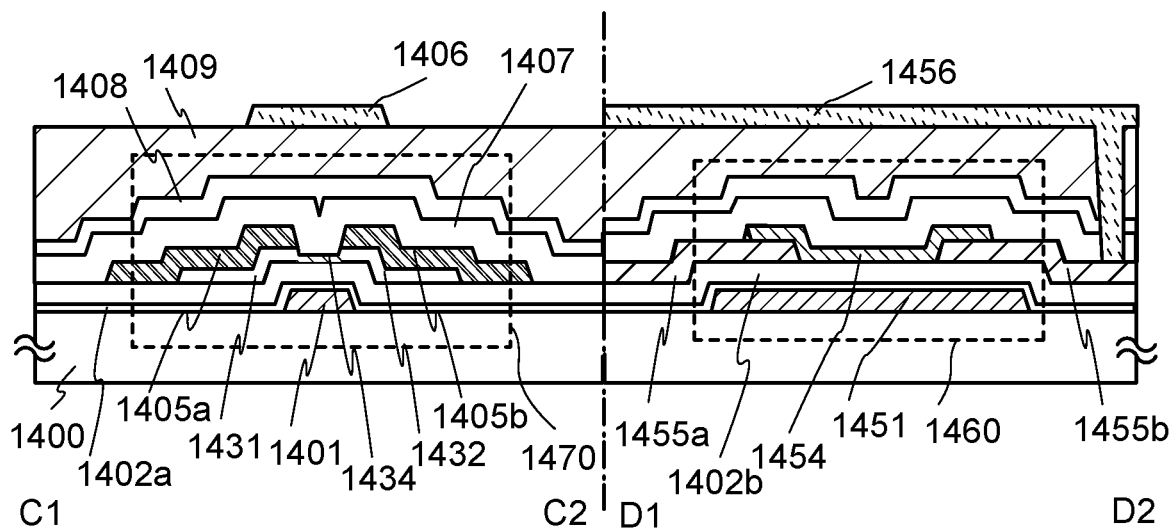
FIGS. 2A and 2C are cross-sectional views and FIGS. 2B-1 and 2B-2 are plan views each illustrating Embodiment 1.

A semiconductor device and a manufacturing method of the semiconductor device will be described with reference to FIGS. 1A to 1F and FIGS. 2A, 2B-1, 2B-2, and 2C. FIG. 2A illustrates an example of a cross-sectional structure of two thin film transistors which have different structures from each other and are formed over the same substrate. FIG. 2A illustrates a thin film transistor 1470 of a channel-etched type which is one of bottom gate structures and a thin film transistor 1460 of a bottom-contacted type (an inverted coplanar type) which is one of bottom gate structures.

Figures 1, 2B:
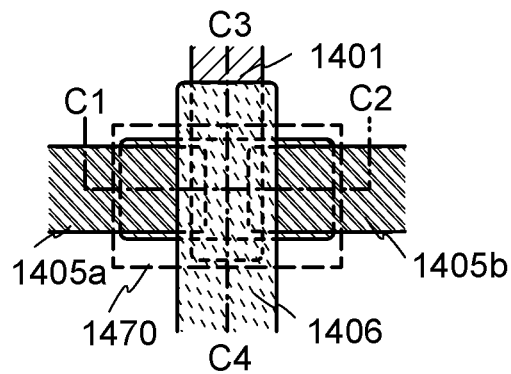

FIG. 2B-1 is a plan view of the channel-etched thin film transistor 1470 provided in a driver circuit. FIG. 2A is a cross-sectional view taken along line C1-C2 in FIG. 2B-1. In addition, FIG. 2C is a cross-sectional view taken along line C3-C4 in FIG. 2B-1.

The thin film transistor 1470 provided in the driver circuit is a channel-etched thin film transistor and includes a gate electrode layer 1401; a first gate insulating layer 1402a; a second gate insulating layer 1402b; an oxide semiconductor layer including at least a channel formation region 1434, a first high resist drain region 1431, and a second high resist drain region 1432; a source electrode layer 1405a; and a drain electrode layer 1405b over a substrate 1400 having an insulation surface. Further, an oxide insulating layer 1407 is provided so as to cover the thin film transistor 1470 and to be in contact with the channel formation region 1434.

The first high resist drain region 1431 is formed in a self-aligned manner in contact with a bottom surface of the source electrode layer 1405a. Further, the second high resist drain region 1432 is formed in a self-aligned manner in contact with a bottom surface of the drain electrode layer 1405b. In addition, the channel formation region 1434 is in contact with the oxide insulating layer 1407, has thin thickness, and is a region with higher resist (an I type region) than that of the first high resist drain region 1431 and that of the second high resist drain region 1432.

In addition, in the thin film transistor 1470, it is preferable that a metal material be used for the source electrode layer 1405a and the drain electrode layer 1405b in order to make wirings have low resistance.

In addition, when a pixel portion and a driver circuit are formed over the same substrate in the liquid crystal display device, in the driver circuit, only one of positive polarity and negative polarity is applied between the source and drain electrodes of a thin film transistor for constituting a logic gate such as an inverter circuit, a NAND circuit, a NOR circuit, and a latch circuit or a thin film transistor for constituting an analog circuit such as a sense amplifier, a constant voltage generating circuit, and a VCO. Therefore, the width of the second high resist drain region 1432 which needs to withstand voltage may be designed to be larger than that of the first high resist drain region 1431. Further, the width of the gate electrode layer overlapping with the first high resist drain region 1431 and the second high resist drain region 1432 may be large.

Further, the thin film transistor 1470 provided in the driver circuit is described with use of a single gate thin film transistor; however, a multi gate thin film transistor including a plurality of channel formation regions can be used as necessary.

Further, a conductive layer 1406 is formed over the channel formation region 1434 to overlap therewith. The conductive layer 1406 is electrically connected to the gate electrode layer 1401 and has the same potential as the gate electrode layer 1401, so that a gate voltage can be applied from the upper and lower sides of the oxide semiconductor provided between the gate electrode layer 1401 and the conductive layer 1406. Further, when the potential of the conductive layer 1406 is different from that of the gate electrode layer 1401 and is, for example, a fixed potential, GND, and 0 V, the electrical characteristics of the thin film transistor such as a threshold voltage can be controlled.

In addition, a protection insulating layer 1408 and a planarizing insulating layer 1409 are stacked between the conductive layer 1406 and the oxide insulating layer 1407.

Further, it is preferable to use a structure in which the protection insulating layer 1408 is in contact with the first gate insulating layer 1402a provided below the protection insulating layer 1408 or an insulating layer serving as a base and which prevents an impurity such as moisture, a hydrogen ion, and OH⁻ from entering the oxide semiconductor layer from the side direction. In particular, when the first gate insulating layer 1402a or the insulating film serving as a base in contact with the protection insulating layer 1408 is a silicon nitride film, the effect is enhanced.

Figures 2, 2B:
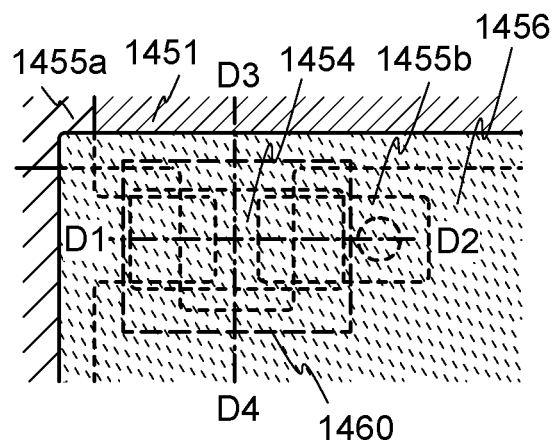
Figure 2C:
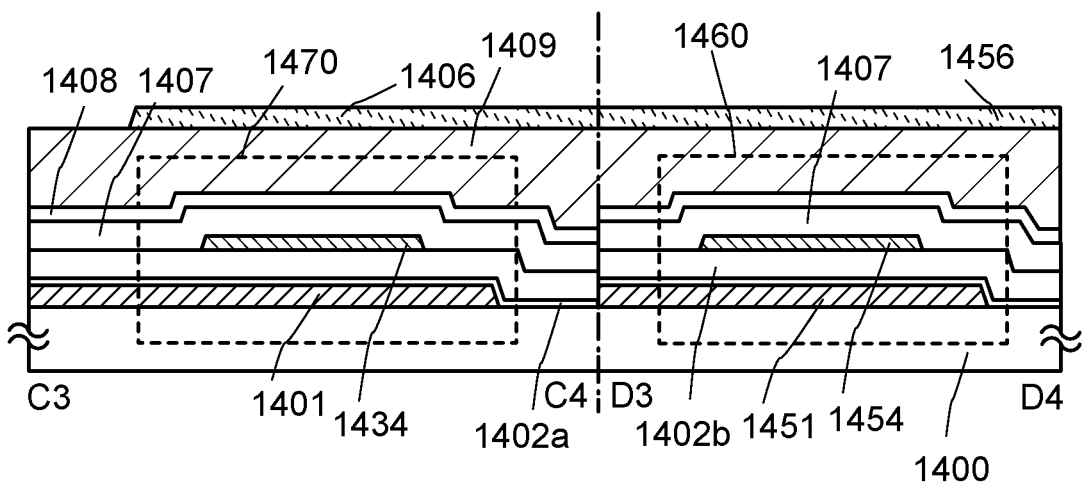

Note that FIG. 2B-2 is a plan view of the bottom-contacted thin film transistor 1460 provided in a pixel. FIG. 2A is a cross-sectional view taken along line D1-D2 in FIG. 2B-2. Further, FIG. 2C is a cross-sectional view taken along line D3-D4 in FIG. 2B-2.

The thin film transistor 1460 provided in the pixel is a bottom-contacted thin film transistor and includes a gate electrode layer 1451, the first gate insulating layer 1402a, the second gate insulating layer 1402b, an oxide semiconductor layer 1454 including a channel formation region, a source electrode layer 1455a, and a drain electrode layer 1455b over the substrate 1400 having an insulation surface. Further, an oxide insulating layer 1407 is provided so as to cover the thin film transistor 1460 and to be in contact with a top surface and a side surface of the oxide semiconductor layer 1454.

Note that an AC drive is performed in a liquid crystal display device in order to prevent deterioration of liquid crystal. The AC drive allows the polarity of a signal potential applied to a pixel electrode layer to be inverted to be negative or positive at regular intervals of time. In a thin film transistor connected to the pixel electrode layer, a pair of electrodes functions alternately as a source electrode layer and a drain electrode layer respectively. In this specification, one of thin film transistors of a pixel is referred to as a source electrode layer and the other is a drain electrode layer in convenience; actually, in the AC drive, one of electrodes functions as a source electrode layer and a drain electrode layer, alternately. In addition, in order to reduce leakage current, the width of the gate electrode layer 1451 of the thin film transistor 1460 provided in the pixel can be smaller than that of the gate electrode layer 1401 of the thin film transistor 1470 of the driver circuit. In addition, in order to reduce leakage current, the gate electrode layer 1451 of the thin film transistor 1460 provided in the pixel may be designed not to overlap with the source electrode layer 1455a or the drain electrode layer 1455b.

Further, the thin film transistor 1460 provided in the pixel is described with use of a single gate thin film transistor; however, a multi gate thin film transistor including a plurality of channel formation regions can be used as necessary.

Further, heat treatment is performed on the oxide semiconductor layer 1454 in order to reduce impurities such as moisture (heat treatment for dehydration and dehydrogenation) after at least an oxide semiconductor film is formed. After heat treatment for dehydration and dehydrogenation and slow cooling, the oxide insulating layer 1407 is formed in contact with the oxide semiconductor layer 1454 to reduce the carrier concentration of the oxide semiconductor layer 1454, which leads to improvement of the electrical characteristics and reliability of the thin film transistor 1460.

Note that the oxide semiconductor layer 1454 is formed over and partly overlaps with the source electrode layer 1455a and the drain electrode layer 1455b. Further, the oxide semiconductor layer 1454 overlaps with the gate electrode layer 1451 with the first gate insulating layer 1402a and the second gate insulating layer 1402b therebetween. The channel formation region of the thin film transistor 1460 provided in the pixel is a region where the oxide semiconductor layer 1454 is sandwiched between a side surface of the source electrode layer 1455a and the side surface of the drain electrode layer 1455b which faces the side surface of the source electrode layer 1455a, that is, a region which is in contact with the second gate insulating layer 1402b and overlaps with the gate electrode layer 1451.

In addition, in order that a display device of which the aperture ratio is high may be realized using a light-transmitting thin film transistor as the thin film transistor 1460, a light-transmitting conductive film is used for the source electrode layer 1455a and the drain electrode layer 1455b.

Further, a light-transmitting conductive film is also used for the gate electrode layer 1451 of the thin film transistor 1460.

Furthermore, in the pixel provided with the thin film transistor 1460, a conductive film having a light-transmitting property with respect to visible light is used as a pixel electrode layer 1456, the other electrode layer (such as a capacitor electrode layer), or the other wiring layer (such as a capacitor wiring layer); therefore, a display device with a high aperture ratio is realized. Needless to say, it is preferable that a conductive film having a light-transmitting property with respect to visible light also be used for the gate insulating layer 1402a, the gate insulating layer 1402b, and the oxide insulating layer 1407.

In this specification, a film having a light-transmitting property with respect to visible light is a film with a thickness of which transmittance is 75% or more and 100% or less with respect to visible light. When the film is conductive, the film is also referred to as a transparent conductive film In addition, a conductive film which is semi-transmissive with respect to visible light may be used for a gate electrode layer, a source electrode layer, a drain electrode layer, a pixel electrode layer, the other electrode layer, or a metal oxide applied to the other wiring layer. The words "semi-transmissive with respect to visible light" means that the transmittance of visible light is 50% or more and 75% or less.

Manufacturing process of the thin film transistor 1470 and the thin film transistor 1460 which are formed over the same substrate is described below with reference to FIGS. 1A to 1F, and FIG. 2A.

First, a light-transmitting conductive film is formed over the substrate 1400 having an insulation surface; then, the gate electrode layers 1401 and 1451 are formed by a first photolithography process. In addition, in a pixel portion, a capacitor wiring layer is formed by the same first photolithography process using a light-transmitting material which is the same material as the gate electrode layers 1401 and 1451. Further, when the driver circuit needs a capacitor, a capacitor wiring layer is formed not only in the pixel portion but also in the driver circuit. Note that a resist mask may be formed by an ink jet method. When a resist mask may be formed by an ink jet method, a photomask is not needed; therefore, manufacturing cost can be reduced.

Although there is no particular limitation on a substrate which can be used for the substrate 1400 having an insulation surface, it is necessary that the substrate have at least enough heat resistance to withstand heat treatment to be performed later. As the substrate 1400 having an insulating surface, a barium borosilicate glass substrate, an aluminoborosilicate glass substrate, or a glass substrate whose distortion point is 600° C. to 750° C. can be used.

Note that when heat treatment performed later is performed at high temperature, it is preferable that a glass substrate whose distortion point be 730° C. or more is used as the glass substrate 1400. Further, for example, a glass material such as aluminosilicate glass, aluminoborosilicate glass, or barium borosilicate glass is used for the glass substrate 1400. Note that, in general, a glass substrate contains a larger amount of barium oxide (BaO) than that of boric acid, whereby a heat-resistant glass substrate which is further practical can be obtained. Therefore, a glass substrate containing BaO and $B_2O_3$ where the amount of BaO is larger than that of $B_2O_3$ is preferably used.

Note that a substrate formed of an insulator such as a ceramic substrate, a quartz substrate, or a sapphire substrate may be used instead of the glass substrate 1400. Alternatively, crystallized glass or the like can be used.

Note that an insulating film serving as a base film may be provided between the substrate 1400 and the gate electrode layers 1401 and 1451. The base film has a function of preventing diffusion of an impurity element from the substrate 1400 and can be formed to have a single-layer or stacked-layer structure using one or more of a silicon nitride film, a silicon oxide film, a silicon nitride oxide film, and a silicon oxynitride film.

A conductive material having a light-transmitting property with respect to visible light such as an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, and a Zn—O-based metal oxide can be used as a material of the gate electrode layers 1401 and 1451. The thickness of the gate electrode layers 1401 and 1451 is appropriately selected in the range of 50 nm to 300 nm. As a deposition method of a metal oxide used for the gate electrode layers 1401 and 1451, a sputtering method, a vacuum evaporation method (an electron beam evaporation method), an arc ion plating method, or a spray method is used. Note that when a sputtering method is used, deposition is performed using a target including $SiO_2$ at 2 percent by weight or more and 10 percent by weight or less and a light-transmitting conductive film is made to include SiOx (X>0) which suppresses crystallization, so that crystallization can be suppressed when heat treatment is performed for dehydration and dehydrogenation performed in a later process.

Next, a gate insulating layer is formed over the gate electrode layers 1401 and 1451.

The gate insulating layer can be formed by a single layer or a stacked layer of a silicon oxide layer, a silicon nitride layer, a silicon oxynitride layer, or a silicon nitride oxide layer and by a plasma CVD method or a sputtering method. For example, a silicon oxynitride layer may be formed by a plasma CVD method using a deposition gas containing $SiH_4$, oxygen, and nitrogen.

In this embodiment, a gate insulating layer is a stacked layer of the first gate insulating layer 1402a with a thickness of 50 nm or more and 200 nm or less and the second gate insulating layer 1402b with a thickness of 50 nm or more and 300 nm or less. A silicon nitride film or a silicon nitride oxide film with a thickness of 100 nm is used as the first gate insulating layer 1402a. Further, a silicon oxide film with a thickness of 100 nm is used as the second gate insulating layer 1402b.

Next, after a light-transmitting conductive film is formed over the second gate insulating layer 1402b, the source electrode layer 1455a and the drain electrode layer 1455b are formed by a second photolithography process (see FIG. 1A). As a deposition method of the light-transmitting conductive film, a sputtering method, a vacuum evaporation method (an electron beam evaporation method), an arc ion plating method, or a spray method is used. A conductive material having a light-transmitting property with respect to visible light such as an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, and a Zn—O-based metal oxide can be used as a material of the conductive film. The thickness of the conductive film is appropriately selected in the range of 50 nm to 300 nm. Note that when a sputtering method is used, deposition is performed using a target including $SiO_2$ at 2 percent by weight or more and 10 percent by weight or less and a light-transmitting conductive film is made to include SiOx (X>0) which suppresses crystallization, so that crystallization can be suppressed when heat treatment is performed for dehydration and dehydrogenation performed in a later process.

Note that a resist mask for forming the source electrode layer 1455a and the drain electrode layer 1455b may be formed by an ink jet method. When a resist mask may be formed by an ink jet method, a photomask is not needed; therefore, manufacturing cost can be reduced.

Next, an oxide semiconductor film with a thickness of 2 nm or more and 200 nm or less is formed over the second gate insulating layer 1402b, the source electrode layer 1455a, and the drain electrode layer 1455b. The thickness is preferably 50 nm or less in order that the oxide semiconductor layer may be amorphous even when heat treatment for dehydration and dehydrogenation is performed after the oxide semiconductor film is formed. Thin thickness of the oxide semiconductor layer can suppress crystallization when heat treatment is performed after the oxide semiconductor layer is formed.

Note that before the oxide semiconductor film is formed by a sputtering method, dust on a surface of the second gate insulating layer 1402b is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in a vicinity of the substrate to modify a surface. Note that nitrogen, helium, oxygen, or the like may be used instead of an argon atmosphere.

The following film is used for the oxide semiconductor film: an In—Ga—Zn—O-based non-single-crystal film; an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, a Sn—O-based oxide semiconductor film, and a Zn—O-based oxide semiconductor film In this embodiment, the oxide semiconductor film is formed by a sputtering method with use of an In—Ga—Zn—O-based oxide semiconductor target. Alternatively, the oxide semiconductor film can be formed by a sputtering method under a rare gas (typically argon) atmosphere, an oxygen atmosphere, or an atmosphere including a rare gas (typically argon) and oxygen. Note that when a sputtering method is used, deposition is performed using a target including $SiO_2$ at 2 percent by weight or more and 10 percent by weight or less and the oxide semiconductor film is made to include SiOx (X>0) which suppresses crystallization, so that crystallization can be suppressed when heat treatment is performed for dehydration and dehydrogenation performed in a later process.

Next, the oxide semiconductor film is processed into an island-shape oxide semiconductor layer by a third photolithography process. Note that in order to obtain the oxide semiconductor layer overlapping with the source electrode layer 1455a and the drain electrode layer 1455b, materials and conditions of etching are adjusted as appropriate in case the source electrode layer 1455a and the drain electrode layer 1455b should be removed in etching of the oxide semiconductor layer. Note that a resist mask for forming the island-shape oxide semiconductor layer may be formed by an ink jet method. When a resist mask may be formed by an ink jet method, a photomask is not needed; therefore, manufacturing cost can be reduced.

Next, dehydration and dehydrogenation of the oxide semiconductor layer is performed. Temperature in first heat treatment at which dehydration and dehydrogenation is performed is 350° C. or more and less than a distortion point of a substrate, or more preferably 400° C. or more. Here, the substrate is introduced into an electric furnace which is one of heat treatment devices and heat treatment is performed on the oxide semiconductor layer under a nitrogen atmosphere. Then, reentrance of water or hydrogen to the oxide semiconductor is prevented without exposure to the air. Thus, oxide semiconductor layers 1403 and 1453 are obtained (see FIG. 1B). In this embodiment, the same furnace is used from heating temperature T at which dehydration and dehydrogenation of the oxide semiconductor layer is performed to temperature which is enough to prevent reentrance of water. Specifically, the substrate is cooled slowly until temperature becomes less than heating temperature T by 100° C. or more under a nitrogen atmosphere. Note that this embodiment is not limited to a nitrogen atmosphere. Dehydration and dehydrogenation can be performed under helium, neon, argon, or the like or under reduced pressure.

Note that at the first heat treatment, it is preferable that nitrogen or rare gas such as helium, neon, or argon do not include water, hydrogen, or the like. Alternatively, it is preferable that purity of nitrogen or rare gas such as helium, neon, or argon be 6N (99.9999%) or more, more preferably 7N (99.99999%) or more (i.e., impurity concentration be 1 ppm or less, more preferably, 0.1 ppm or less).

Further, the oxide semiconductor film is crystallized and can be a micro crystal film or a polycrystalline film depending on a condition of the first heat treatment or a material of oxide semiconductor layer.

Further, the first heat treatment of the oxide semiconductor layer can be performed on the oxide semiconductor film before the oxide semiconductor film is processed into an island-shape oxide semiconductor layer. In that case, the substrate is taken out from a heating device after the first heat treatment; then, a photolithography process is performed.

Furthermore, it is acceptable that heat treatment (heating temperature is 400° C. or more and less than a distortion point of the substrate) be performed under an inert gas atmosphere (nitrogen, helium, neon, argon, or the like), an oxygen atmosphere, or reduced pressure before deposition of the oxide semiconductor film and the oxide semiconductor layer be a gate insulating layer in which an impurity such as hydrogen and water are removed.

Next, a metal conductive film is formed over the second gate insulating layer 1402b, a resist mask 1436 is formed by a fourth photolithography process, and etching is selectively performed, so that a metal electrode layer 1435 is formed (see FIG. 1C). As the material of the metal conductive film, an element selected from Al, Cr, Cu, Ta, Ti, Mo, and W, an alloy containing any of these elements as a component, an alloy containing these elements in combination, and the like can be used.

As the metal conductive film, it is preferable to use a stacked layer of three layers where an aluminum layer are formed over a titanium layer and a titanium layer is formed over the aluminum layer or where an aluminum layer is formed over a molybdenum layer and a molybdenum layer is formed over the aluminum layer. Needless to say, a single layer, a stacked layer of two layers or a stacked layer of four or more layers can be used as the metal conductive layer.

Note that in order to selectively remove the metal conductive film overlapping with the oxide semiconductor layer 1453, the source electrode layer 1455a, and the drain electrode layer 1455b, materials and conditions of etching are adjusted as appropriate in case the oxide semiconductor layer 1453, the source electrode layer 1455a, and the drain electrode layer 1455b should be removed in etching of the metal conductive film Note that a resist mask for forming the metal electrode layer 1435 may be formed by an ink jet method. When a resist mask may be formed by an ink jet method, a photomask is not needed; therefore, manufacturing cost can be reduced.

Next, the resist mask 1436 is removed, a resist mask 1437 is formed by a fifth photolithography process, and etching is performed selectively, so that the source electrode layer 1405a and the drain electrode layer 1405b are formed (see FIG. 1D). Note that at the fifth photolithography process, only part of the oxide semiconductor layer is etched to form an oxide semiconductor layer 1433 having a groove (depression). Further, a resist mask for forming a groove (depression) in the oxide semiconductor layer can be formed by an ink jet method. When a resist mask used for forming a groove in the oxide semiconductor layer may be formed by an ink jet method, a photomask is not needed; therefore, manufacturing cost can be reduced.

Next, the resist mask 1437 is removed, and the oxide insulating layer 1407 is formed as a protection insulating film in contact with a top surface and a side surface of the oxide semiconductor layer 1453 and the groove (depression) of the oxide semiconductor layer 1433.

The oxide insulating layer 1407 has a thickness of at least 1 nm or more and can be formed using a method in which an impurity such as water and hydrogen does not enter the oxide insulating layer 1407 as appropriate, by sputtering method or the like. In this embodiment, a silicon oxide film whose thickness is 300 nm is deposited by a sputtering method as the oxide insulating layer 1407. Temperature of a substrate at deposition may be room temperature or more and 300° C. or less. In this embodiment, temperature of a substrate at deposition is 100° C. The silicon oxide film can be formed by a sputtering method under a rare gas (typically argon) atmosphere, an oxygen atmosphere, or an atmosphere containing a rare gas (typically argon) and oxygen. In addition, a silicon oxide target or a silicon target can be used as a target. For example, the silicon oxide film can be formed using a silicon target by a sputtering method under an atmosphere including oxygen and nitrogen. As the oxide insulating layer 1407 formed so as to be in contact with a low-resistance oxide semiconductor layer, an inorganic film in which an impurity such as moisture, a hydrogen ion, and OH— is not contained and which prevents such an impurity from entering the oxide insulating layer from the outside are used; typically, a silicon oxide film, a silicon nitride oxide film, an aluminum oxide film, an aluminum oxynitride film, or the like is used.

Next, second heat treatment (at 200° C. or more and 400° C. or less, preferably; 250° C. or more and 350° C. or less, for example) are performed under an inert gas atmosphere or an oxygen gas atmosphere (see FIG. 1E). For example, the second heat treatment is performed under a nitrogen atmosphere at 250° C. for one hour. In the second heat treatment, the groove of the oxide semiconductor layer 1433 and the top surface and the side surface of the oxide semiconductor layer 1453 are heated in contact with the oxide insulating layer 1407.

Through the above process, heat treatment for dehydration and dehydrogenation is performed on the deposited oxide semiconductor film to lower resistance, and then, a part of the oxide semiconductor film is selectively made to include excessive oxygen. As a result, the channel formation region 1434 overlapping with the gate electrode layer 1401 becomes an I type and the first high resist drain region 1431 overlapping with the source electrode layer 1405a and the second high resist drain region 1432 overlapping with the drain electrode layer 1405b are formed in a self-aligned manner. Further, the oxide semiconductor layer 1453 overlapping with the gate electrode layer 1451 becomes the oxide semiconductor layer 1454 the whole of which is an I type.

Note that the second high resist drain region 1432 (or the first high resist drain region 1431) is formed in the oxide semiconductor layer overlapped with the drain electrode layer 1405b (and the source electrode layer 1405a), so that reliability in forming a driver circuit can be improved. Specifically, by forming the second high resist drain region 1432, conductivity can be gradually changed from the drain electrode layer to the second high resist drain region 1432 and the channel formation region. Therefore, in the case where a transistor is driven in the state where the drain electrode layer 1405b is connected to a wiring supplying high power supply potential VDD, even when high electrical field is applied between the gate electrode layer 1401 and the drain electrode layer 1405b, the high resist drain region functions as a buffer and high electric field is not locally applied, so that withstand voltage of the transistor can be improved.

In addition, the second high resist drain region 1432 (or the first high resist drain region 1431) is formed in the oxide semiconductor layer overlapped with the drain electrode layer 1405b (and the source electrode layer 1405a), so that leakage current in the channel formation region 1434 in forming the driver circuit can be reduced.

Next, the protection insulating layer 1408 is formed over the oxide insulating layer 1407 (see FIG. 1F). In this embodiment, a silicon nitride film is formed by an RF sputtering method. An RF sputtering method is preferable as a deposition method of the protection insulating layer 1408 because of its quantity productivity. As the protection insulating layer 1408, an inorganic film in which an impurity such as moisture, a hydrogen ion, and OH— is not contained and which prevents such an impurity from entering the oxide insulating layer from the outside are used: a silicon nitride film, an aluminum nitride film, a silicon nitride oxide film, an aluminum oxynitride film, or the like is used. Needless to say, the protection insulating layer 1408 is a light-transmitting insulating film.

Further, it is preferable to use a structure in which the protection insulating layer 1408 is in contact with the first gate insulating layer 1402a provided below the protection insulating layer 1408 or an insulating layer serving as a base and which prevents an impurity such as moisture, a hydrogen ion, and OH⁻ from a vicinity of its side from entering the oxide semiconductor layer. In particular, when the first gate insulating layer 1402 or the insulating film serving as a base in contact with the protection insulating layer 1408 is a silicon nitride film, the effect is enhanced. That is, when a silicon nitride film is provided over an under surface, a top surface, and a side surface of the oxide semiconductor layer so as to surround the oxide semiconductor layer, reliability of a display device is improved.

Next, the planarizing insulating layer 1409 is formed over the protection insulating layer 1408. The planarizing insulating layer 1409 can be formed of an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarizing insulating layer 1409 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The formation method of the planarizing insulating layer 1409 is not limited to a particular method and a method such as a sputtering method, an SOG method, spin coating, dip coating, spray coating, a droplet discharge method (e.g., an ink jet method, screen printing, or offset printing), or the like and a tool such as a doctor knife, a roll coater, a curtain coater, a knife coater, or the like can be used depending on the material of the planarizing insulating layer.

Next, a resist mask is formed by a sixth photolithography process, and the planarizing insulating layer 1409, the protection insulating layer 1408, and the oxide insulating layer 1407 are etched to form a contact hole which reaches the drain electrode layer 1455b. In addition, contact holes which reach the gate electrode layers 1401 and 1451 are also formed. Note that a resist mask for forming a contact hole which reaches the drain electrode layer 1455b may be formed by an ink jet method. When a resist mask may be formed by an ink jet method, a photomask is not needed; therefore, manufacturing cost can be reduced.

Next, after the resist mask is removed, a light-transmitting conductive film is formed. The light-transmitting conductive film is formed of indium oxide ($In_2O_3$), indium oxide-tin oxide alloy ($In_2O_3$—$SnO_2$, abbreviated to ITO), or the like by a sputtering method, a vacuum evaporation method, or the like. As for other material of a light-transmitting conductive film, an Al—Zn—O-based non-single-crystal film including nitrogen, that is, an Al—Zn—O—N-based non-single-crystal film, Zn—O-based non-single-crystal film including nitrogen, or an Sn—Zn—O-based non-single-crystal film including nitrogen can be used. Note that the relative proportion (atomic %) of zinc in an Al—Zn—O—N-based non-single-crystal film is 47 atomic % or less, which is larger than the relative proportion (atomic %) of aluminum in the non-single-crystal film. The relative proportion (atomic %) of aluminum in the non-single-crystal film is larger than that of nitrogen in the non-single-crystal film. Such a material is etched with a hydrochloric acid-based solution. However, since a residue is easily generated particularly in etching ITO, indium oxide-zinc oxide alloy ($In_2O_3$—ZnO) may be used to improve etching processability.

Note that the unit of the relative proportion in the light-transmitting conductive film is atomic percent, and the relative proportion is evaluated by analysis using an electron probe X-ray microanalyzer (EPMA).

Next, a seventh photolithography process is performed. A resist mask is formed and unnecessary portions are removed by etching, whereby the pixel electrode layer 1456 and the conductive layer 1406 are formed (see FIG. 2A).

Through the above process, with seven masks, the thin film transistor 1470 and the thin film transistor 1460 can be formed over the same substrate in the driver circuit and in the pixel portion, respectively. Further, a storage capacitor which is formed using a capacitor wiring layer and a capacitor electrode layer and which is formed using the first gate insulating layer 1402a and the second gate insulating layer 1402b which serve as a dielectric can be formed over the same substrate. The pixel portion is formed by providing the thin film transistors 1460 and the storage capacitors for pixels in matrix and a driver circuit including the thin film transistor 1470 is provided in a vicinity of the pixel portion, so that one of substrates for manufacturing an active-matrix display device can be formed. In this specification, such a substrate is referred to as an active matrix substrate for convenience.

Note that the pixel electrode layer 1456 is electrically connected to a capacitor electrode layer through a contact hole formed in the planarizing insulating layer 1409, the protection insulating layer 1408, and the oxide insulating layer 1407. Note that the capacitor electrode layer can be formed using the same light-transmitting material and the same process as the drain electrode layer 1455b.

The conductive layer 1406 is provided to overlap with the channel formation region 1434 of the oxide semiconductor layer, so that, in a bias-temperature stress test (hereinafter, referred to as a BT test) for examining reliability of a thin film transistor, the amount of change in threshold voltage of the thin film transistor 1470 between before and after the BT test can be reduced. Further, the conductive layer 1406 can function as a second gate electrode layer. A potential of the conductive layer 1406 may be the same as or different from that of the gate electrode layer 1406, or can be GND, 0 V, or in a floating state.

Note that in this embodiment, the thin film transistor 1470 for the driver circuit has the conductive layer 1406 overlapping with the channel formation region 1434. However, a thin film transistor for the driver circuit does not need to have the conductive layer 1406. The thin film transistor 1470 having the conductive layer 1406 and a thin film transistor which does not have the conductive layer 1401 can be formed over the same substrate using the above process.

In a semiconductor device related to an embodiment of this invention, when a gate electrode layer, a source electrode layer, and a drain electrode layer of a thin film transistor which is used for a pixel, a pixel electrode layer of a display element, and a wiring layer such as a scan line and a signal line are formed using a light-transmitting conductive film, the aperture ratio of the pixel can be enhanced. Note that an oxide semiconductor is not necessarily used for a thin film transistor for the driver circuit. Note that when the thin film transistor 1470 for the driver circuit is formed over a substrate where the thin film transistor 1460 for the pixel is to be formed, as this embodiment shows, it is preferable to form the thin film transistor 1470 together with the thin film transistor 1460 using an oxide semiconductor because the number of steps can be reduced. In this case, both the thin film transistor 1470 for the driver circuit and the thin film transistor 1460 for the pixel are unipolar transistors.

Note that a resist mask for forming the pixel electrode layer 1456 may be formed by an ink jet method. When a resist mask may be formed by an ink jet method, a photomask is not needed; therefore, manufacturing cost can be reduced.

Figure 19:
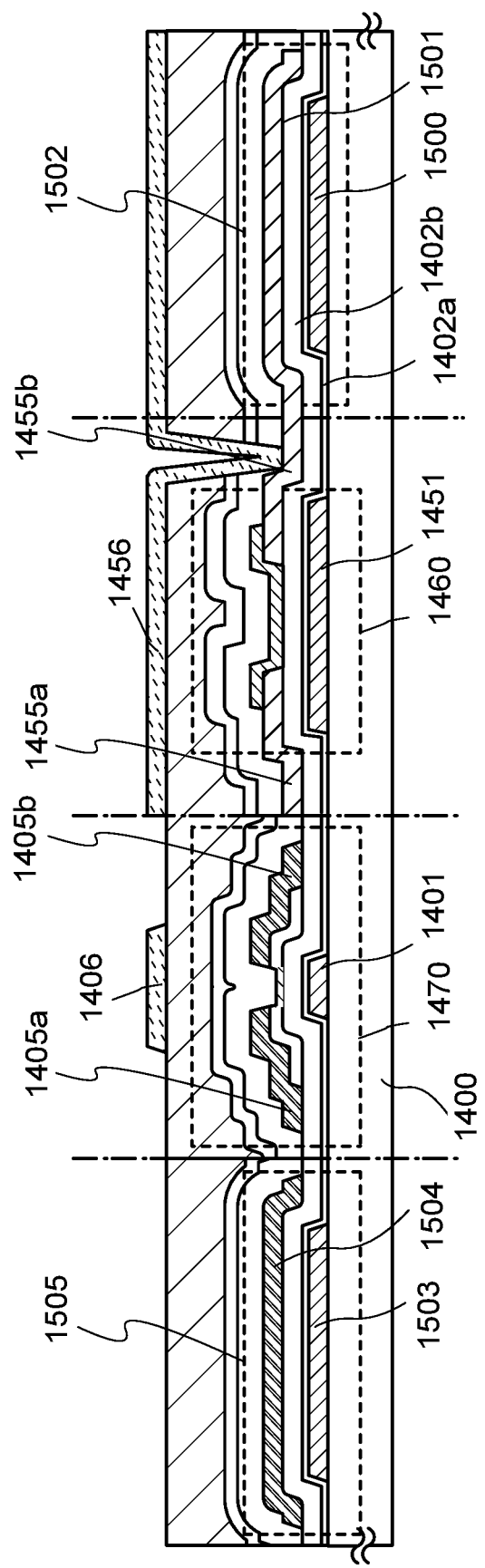
FIG. 19 is a cross-sectional view illustrating Embodiment 1.

Next, FIG. 19 illustrates an example of a cross-sectional structure of an active matrix substrate where a capacitor and a thin film transistor are manufactured by the above process.

FIG. 19 illustrates a capacitor 1502 for the pixel and a capacitor 1505 for the driver circuit in addition to the thin film transistor 1470 for the driver circuit and the thin film transistor 1460 for the pixel portion over the same substrate. The capacitor can be manufactured together with the thin film transistor by the above process without an increase in the number of masks and steps. Further, in a portion which is to be a display portion of the pixel portion, a scan line, a signal line, and a capacitor wiring layer are formed using a light-transmitting conductive film, which realizes a high aperture ratio. Furthermore, in a driver circuit formed in a region which is not the display portion, a metal wiring can be used in order to lower wiring resistance.

In FIG. 19, the thin film transistor 1470 is a channel-etched thin film transistor provided in the driver circuit and the thin film transistor 1460 electrically connected to the pixel electrode layer 1456 is a bottom-contacted thin film transistor provided in the pixel portion.

A capacitor wiring layer 1500 which is formed using the same light-transmitting material and formed through the same process as the gate electrode layer 1451 of the thin film transistor 1460 overlaps with a capacitor electrode layer 1501 with the first gate insulating layer 1402a and the second gate insulating layer 1402b which serve as a dielectric, and forms the capacitor 1502 of a pixel therebetween. Note that the capacitor electrode layer 1501 is formed using the same light-transmitting material and formed through the same process as the source electrode layer 1455*a* or the drain electrode layer 1455*b* of the thin film transistor 1460. Accordingly, the thin film transistor 1460 and the capacitor 1502 of a pixel has a light-transmitting property, so that an aperture ratio can be increased.

A light-transmitting property of the capacitor 1502 is important for enhancement of an aperture ratio. In particular, in a small liquid crystal display panel having a screen size of 10 inch or less, a high aperture ratio can be realized even when a pixel size is miniaturized in order that high definition of a display image may be achieved by an increase of the number of scan lines. Further, a light-transmitting film is used as a component of the thin film transistor 1460 and the capacitor 1502, whereby a high aperture ratio can be realized even when one pixel is divided into a plurality of subpixels in order to realize a wide viewing angle. That is, an aperture ratio can be large even when a dense group of thin film transistors are provided, so that a sufficient area of a display region can be secured. For example, when one pixel includes two to four subpixels and the capacitor 1502, since the capacitor 1502 and the thin film transistor has a light-transmitting property, an aperture ratio can be enhanced.

Note that the capacitor 1502 is provided below the pixel electrode layer 1456 and the capacitor electrode layer 1501 is electrically connected to the pixel electrode layer 1456.

In this embodiment, an example of the capacitor 1502 which is formed using the capacitor electrode layer 1501 and the capacitor wiring layer 1500 is illustrated. However, a structure of a capacitor for the pixel is not limited thereto. For example, without a capacitor wiring layer, a capacitor may be formed as follows: a pixel electrode layer overlaps with a scan line of an adjacent pixel with a planarizing insulating layer, a protective insulating layer, a first gate insulating layer, and a second gate insulating layer therebetween.

Further, in the case of manufacturing an active-matrix liquid crystal display device, an active-matrix substrate and a counter substrate provided with a counter electrode are bonded to each other with a liquid crystal layer therebetween. Note that a common electrode electrically connected to the counter electrode on the counter substrate is provided over the active-matrix substrate, and a terminal electrode electrically connected to the common electrode is provided in the terminal portion. This terminal electrode is provided so that the common electrode is set to a fixed potential such as GND or 0 V. The terminal electrode can be formed using the same light-transmitting material as the pixel electrode layer 1456.

Furthermore, a capacitor wiring layer 1503 which is formed using the same light-transmitting material and formed through the same process as the gate electrode layer 1401 of the thin film transistor 1470 overlaps with a capacitor electrode layer 1504 with the first gate insulating layer 1402*a* and the second gate insulating layer 1402*b* which serve as a dielectric and forms the capacitor 1505 of a driver circuit therebetween. Note that the capacitor electrode layer 1504 is formed using the same light-transmitting material and formed through the same process as the source electrode layer 1405*a* or the drain electrode layer 1405*b* of the thin film transistor 1470.

Embodiment 2

One embodiment of a semiconductor device and a manufacturing method thereof will be described with reference to FIGS. 3A-1, 3A-2, 3B, and 3C, FIGS. 4A to 4E, and FIGS. 5A to 5E.

FIGS. 3A-1, 3A-2, 3B, and 3C illustrate an example of a plan view and a cross-sectional view of two thin film transistors which have different structures from each other and which are formed over the same substrate. FIGS. 3A-1, 3A-2, 3B, and 3C illustrate a thin film transistor 2410 of a channel-etched type which is one of bottom gate structures and a thin film transistor 2420 of a channel-protection type (also referred to as a channel stop type) which is one of bottom gate structures. The thin film transistor 2410 and the thin film transistor 2420 can be referred to as inverted staggered thin film transistors.

Figures 1, 3A:
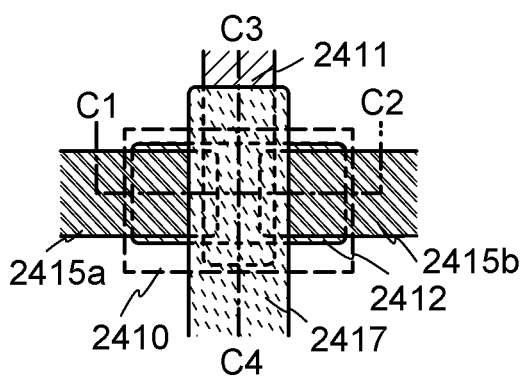
Figures 2, 3A:
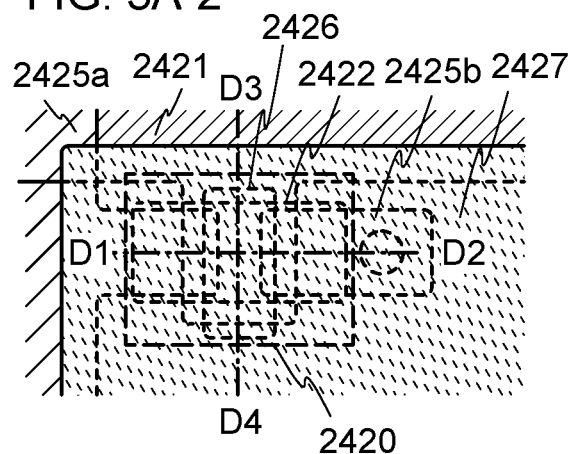
Figure 3B:
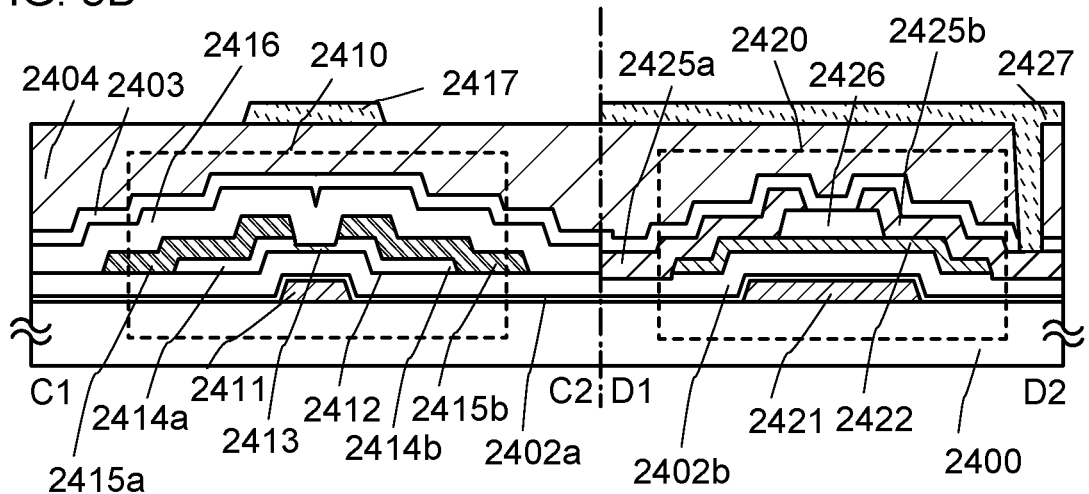
Figure 3C:
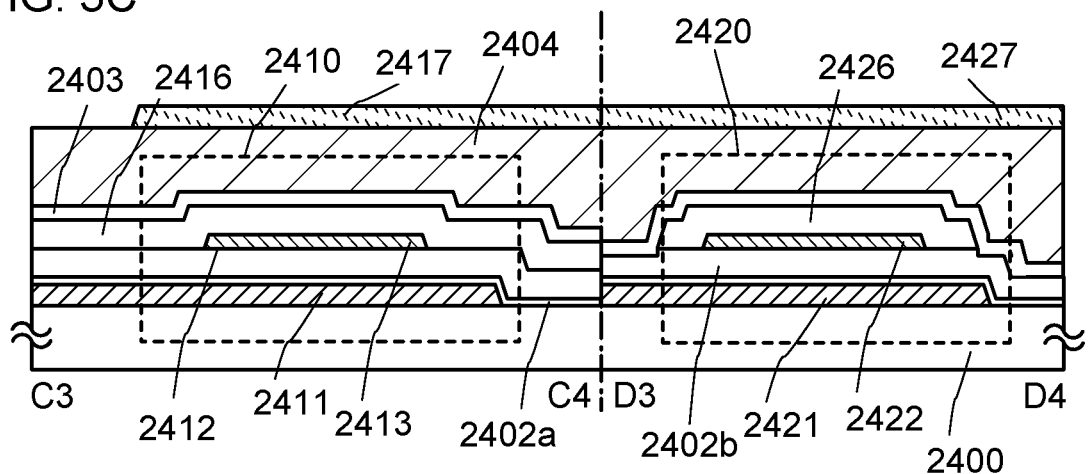

FIG. 3A-1 is a plan view of the channel-etched thin film transistor 2410 provided in a driver circuit. FIG. 3B is a cross-sectional view taken along line C1-C2 in FIG. 3A-1. FIG. 3C is a cross-sectional view taken along line C3-C4 in FIG. 3A-1.

The thin film transistor 2410 provided in the driver circuit is a channel-etched thin film transistor and includes a gate electrode layer 2411; a first gate insulating layer 2402*a*; a second gate insulating layer 2402*b*; an oxide semiconductor layer 2412 including at least a channel formation region 2413, a first high resist drain region 2414*a*, and a second high resist drain region 2414*b*; a source electrode layer 2415*a*; and a drain electrode layer 2415*b* over a substrate 2400 having an insulation surface. Further, an oxide insulating layer 2416 is provided so as to cover the thin film transistor 2410 and to be in contact with the channel formation region 2413.

The first high resist drain region 2414*a* is formed in a self-aligned manner in contact with a bottom surface of the source electrode layer 2415*a*. Further, the second high resist drain region 2414*b* is formed in a self-aligned manner in contact with a bottom surface of the drain electrode layer 2415*b*. In addition, the channel formation region 2413 is in contact with the oxide insulating layer 2416, has thin thickness, and is a region with higher resist (an I type region) than that of the first high resist drain region 2414*a* and that of the second high resist drain region 2414*b*.

In addition, in the thin film transistor 2410, it is preferable that a metal material be used for the source electrode layer 2415*a* and the drain electrode layer 2415*b* in order to make wirings have low resistance.

In addition, when a pixel portion and a driver circuit are formed over the same substrate in the liquid crystal display device, in the driver circuit, only one of positive polarity and negative polarity is applied between the source and drain electrodes of a thin film transistor for constituting a logic gate such as an inverter circuit, a NAND circuit, a NOR circuit, and a latch circuit or a thin film transistor for constituting an analog circuit such as a sense amplifier, a constant voltage generating circuit, and a VCO. Therefore, the width of the second high resist drain region 2414*b* which needs to withstand voltage may be designed to be larger than that of the first high resist drain region 2414*a*. Further, the width of the gate electrode layer overlapping with the first high resist drain region 2414*a* and the second high resist drain region 2414*b* may be large.

Further, the thin film transistor 2410 provided in the driver circuit is described with use of a single gate thin film transistor; however, a multi gate thin film transistor including a plurality of channel formation regions can be used as necessary.

Further, a conductive layer 2417 is formed over the channel formation region 2413 to overlap therewith. The conductive layer 2417 is electrically connected to the gate electrode layer 2411 and has the same potential as the gate electrode layer 2411, so that a gate voltage can be applied from the upper and lower sides of the oxide semiconductor provided between the gate electrode layer 2411 and the conductive layer 2417. Further, when the potential of the conductive layer 2417 is different from that of the gate electrode layer 2411 and is, for example, a fixed potential, GND, and 0 V, the electrical characteristics of the thin film transistor such as a threshold voltage can be controlled.

In addition, a protection insulating layer 2403 and a planarizing insulating layer 2404 are stacked between the conductive layer 2417 and the oxide insulating layer 2416.

Further, it is preferable to use a structure in which the protection insulating layer 2403 is in contact with the first gate insulating layer 2402a provided below the protection insulating layer 2403 or an insulating layer serving as a base and which prevents an impurity such as moisture, a hydrogen ion, and OH⁻ from entering the oxide semiconductor layer from the side direction. In particular, when the first gate insulating layer 2402 or the insulating film serving as a base in contact with the protection insulating layer 2403 is a silicon nitride film, the effect is enhanced.

Note that FIG. 3A-2 is a plan view of the channel-protective thin film transistor 2420 provided in a pixel. FIG. 3B is a cross-sectional view taken along line D1-D2 in FIG. 3A-2. Further, FIG. 3C is a cross-sectional view taken along line D3-D4 in FIG. 3A-2.

The thin film transistor 2420 provided in the pixel is a channel-protective thin film transistor and includes a gate electrode layer 2421, the first gate insulating layer 2402a, the second gate insulating layer 2402b, an oxide semiconductor layer 2422 including a channel formation region, an oxide insulating layer 2426 which functions as a channel protection layer, a source electrode layer 2425a, and a drain electrode layer 2425b over the substrate 2400 having an insulation surface. Further, a stacked layer of the protection insulating layer 2403 and the planarizing insulating layer 2404 is provided so as to cover the thin film transistor 2420 and to be in contact with the oxide insulating layer 2426, the source electrode layer 2425a, and the drain electrode layer 2425b. The pixel electrode layer 2427 which is in contact with the drain electrode layer 2425b is provided over the planarizing insulating layer 2404 and is electrically connected to the thin film transistor 2420.

Further, heat treatment is performed on the oxide semiconductor layer 2422 in order to reduce impurities such as moisture (heat treatment for dehydration and dehydrogenation) after at least an oxide semiconductor film are formed. After heat treatment for dehydration and dehydrogenation and slow cooling, the oxide insulating layer 2426 is formed in contact with the oxide semiconductor layer 2422 to reduce the carrier concentration of the oxide semiconductor layer 2422, which leads to improvement of the electrical characteristics and reliability of the thin film transistor 2420.

A channel formation region of the thin film transistor 2420 provided in the pixel is a part of the oxide semiconductor layer 2422. The channel formation region of the thin film transistor 2420 overlaps with the gate electrode layer 2421 and is in contact with the oxide insulating layer 2426 which is a channel protection layer. Since the thin film transistor 2420 is protected by the oxide insulating layer 2426, the oxide semiconductor layer 2422 is prevented from being etched in an etching process where the source electrode layer 2425a and the drain electrode layer 2425b are formed.

In addition, in order that a display device of which the aperture ratio is high may be realized using a light-transmitting thin film transistor as the thin film transistor 2420, a light-transmitting conductive film is used for the source electrode layer 2425a and the drain electrode layer 2425b.

Further, a light-transmitting conductive film is also used for the gate electrode layer 2421 of the thin film transistor 2420.

Furthermore, in a pixel provided with the thin film transistor 2420, a conductive film having a light-transmitting property with respect to visible light is used as the pixel electrode layer 2427, the other electrode layer (such as a capacitor electrode layer), or the other wiring layer (such as a capacitor wiring layer); therefore, a display device with a high aperture ratio is realized. Needless to say, it is preferable that a conductive film having a light-transmitting property with respect to visible light also be used as the gate insulating layer 2402a, the gate insulating layer 2402b, and the oxide insulating layer 2426.

In this specification, a film having a light-transmitting property with respect to visible light is a film with a thickness of which transmittance is 75% or more and 100% or less with respect to visible light. When the film is conductive, the film is also referred to as a transparent conductive film In addition, a conductive film which is semi-transmissive with respect to visible light may be used for a gate electrode layer, a source electrode layer, a drain electrode layer, a pixel electrode layer, the other electrode layer, or a metal oxide applied to the other wiring layer. The words "semi-transmissive with respect to visible light" means that the transmittance of visible light is 50% or more and 75% or less.

Manufacturing process of the thin film transistor 2410 and the thin film transistor 2420 which are formed over the same substrate will be described below with reference to FIGS. 4A to 4E and FIGS. 5A to 5E.

First, a light-transmitting conductive film is formed over the substrate 2400 having an insulation surface; then, the gate electrode layers 2411 and 2421 are formed by the first photolithography process. In addition, in a pixel portion, a capacitor wiring layer is formed by the same first photolithography process using a light-transmitting material which is the same material as the gate electrode layers 2411 and 2421. Further, when the driver circuit needs a capacitor, a capacitor wiring layer is formed not only in the pixel portion but also in the driver circuit. Note that a resist mask may be formed by an ink jet method. When a resist mask may be formed by an ink jet method, a photomask is not needed; therefore, manufacturing cost can be reduced.

Although there is no particular limitation on a substrate which can be used for the substrate 2400 having an insulation surface, it is necessary that the substrate have at least enough heat resistance to withstand heat treatment to be performed later. A substrate similar to the glass substrate used in Embodiment 1 can be used for the substrate 2400 having an insulation surface.

Note that a substrate formed of an insulator such as a ceramic substrate, a quartz substrate, or a sapphire substrate may be used instead of the glass substrate. Alternatively, crystallized glass or the like can be used.

Note that an insulating film serving as a base film may be provided between the substrate 2400 and the gate electrode layers 2411 and 2421. The base film has a function of preventing diffusion of an impurity element from the substrate 2400 and can be formed to have a single-layer or stacked-layer structure using one or more of a silicon nitride film, a silicon oxide film, a silicon nitride oxide film, and a silicon oxynitride film.

A conductive material having a light-transmitting property with respect to visible light such as an In—Sn—Zn—

O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, and a Zn—O-based metal oxide can be used as a material of the gate electrode layers 2411 and 2421. The thickness of the gate electrode layers 2411 and 2421 is appropriately selected in the range of 50 nm to 300 nm. As a deposition method of a metal oxide used for the gate electrode layers 2411 and 2421, a sputtering method, a vacuum evaporation method (an electron beam evaporation method), an arc ion plating method, or a spray method is used. Note that when a sputtering method is used, deposition is performed using a target including $SiO_2$ at 2 percent by weight or more and 10 percent by weight or less and a light-transmitting conductive film is made to include SiOx (X>0) which suppresses crystallization, so that crystallization can be suppressed when heat treatment is performed for dehydration and dehydrogenation performed in a later process.

Next, a gate insulating layer is formed over the gate electrode layers 2411 and 2421.

The gate insulating layer can be formed by a single-layer or stacked layers of a silicon oxide layer, a silicon nitride layer, a silicon oxynitride layer, or a silicon nitride oxide layer by a plasma CVD method or a sputtering method. For example, a silicon oxynitride layer may be formed using a deposition gas containing $SiH_4$, oxygen, and nitrogen by a plasma CVD method.

In this embodiment, a gate insulating layer is a stacked layer of the first gate insulating layer 2402a with a thickness of 50 nm or more and 200 nm or less and the second gate insulating layer 2402b with a thickness of 50 nm or more and 300 nm or less. A silicon nitride film or a silicon nitride oxide film with a thickness of 100 nm is used as the first gate insulating layer 2402a. Further, a silicon oxide film with a thickness of 100 nm is used as the second gate insulating layer 2402b.

An oxide semiconductor film 2430 with a thickness of 2 nm or more and 200 nm or less is formed over the second gate insulating layer 2402b. The thickness is preferably 50 nm or less in order that the oxide semiconductor film may be amorphous even when heat treatment for dehydration and dehydrogenation is performed after formation of the oxide semiconductor film 2430. Thin thickness of the oxide semiconductor film can suppress crystallization when heat treatment is performed after the oxide semiconductor layer is formed.

Note that before the oxide semiconductor film 2430 is formed by a sputtering method, dust on a surface of the second gate insulating layer 2402b is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in a vicinity of the substrate to modify a surface. Note that nitrogen, helium, oxygen, or the like may be used instead of an argon atmosphere.

The following film is used for the oxide semiconductor film 2430: an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, a Sn—O-based oxide semiconductor film, and a Zn—O-based oxide semiconductor film In this embodiment, the oxide semiconductor film is formed by a sputtering method with use of an In—Ga—Zn—O-based oxide semiconductor target. Alternatively, the oxide semiconductor film 2430 can be formed by a sputtering method under a rare gas (typically argon) atmosphere, an oxygen atmosphere, or an atmosphere including a rare gas (typically argon) and oxygen. Note that when a sputtering method is used, deposition is performed using a target including $SiO_2$ at 2 percent by weight or more and 10 percent by weight or less and the oxide semiconductor film 2430 is made to include SiOx (X>0) which suppresses crystallization, so that crystallization can be suppressed when heat treatment is performed for dehydration and dehydrogenation performed in a later process.

Next, the oxide semiconductor film 2430 is processed into an island-shape oxide semiconductor layer by the second photolithography process. Note that a resist mask for forming the island-shape oxide semiconductor layer may be formed by an ink jet method. When a resist mask may be formed by an ink jet method, a photomask is not needed; therefore, manufacturing cost can be reduced.

Next, dehydration and dehydrogenation of the oxide semiconductor layer is performed. Temperature in a first heat treatment at which dehydration and dehydrogenation is performed is 350° C. or more and less than a distortion point of a substrate, or more preferably 400° C. or more. Here, the substrate is introduced into an electric furnace which is one of heat treatment devices and heat treatment is performed on the oxide semiconductor layer under a nitrogen atmosphere. Then, reentrance of water or hydrogen to the oxide semiconductor is prevented without exposure to the air. Thus, oxide semiconductor layers 2431 and 2432 are obtained (see FIG. 4B). In this embodiment, the same furnace is used from heating temperature T at which dehydration and dehydrogenation of the oxide semiconductor layer is performed to temperature which is enough to prevent reentrance of water under a nitrogen atmosphere. Specifically, the substrate is cooled slowly until temperature becomes less than heating temperature T by 100° C. or more. Note that this embodiment is not limited to nitrogen atmosphere. Dehydration and dehydrogenation can be performed under helium, neon, argon, or the like or under reduced pressure.

Note that at the first heat treatment, it is preferable that nitrogen or rare gas such as helium, neon, or argon does not include water, hydrogen, or the like. Alternatively, it is preferable that purity of nitrogen or rare gas such as helium, neon, or argon be 6N (99.9999%) or more, more preferably 7N (99.99999%) or more (i.e., impurity concentration be 1 ppm or less, more preferably, 0.1 ppm or less).

Further, the oxide semiconductor film is crystallized and can be a micro crystal film or a polycrystalline film depending on a condition of the first heat treatment or a material of oxide semiconductor layer.

Further, the first heat treatment of the oxide semiconductor film 2430 can be performed on the oxide semiconductor film before the oxide semiconductor film is processed into an island-shape oxide semiconductor layer. In that case, the substrate is taken out from a heating device after the first heat treatment; then, a photolithography process is performed.

Furthermore, it is acceptable that heat treatment (heating temperature is 400° C. or more and less than a distortion point of the substrate) be performed under an inert gas atmosphere (nitrogen, helium, neon, argon, or the like), an oxygen atmosphere, or reduced pressure before deposition of the oxide semiconductor film 2430 and the oxide semiconductor layer may be a gate insulating layer in which an impurity such as hydrogen and moisture is removed.

Figure 4A:
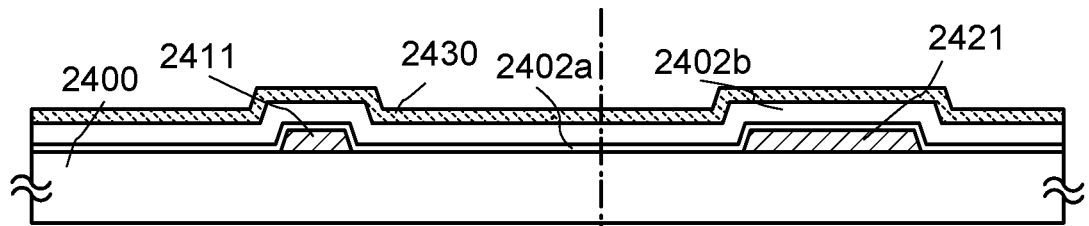
FIGS. 4A to 4E are cross-sectional views illustrating Embodiment 2.
Figure 4B:
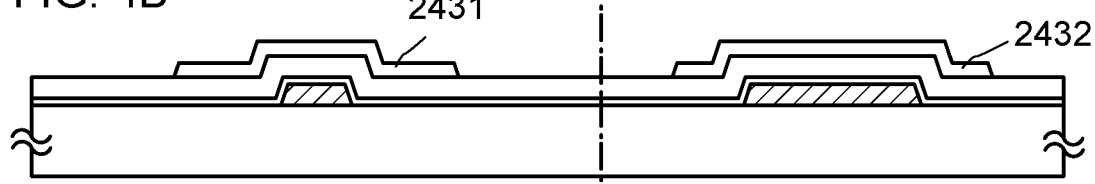
Figure 4C:
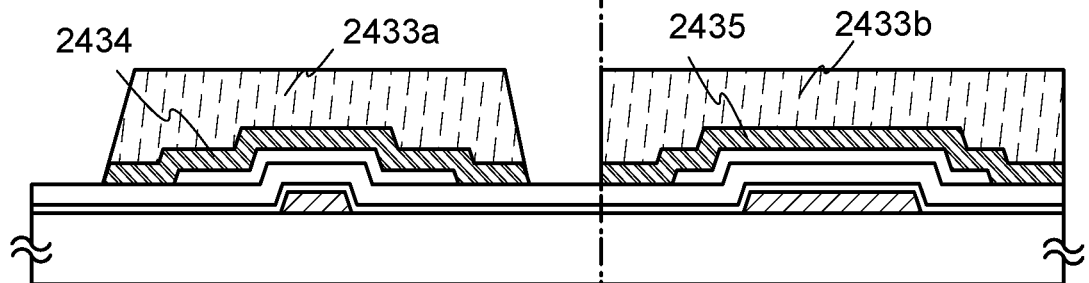

Next, a metal conductive film is formed over the second gate insulating layer 2402b, the oxide semiconductor layer 2431, and the oxide semiconductor layer 2432, resist masks 2433a and 2433b are formed by the third photolithography process, and etching is selectively performed, so that metal electrode layers 2434 and 2435 are formed (see FIG. 4C). As the material of the metal conductive film, an element selected from Al, Cr, Cu, Ta, Ti, Mo, and W, an alloy containing any of these elements as a component, an alloy containing these elements in combination, and the like can be used.

As a metal conductive film, it is preferable to use a stacked layer of three layers where an aluminum layer are formed over a titanium layer and a titanium layer are formed over the aluminum layer or where an aluminum layer are formed over a molybdenum layer and a molybdenum layer are formed over the aluminum layer. Needless to say, a single layer, a stacked layer of two layers or a stacked layer of four or more layers can be used as the metal conductive layer.

Note that a resist mask for forming the metal electrode layers 2434 and 2435 may be formed by an ink jet method. When a resist mask may be formed by an ink jet method, a photomask is not needed; therefore, manufacturing cost can be reduced.

Figure 4D:
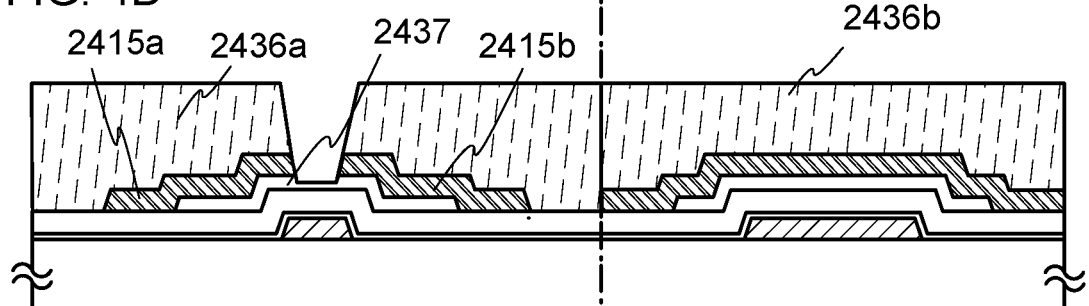

Next, the resist masks 2433a and 2433b are removed, resist masks 2436a and 2436b are formed by the fourth photolithography process, and etching is performed selectively, so that the source electrode layer 2415a and the drain electrode layer 2415b are formed (see FIG. 4D). Note that at the fourth photolithography process, only part of the oxide semiconductor layer 2431 is etched to form an oxide semiconductor layer 2437 having a groove (depression). Further, the resist masks 2436a and 2436b for forming a groove (depression) in the oxide semiconductor layer 2431 can be formed by an ink jet method. When a resist mask may be formed by an ink jet method, a photomask is not needed; therefore, manufacturing cost can be reduced.

Figure 4E:
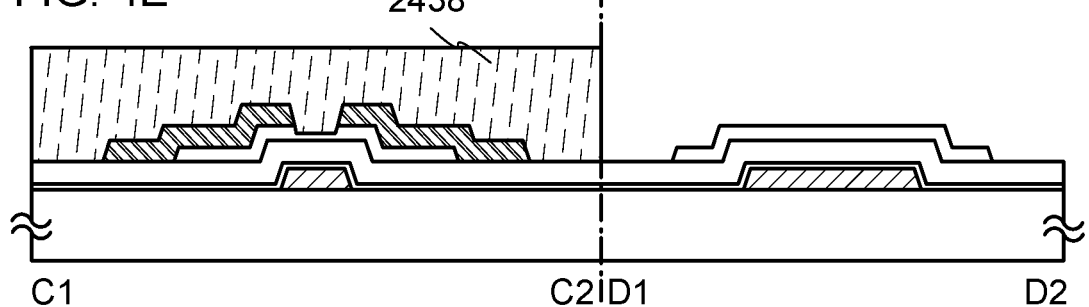

Next, the resist masks 2436a and 2436b are removed, a resist mask 2438 covering the oxide semiconductor layer 2437 is formed by the fifth photolithography process, and the metal electrode layer 2435 over the oxide semiconductor layer 2432 is removed (see FIG. 4E).

Note that, in order to remove the metal conductive layer 2435 overlapping with the oxide semiconductor layer 2432 by the fifth photolithography process, materials and conditions of etching are adjusted as appropriate in case the oxide semiconductor layer 2432 should be removed in etching of the metal electrode layer 2435.

The oxide insulating layer 2439 is formed as a protection insulating film in contact with the top surface and the side surface of the oxide semiconductor layer 2432 and the groove (depression) of the oxide semiconductor layer 2437.

The oxide insulating layer 2439 has a thickness of at least 1 nm or more and can be formed using a method in which an impurity such as water and hydrogen does not enter the oxide insulating layer 2439, as appropriate. In this embodiment, a silicon oxide film whose thickness is 300 nm is deposited by a sputtering method as the oxide insulating layer 2439. Temperature of a substrate at deposition may be room temperature or more and 300° C. or less. In this embodiment, temperature of a substrate at deposition is 100° C. The silicon oxide film can be formed by a sputtering method under a rare gas (typically argon) atmosphere, an oxygen atmosphere, or an atmosphere containing a rare gas (typically argon) and oxygen. In addition, a silicon oxide target or a silicon target can be used as a target. For example, the silicon oxide film can be formed using a silicon target by a sputtering method under an atmosphere including oxygen and nitrogen. As the oxide insulating layer 2439 formed so as to be in contact with the low-resistance oxide semiconductor layer, an inorganic film in which an impurity such as moisture, a hydrogen ion, and OH— is not contained and which prevents such an impurity from entering the oxide insulating layer from the outside are used; typically, a silicon oxide film, a silicon nitride oxide film, an aluminum oxide film, an aluminum oxynitride film, or the like is used.

Figure 5A:
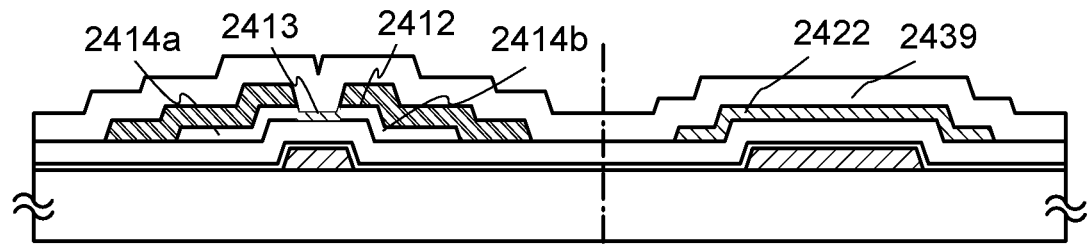
FIGS. 5A to 5E are cross-sectional views illustrating Embodiment 2.

Next, second heat treatment (at 200° C. or more and 400° C. or less, preferably; 250° C. or more and 350° C. or less, for example) are performed under an inert gas atmosphere or an oxygen gas atmosphere (see FIG. 5A). For example, second heat treatment is performed under a nitrogen atmosphere at 250° C. for one hour. In the second heat treatment, the groove of the oxide semiconductor layer 2437 and the top surface and the side surface of the oxide semiconductor layer 2432 are heated in contact with the oxide insulating layer 2439.

Through the above process, heat treatment for dehydration and dehydrogenation is performed on the deposited oxide semiconductor film to lower resistance, and then, a part of the oxide semiconductor film is selectively made to include excessive oxygen. As a result, the channel formation region 2413 overlapping with the gate electrode layer 2411 becomes an I type and the first high resist drain region 2414a overlapping with the source electrode layer 2415a and the second high resist drain region 2414b overlapping with the drain electrode layer 2415b are formed in a self-aligned manner. Further, the oxide semiconductor layer 2432 overlapping with the gate electrode layer 2421 becomes the oxide semiconductor layer 2422 when the whole of the oxide semiconductor layer 2432 overlapping with the gate electrode layer 2421 becomes an I type.

However, when heat treatment is performed under a nitrogen atmosphere, an inert gas atmosphere, or reduced pressure while the oxide semiconductor layer 2422 which is made to have high resist (to be an I type) is exposed, the resistance of the oxide semiconductor layer 2422 which is made to have high resist (to be an I type) is lowered. Therefore, when the oxide semiconductor layer 2422 is exposed, heat treatment is performed under an oxygen gas atmosphere, and N$_2$O gas atmosphere, or super dry air (of which dew point under air pressure is −40° C. or less, preferably −60° C. or less).

Note that the second high resist drain region 2414b (or the first high resist drain region 2414a) is formed in the oxide semiconductor layer overlapped with the drain electrode layer 2415b (and the source electrode layer 2415a), so that reliability in forming the driver circuit can be improved. Specifically, by forming the second high resist drain region 2414b, conductivity can be gradually changed from the drain electrode layer 2415b to the second high resist drain region 2414b and the channel formation region 2413. Therefore, in the case where a transistor is driven in the state where the drain electrode layer 2415b is connected to a wiring supplying high power supply potential VDD, even when high electrical field is applied between the gate electrode layer 2411 and the drain electrode layer 2415b, the high resist drain region functions as a buffer and high electric field is not locally applied, so that withstand voltage of the transistor can be improved.

In addition, the second high resist drain region 2414b (or the first high resist drain region 2414a) is formed in the oxide semiconductor layer overlapped with the drain electrode layer 2415b (and the source electrode layer 2415a), so that leakage current in the channel formation region 2413 in forming the driver circuit can be reduced.

Figure 5B:
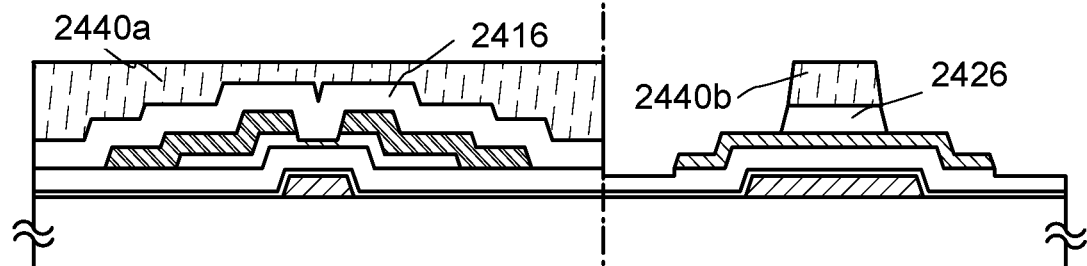

Next, resist masks 2440a and 2440b are formed by the sixth photolithography process, and the oxide insulating layers 2416 and 2426 are formed by the oxide insulating layer 2439 selectively etched (see FIG. 5B). The oxide insulating layer 2426 is provided over a channel formation region of the oxide semiconductor layer 2422 and functions as a channel protection layer. Note that when an oxide insulating layer is used as the gate insulating layer 2402b as in this embodiment, film thickness of the oxide insulating layer is sometimes reduced because a part of the gate insulating layer 2402b is etched by the etching process of the oxide insulating layer 2439. When a nitride insulating film whose selective ratio with respect to the oxide insulating layer 2439 is high is used as the gate insulating layer 2402b, the gate insulating layer 2402b is prevented from being partly etched.

Figure 5C:
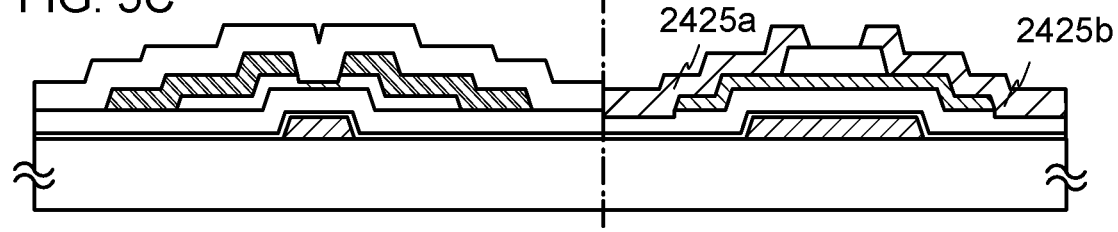

Next, after a light-transmitting conductive film is formed over the oxide semiconductor layer 2422 and the oxide insulating layer 2426, the source electrode layer 2425a and the drain electrode layer 2425b are formed by the seventh photolithography process (see FIG. 5C). As a deposition method of the light-transmitting conductive film, a sputtering method, a vacuum evaporation method (an electron beam evaporation method), an arc ion plating method, or a spray method is used. A conductive material having a light-transmitting property with respect to visible light such as an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, and a Zn—O-based metal oxide can be used as a material of the conductive film. The thickness is appropriately selected in the range of 50 nm to 300 nm. Note that when a sputtering method is used, deposition is performed using a target including $SiO_2$ at 2 percent by weight or more and 10 percent by weight or less and a light-transmitting conductive film is made to include $SiO_x$ (X>0) which suppresses crystallization, so that crystallization can be suppressed when heat treatment is performed for dehydration and dehydrogenation performed in a later process.

Note that a resist mask for forming the source electrode layer 2425a and the drain electrode layer 2425b may be formed by an ink jet method. When a resist mask may be formed by an ink jet method, a photomask is not needed; therefore, manufacturing cost can be reduced.

Next, the protection insulating layer 2403 is formed over the oxide insulating layer 2416, the oxide insulating layer 2426, the source electrode layer 2425a, and the drain electrode layer 2425b. In this embodiment, a silicon nitride film is formed by an RF sputtering method. An RF sputtering method is preferable as a deposition method of the protection insulating layer 2403 because of its quantity productivity. As the protection insulating layer 2403, an inorganic film in which an impurity such as moisture, a hydrogen ion, an oxygen ion, and OH— is not contained and which prevents such an impurity from entering the oxide insulating layer from the outside are used: a silicon oxide film, a silicon nitride oxide film, an aluminum nitride film, an aluminum oxynitride film, or the like is used. Needless to say, the protection insulating layer 2403 is a light-transmitting insulating film.

Further, it is preferable to use a structure in which the protection insulating layer 2403 is in contact with the first gate insulating layer 2402a provided below the protection insulating layer 2403 or an insulating layer serving as a base and which prevents an impurity such as moisture, a hydrogen ion, and OH⁻ from a vicinity of its side from entering the oxide semiconductor layer. In particular, when the first gate insulating layer 2402 or the insulating film serving as a base in contact with the protection insulating layer 2403 is a silicon nitride film, the effect is enhanced. That is, when a silicon nitride film is provided over an under surface, a top surface, and a side surface of the oxide semiconductor layer so as to surround the oxide semiconductor layer, reliability of a display device is improved.

Next, the planarizing insulating layer 2404 is formed over the protection insulating layer 2403. The planarizing insulating layer 2404 can be formed of an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarizing insulating layer 2404 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The formation method of the planarizing insulating layer 2404 is not limited to a particular method and a method such as a sputtering method, an SOG method, spin coating, dip coating, spray coating, a droplet discharge method (e.g., an inkjet method, screen printing, or offset printing), or the like and a tool such as a doctor knife, a roll coater, a curtain coater, a knife coater, or the like can be used depending on the material of the planarizing insulating layer.

Figure 5D:
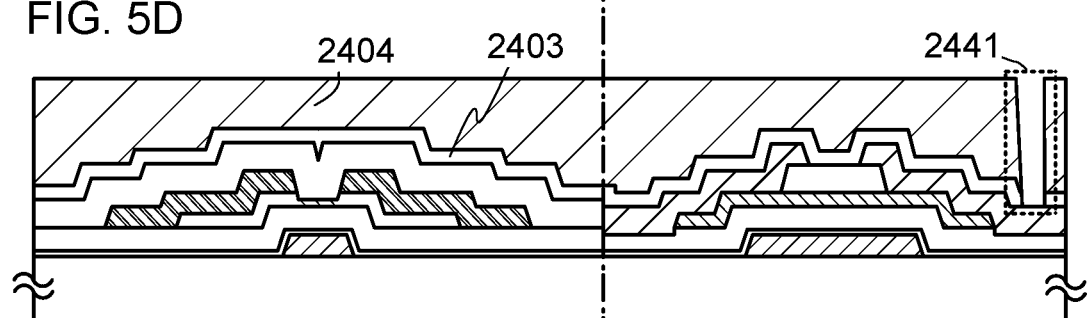
Figure 5E:
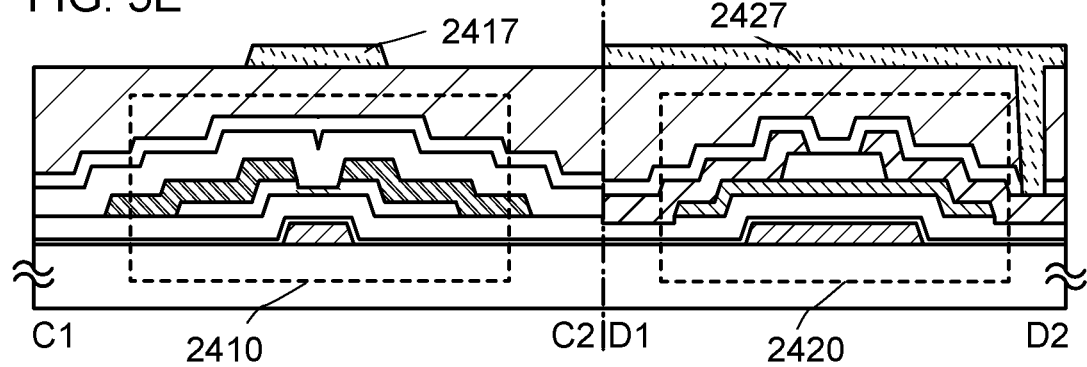

Next, a resist mask is formed by an eighth photolithography process, and the planarizing insulating layer 2404 and the protection insulating layer 2403 are etched to form a contact hole 2441 which reaches the drain electrode layer 2425b (see FIG. 5D). In addition, contact holes which reach the gate electrode layers 2411 and 2421 are also formed. Note that a resist mask for forming the contact hole which reaches the drain electrode layer 2425b may be formed by an ink jet method. When a resist mask may be formed by an ink jet method, a photomask is not needed; therefore, manufacturing cost can be reduced.

Next, after the resist mask is removed, a light-transmitting conductive film is formed. The light-transmitting conductive film is formed of indium oxide ($In_2O_3$), indium oxide-tin oxide alloy ($In_2O_3$—$SnO_2$, abbreviated to ITO), or the like by a sputtering method, a vacuum evaporation method, or the like. As for other material of a light-transmitting conductive film, an Al—Zn—O-based non-single-crystal film including nitrogen, that is, an Al—Zn—O—N-based non-single-crystal film, a Zn—O-based non-single-crystal film including nitrogen, or an Sn—Zn—O-based non-single-crystal film including nitrogen can be used. Note that the relative proportion (atomic %) of zinc in an Al—Zn—O—N-based non-single-crystal film is 47 atomic % or less, which is larger than the relative proportion (atomic %) of aluminum in the non-single-crystal film. The relative proportion (atomic %) of aluminum in the non-single-crystal film is larger than that of nitrogen in the non-single-crystal film. Such a material is etched with a hydrochloric acid-based solution. However, since a residue is easily generated particularly in etching ITO, indium oxide-zinc oxide alloy ($In_2O_3$—ZnO) may be used to improve etching processability.

Note that the unit of the relative proportion in the light-transmitting conductive film is atomic percent, and the relative proportion is evaluated by analysis using an electron probe X-ray microanalyzer (EPMA).

Next, a ninth photolithography process is performed. A resist mask is formed, and unnecessary portions are removed by etching, whereby the pixel electrode layer 2427 and the conductive layer 2417 are formed (see FIG. 5E).

Through the above process, with nine masks, the thin film transistor 2410 and the thin film transistor 2420 can be formed over the same substrate in the driver circuit and in the pixel portion, respectively. The thin film transistor 2410 for the driver circuit is a channel-etched thin film transistor including the oxide semiconductor layer 2412 having the first high resist drain region 2414a, the second high resist drain region 2414b, and the channel formation region 2413. The thin film transistor 2420 for the pixel is a channel-protective thin film transistor having the oxide semiconductor layer 2422 whole of which becomes an I type.

Further, a storage capacitor which is formed using a capacitor wiring layer and a capacitor electrode layer and which is formed using the first gate insulating layer 2402a and the second gate insulating layer 2402b which serve as a dielectric can be formed over the same substrate. The pixel portion is formed by providing the thin film transistors 2420 and the storage capacitors for pixels in matrix and a driver circuit including the thin film transistor 2410 is provided in a vicinity of the pixel portion, so that one of substrates for manufacturing an active-matrix display device can be formed. In this specification, such a substrate is referred to as an active matrix substrate for convenience.

Note that the pixel electrode layer 2427 is electrically connected to a capacitor electrode layer through a contact hole formed in the planarizing insulating layer 2404 and the protection insulating layer 2403. Note that the capacitor electrode layer can be formed using the same light-transmitting material and the same process as the source electrode layer 2425a and the drain electrode layer 2425b.

The conductive layer 2417 is provided to overlap with the channel formation region 2413 of the oxide semiconductor layer 2412, so that, in a bias-temperature stress test (hereinafter, referred to as a BT test) for examining reliability of a thin film transistor, the amount of change in threshold voltage of the thin film transistor 2410 between before and after the BT test can be reduced. Further, the conductive layer 2417 can function as a second gate electrode layer. A potential of the conductive layer 2417 may be the same as or different from that of the gate electrode layer 2411, or can be GND, 0 V, or in a floating state.

Note that in this embodiment, the thin film transistor 2410 for the driver circuit has the conductive layer 2417 overlapping with the channel formation region 2413. However, a thin film transistor for the driver circuit does not need to have the conductive layer 2417. The thin film transistor 2410 having the conductive layer 2417 and a thin film transistor which does not have the conductive layer 2417 can be formed over the same substrate using the above process.

Further, an oxide semiconductor is not necessarily used for a thin film transistor for the driver circuit. Note that when the thin film transistor 2410 for the driver circuit is formed over a substrate where the thin film transistor 2420 for the pixel is to be formed, as this embodiment shows, it is preferable to form the thin film transistor 2410 together with the thin film transistor 2420 using an oxide semiconductor because the number of steps can be reduced. In this case, both the thin film transistor 2410 for the driver circuit and the thin film transistor 2420 for the pixel are unipolar transistors.

Note that a resist mask for forming the pixel electrode layer 2427 may be formed by an ink jet method. When a resist mask may be formed by an ink jet method, a photomask is not needed; therefore, manufacturing cost can be reduced.

Embodiment 3

This embodiment describes an example of a semiconductor device in which a plurality of signals can be obtained from one signal. Here, the case where three signals can be obtained from one signal is described for example, this embodiment is not limited thereto. A various cases are acceptable as long as two or more signals can be obtained from one signal.

First, a structure of the semiconductor device of this embodiment will be described with reference to FIG. 6A.

A circuit 100 includes a circuit 110, a circuit 120, and a circuit 130. The circuit 110 includes a transistor 111 corresponding to a scan line switching element, a circuit 112, and a capacitor 114. The circuit 120 includes a transistor 121 corresponding to a scan line switching element, a circuit 122, and a capacitor 124. The circuit 130 includes a transistor 131 corresponding to a scan line switching element, a circuit 132, and a capacitor 134. A signal IN, a signal CK1, a signal CK2, a signal CK3, a signal OUT1, a signal OUT2, and signal OUT3 are transmitted through a wiring 140, a wiring 141, a wiring 142, a wiring 143, a wiring 151, a wiring 152, and a wiring 153, respectively.

Next, a connection relation will be described.

The circuit 100 is connected to the wiring 140, the wiring 141, the wiring 142, and the wiring 143. The circuit 110 is connected to the wiring 140, the wiring 141, and the wiring 151. The circuit 120 is connected to the wiring 140, the wiring 142, and the wiring 152. The circuit 130 is connected to the wiring 140, the wiring 143, and the wiring 153. That is, the wiring 140 is connected to each of the circuit 110, the circuit 120, and the circuit 130.

Figure 6A:
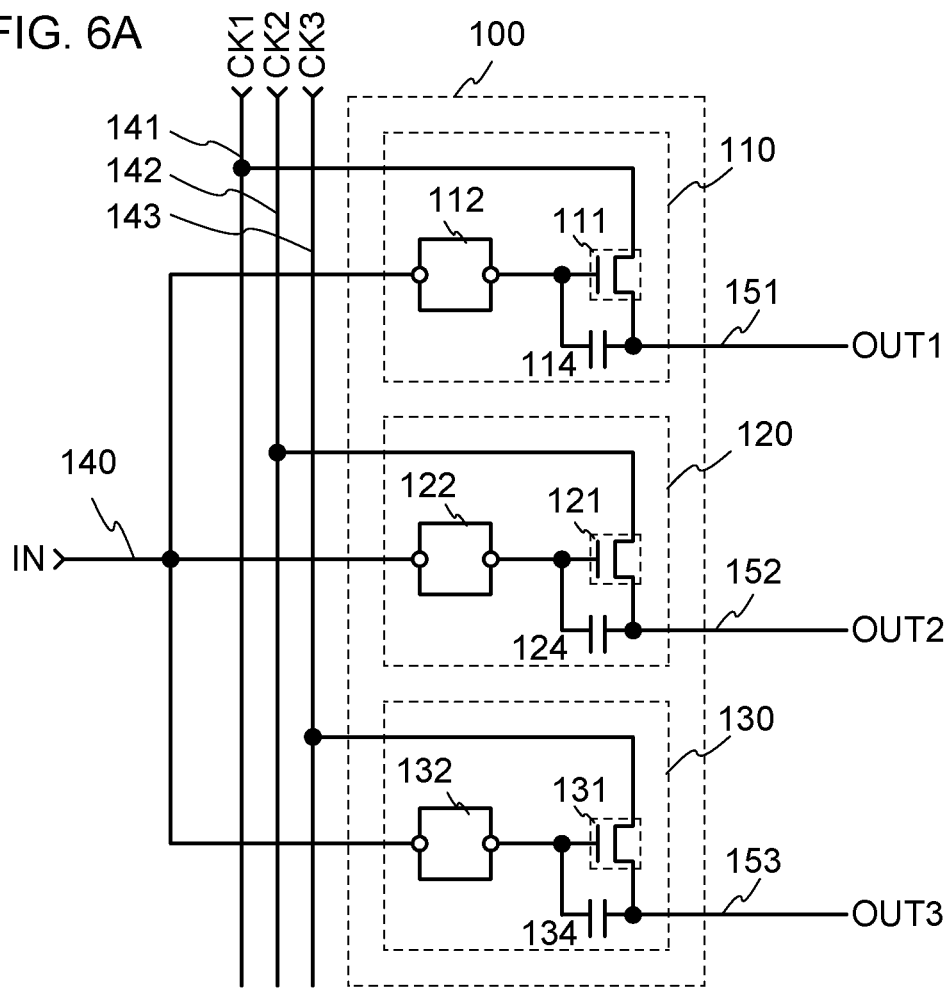
FIG. 6A is a circuit diagram and FIG. 6B is a timing chart each illustrating Embodiment 3.

Next, operation of the semiconductor device in FIG. 6A is described with reference to a timing chart in FIG. 6B.

Figure 6B:
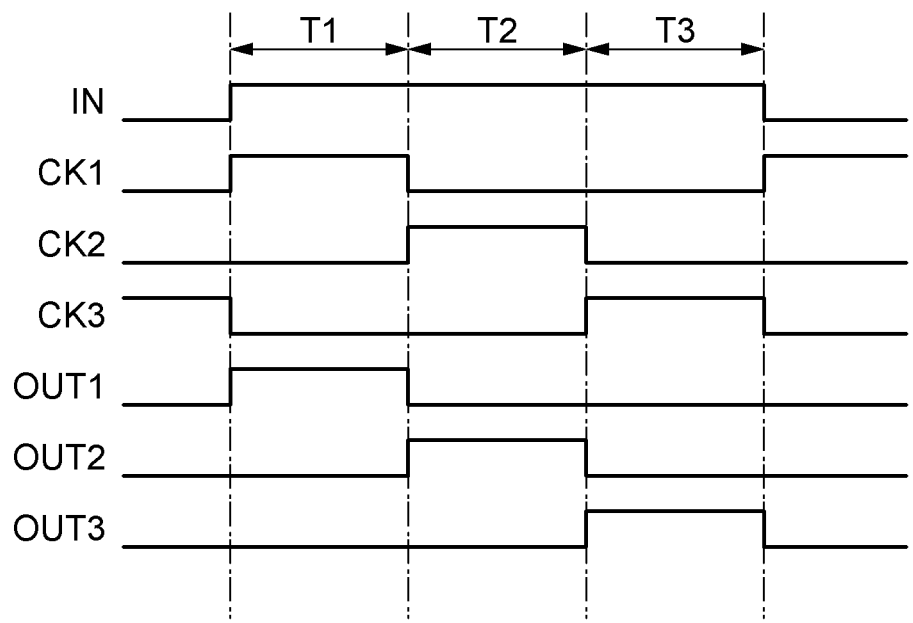

The timing chart in FIG. 6B has a period T1, a period T2, and a period T3. The signal IN is an input signal of the circuit 100. The signal CK1, the signal CK2, and the signal CK3 are input signals to the circuit 110, the circuit 120, and the circuit 130, respectively. The signal OUT1, the signal OUT2, and the signal OUT3 are output signals from the circuit 110, the circuit 120, and the circuit 130, respectively.

First, operation of a semiconductor device in FIG. 6A in the period T1 is described. In the period T1, the signal IN is in an H level, the signal CK1 is in the H level, the signal CK2 is in an L level, and the signal CK3 is in the L level. Then, the transistor 111 included in the circuit 110 is turned on; therefore, the signal OUT1 is in the H level, the signal OUT2 is in the L level, and the signal OUT3 is in the L level.

Next, in the period T2, the signal IN is in the H level, the signal CK1 is in the L level, the signal CK2 is in the H level, and the signal CK3 is in the L level. Then, the transistor 121 included in the circuit 120 is turned on; therefore, the signal OUT1 is in the L level, the signal OUT2 is in the H level, and the signal OUT3 is in the L level.

Then, in the period T3, the signal IN is in the H level, the signal CK1 is in the L level, the signal CK2 is in the L level, and the signal CK3 is in the H level. Then, the transistor 131 included in the circuit 130 is turned on; therefore, the signal OUT1 is in the L level, the signal OUT2 is in the L level, and the signal OUT3 is in the H level.

Then, the signal OUT1, the signal OUT2, and the signal OUT3 outputted from the circuit 110, the circuit 120, and the circuit 130, respectively, are inputted as scan line selection signals from a scan line driver circuit to corresponding scan lines.

In this manner, a plurality of signals can be obtained from the signal IN. At this time, capacitive coupling of the capacitor 114, the capacitor 124, and the capacitor 134 included in the circuit 110, the circuit 120, and the circuit 130, respectively, makes the amplitude of the signal OUT1, the signal OUT2, and the signal OUT3 the same as that of the signal CK1, the signal CK2, and the signal CK3, respectively.

Further, each of potentials of respective gate electrodes of the transistor 111, the transistor 121, and the transistor 131 is increased by bootstrap operation in accordance with the respective signals OUT1, OUT2, and OUT3. That is, Vgs of a transistor can be increased or kept large, so that distortion of the signals OUT1 to OUT3 is decreased. Alternatively, rising times or falling times of the signals OUT1 to OUT3 can be shortened.

In addition, since a signal which has larger amplitude than the signal IN or a power supply voltage is not additionally needed, power consumption can be reduced.

Embodiment 4

In this embodiment, a specific example of Embodiment 3 is described.

First, a structure of a semiconductor device of this embodiment will be described with reference to FIG. 7A.

The circuit 100 includes the circuit 110, the circuit 120, and the circuit 130. The circuit 110 includes the transistor 111, a transistor 113, a transistor 115, and the capacitor 114. The circuit 120 includes the transistor 121, a transistor 123, a transistor 125, and the capacitor 124. The circuit 130 includes the transistor 131, a transistor 133, a transistor 135, and the capacitor 134. A signal IN1, a signal CK1, a signal CK2, a signal CK3, a signal IN2, a signal OUT1, a signal OUT2, and signal OUT3 are transmitted through the wiring 140, the wiring 141, a wiring 142, the wiring 143, a wiring 240, the wiring 151, the wiring 152, and the wiring 153, respectively.

Next, a connection relation will be described.

The circuit 100 is connected to the wiring 140, the wiring 141, the wiring 142, the wiring 143, and the wiring 240. The circuit 110 is connected to the wiring 140, the wiring 141, the wiring 240, and the wiring 151. The circuit 120 is connected to the wiring 140, the wiring 142, the wiring 240, and the wiring 152. The circuit 130 is connected to the wiring 140, the wiring 143, the wiring 240, and the wiring 153. That is, the wiring 140 and the wiring 240 are connected to each of the circuit 110, the circuit 120, and the circuit 130.

A gate electrode of the transistor 111 included in the circuit 110 is connected to one of source and drain electrodes of the transistor 115 and one of electrodes of the capacitor 114. One of source and drain electrodes of the transistor 111 is connected to the wiring 141. The other of the source and drain electrodes of the transistor 111 is connected to the wiring 151 and the other of the electrodes of the capacitor 114. A gate electrode of the transistor 115 is connected to the wiring 140 and the other of the source and drain electrodes of the transistor 115. One of the source and drain electrodes of the transistor 115 is connected to the gate electrode of the transistor 111 and the one of the electrodes of the capacitor 114. A gate electrode of the transistor 113 is connected to the wiring 240. One of source and drain electrodes of the transistor 113 is connected to the gate electrode of the transistor 111, the one of the source and drain electrodes of the transistor 115, and the one of the electrodes of the capacitor 114. The other of the source and drain electrodes of the transistor 113 is connected to a GND (ground) electrode.

A gate electrode of the transistor 121 included in the circuit 120 is connected to one of source and drain electrodes of the transistor 125 and one of electrodes of the capacitor 124. One of source and drain electrodes of the transistor 121 is connected to the wiring 142. The other of the source and drain electrodes of the transistor 121 is connected to the wiring 152 and the other of electrodes of the capacitor 124. A gate electrode of the transistor 125 is connected to the wiring 140 and the other of the source and drain electrodes of the transistor 125. The one of the source and drain electrodes of the transistor 125 is connected to the gate electrode of the transistor 121 and the one of the electrodes of the capacitor 124. A gate electrode of the transistor 123 is connected to the wiring 240. One of the source and drain electrodes of the transistor 123 is connected to the gate electrode of the transistor 121, the one of the source and drain electrodes of the transistor 125, and the one of the electrodes of the capacitor 124. The other of the source and drain electrodes of the transistor 123 is connected to the GND (ground) electrode.

A gate electrode of the transistor 131 included in the circuit 130 is connected to one of source and drain electrodes of the transistor 135 and one of electrodes of the capacitor 134. One of source and drain electrodes of the transistor 131 is connected to the wiring 143. The other of the source and drain electrodes of the transistor 131 is connected to the wiring 153 and the other of the electrodes of the capacitor 134. A gate electrode of the transistor 135 is connected to the wiring 140 and the other of the source and drain electrodes of the transistor 135. The one of the source and drain electrodes of the transistor 135 is connected to the gate electrode of the transistor 131 and the one of the electrodes of the capacitor 134. A gate electrode of the transistor 133 is connected to the wiring 240. One of source and drain electrodes of the transistor 133 is connected to the gate electrode of the transistor 131, the one of the source and drain electrodes of the transistor 135, and the one of the electrodes of the capacitor 134. The other of the source and drain electrodes of the transistor 133 is connected to the GND (ground) electrode.

Figure 7A:
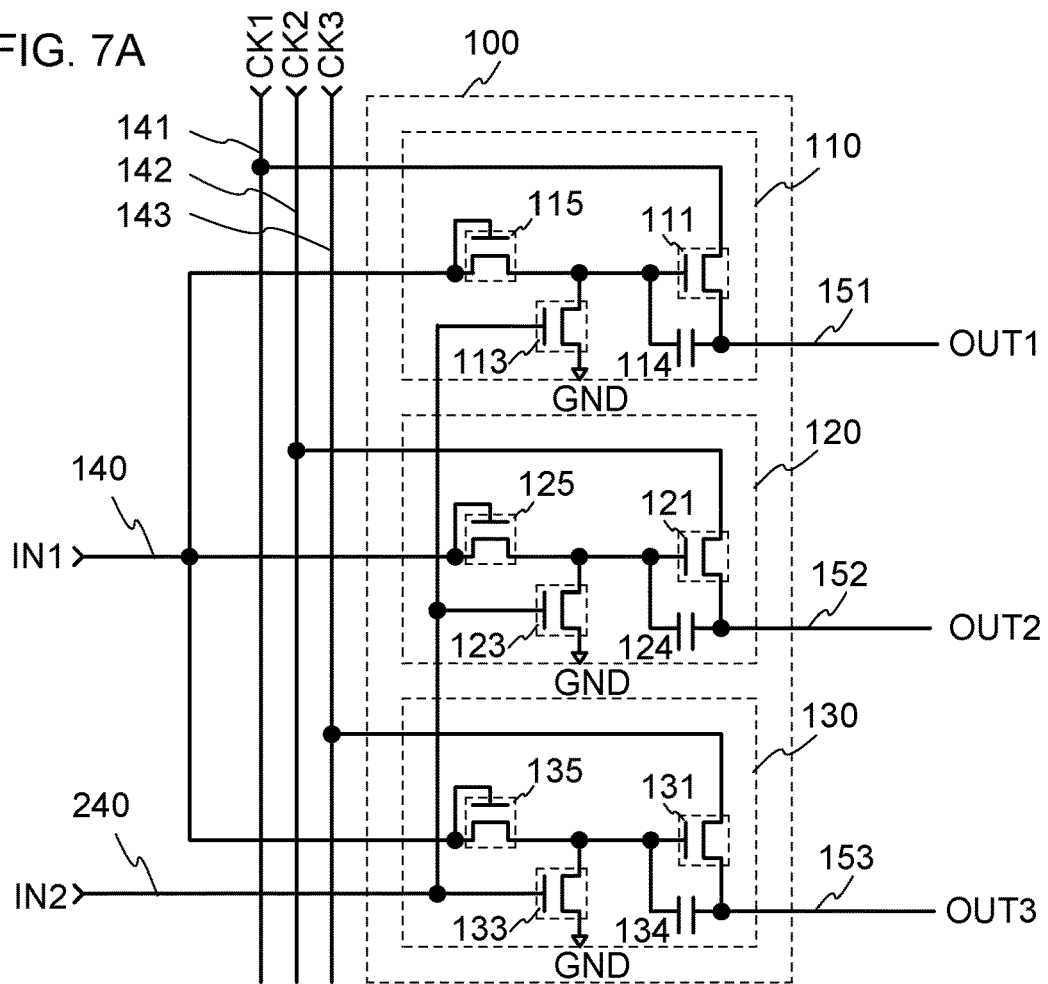
FIG. 7A is a circuit diagram and FIG. 7B is a timing chart each illustrating Embodiment 4.

Next, operation of the semiconductor device in FIG. 7A is described with reference to a timing chart in FIG. 7B.

Figure 7B:
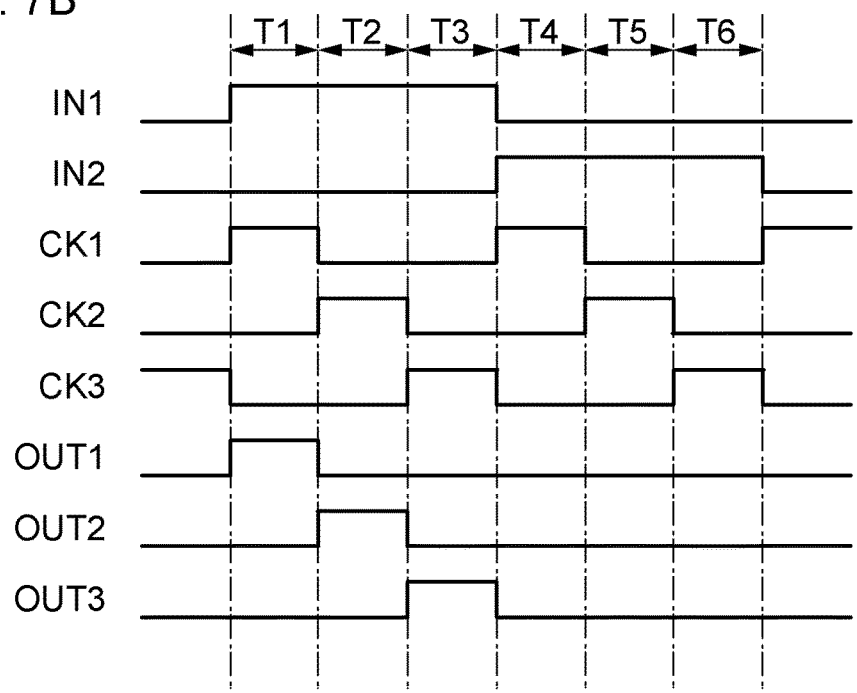

The timing chart in FIG. 7B has a period T1, a period T2, a period T3, a period T4, a period T5, and a period T6. The signal IN1 is an input signal of the circuit 100 in a first stage. The signal IN2 is an input signal of the circuit 100 in a second stage. The signal CK1, the signal CK2, and the signal CK3 are input signals of the circuits 110, the circuits 120, and the circuits 130, respectively, included in the circuits 100 in the first stage and the second stage. The signal OUT1, the signal OUT2, and the signal OUT3 are output signals from the circuits 110, the circuits 120, and the circuits 130, respectively, included in the circuit 100 in the first stage. The signal OUT1, the signal OUT2, and the signal OUT3 are inputted as scan line selection signals from a scan line driver circuit to corresponding scan lines.

First, operation of a semiconductor device in FIG. 7A in the period T1 is described. In the period T1, the signal IN1 is in an H level, the signal IN2 is in an L level, the signal CK1 is in the H level, the signal CK2 is in the L level, and the signal CK3 is in the L level. Then, the transistor 111 included in the circuit 110 is turned on; therefore, the signal OUT1 is in the H level, the signal OUT2 is in the L level, and the signal OUT3 is in the L level.

Next, in the period T2, the signal IN1 is in the H level, the signal IN2 is in the L level, the signal CK1 is in the L level, the signal CK2 is in the H level, and the signal CK3 is in the L level. Then, the transistor 121 included in the circuit 120 is turned on; therefore, the signal OUT1 is in the L level, the signal OUT2 is in the H level, and the signal OUT3 is in the L level. At that time, the transistor 111 included in the circuit 110 is kept on.

Then, in the period T3, the signal IN1 is in the H level, the signal IN2 is in the L level, the signal CK1 is in the L level, the signal CK2 is in the L level, and the signal CK3 is in the H level. Then, the transistor 131 included in the circuit 130 is turned on; therefore, the signal OUT1 is in the L level, the signal OUT2 is in the L level, and the signal OUT3 is in the H level. At that time, the transistor 111 included in the circuit 110 and the transistor 121 included in the circuit 120 are kept on.

That is, in the period T3, the transistor 111, the transistor 121, and the transistor 131 are kept on. If the state is continued, the signal OUT1, the signal OUT2, and the signal OUT3 go into the H level when the signal CK1, the signal CK2, and the signal CK3 go into the H level after the period T3 is over, which sometimes cause a defect in scan line selection.

Next, in the period T4, the signal IN1 is in the L level, the signal IN2 is in the H level, the signal CK1 is in the H level, the signal CK2 is in the L level, and the signal CK3 is in the L level. When the signal IN2 goes into the H level, the transistor 113 included in the circuit 110, the transistor 123 included in the circuit 120, and the transistor 133 included in the circuit 130 is turned on. The other of drain and source electrodes of each of these transistors is connected to the GND electrode, so that the potential of one of source and drain electrodes of each of these transistors goes into the L level. Therefore, the gate electrodes of the transistor 111, the transistor 121, and the transistor 131 connected to the ones of the source and drain electrodes of the transistors 113, 123, 133, respectively go into the L level, whereby the transistors 111, 121, and 131 are turned off. Thus, in the period T4, the signal OUT1 can be kept in the L level even when the signal CK1 is in the H level.

In the period T5 and the period T6, as in the period T4, in the case where the signal IN2 is in the H level, since the transistor 111, the transistor 121, and the transistor 131 are off, the signal OUT2 and the signal OUT3 can be kept in the L level even when the signal CK2 and the signal CK3 are in the H level. In addition, at that time, the signal OUT4, the signal OUT5, and the signal OUT6 outputted from the circuit 100 in the second stage sequentially go into the H level as in the case where the signal IN1 are inputted to the circuit 100 in the first stage.

In the case where a structure where the transistor 111, the transistor 121, and the transistor 131 are not turned off is used, the signal OUT1, the signal OUT2, and the signal OUT3 go into the H level at the same time as the signal CK1, the signal CK2, and the signal CK3 go into the H level, which sometimes cause a defect in scan line selection.

Embodiment 5

In this embodiment, another specific example of Embodiment 3 is described.

First, a structure of a semiconductor device of this embodiment will be described with reference to FIG. 8.

The circuit 100 includes the circuit 110, the circuit 120, and the circuit 130. The circuit 110 includes the transistor 111, the transistor 113, the transistor 115, a transistor 116, and the capacitor 114. The circuit 120 includes the transistor 121, the transistor 123, the transistor 125, a transistor 126, and the capacitor 124. The circuit 130 includes the transistor 131, the transistor 133, the transistor 135, a transistor 136, and the capacitor 134. A signal IN1, a signal CK1, a signal CK2, a signal CK3, a signal IN2, a signal OUT1, a signal OUT2, and signal OUT3 are transmitted through the wiring 140, the wiring 141, the wiring 142, the wiring 143, a wiring 240, the wiring 151, the wiring 152, and the wiring 153, respectively.

Next, a connection relation will be described.

The circuit 100 is connected to the wiring 140, the wiring 141, the wiring 142, the wiring 143, and the wiring 240. The circuit 110 is connected to the wiring 140, the wiring 141, the wiring 240, and the wiring 151. The circuit 120 is connected to the wiring 140, the wiring 142, the wiring 240, and the wiring 152. The circuit 130 is connected to the wiring 140, the wiring 143, the wiring 240, and the wiring 153. That is, the wiring 140 and the wiring 240 are connected to each of the circuit 110, the circuit 120, and the circuit 130.

The gate electrode of the transistor 111 included in the circuit 110 is connected to one of the source and drain electrodes of the transistor 115 and one of the electrodes of the capacitor 114. One of the source and drain electrodes of the transistor 111 is connected to the wiring 141. The other of the source and drain electrodes of the transistor 111 is connected to the wiring 151, one of the source and drain electrodes of the transistor 116, and the other of the electrodes of the capacitor 114. The gate electrode of the transistor 115 is connected to the wiring 140 and the other of the source and drain electrodes of the transistor 115. One of the source and drain electrodes of the transistor 115 is connected to the gate electrode of the transistor 111 and the one of the electrodes of the capacitor 114. The gate electrode of the transistor 113 is connected to the wiring 240. One of the source and drain electrodes of the transistor 113 is connected to the gate electrode of the transistor 111, one of the source and drain electrodes of the transistor 115, and the one of the electrodes of the capacitor 114. The other of the source and drain electrodes of the transistor 113 is connected to the GND (ground) electrode. A gate electrode of the transistor 116 is connected to the wiring 143. The one of the source and drain electrodes of the transistor 116 is connected to the wiring 151, the other of the source and drain electrodes of the transistor 111, and the other of the electrodes of the capacitor 114. The other of the source and drain electrodes of the transistor 116 is connected to the GND (ground) electrode.

A gate electrode of the transistor 121 included in the circuit 120 is connected to one of the source and drain electrodes of the transistor 125 and one of the electrodes of the capacitor 124. One of source and drain electrodes of the transistor 121 is connected to the wiring 142. The other of the source and drain electrodes of the transistor 121 is connected to the wiring 152, one of the source and drain electrodes of the transistor 126, and the other of electrodes of the capacitor 124. A gate electrode of the transistor 125 is connected to the wiring 140 and the other of the source and drain electrodes of the transistor 125. One of the source and drain electrodes of the transistor 125 is connected to the gate electrode of the transistor 121 and the one of the electrodes of the capacitor 124. A gate electrode of the transistor 123 is connected to the wiring 240. One of the source and drain electrodes of the transistor 123 is connected to the gate electrode of the transistor 121, the one of the source and drain electrodes of the transistor 125, and the one of the electrodes of the capacitor 124. The other of the source and drain electrodes of the transistor 123 is connected to the GND (ground) electrode. A gate electrode of the transistor 126 is connected to the wiring 141. The one of the source and drain electrodes of the transistor 126 is connected to the wiring 152, the other of the source and drain electrodes of the transistor 121, and the one of the electrodes of the capacitor 124. The other of the source and drain electrodes of the transistor 126 is connected to the GND (ground) electrode.

The gate electrode of the transistor 131 included in the circuit 130 is connected to one of the source and drain electrodes of the transistor 135 and one of electrodes of the capacitor 134. One of the source and drain electrodes of the transistor 131 is connected to the wiring 143. The other of the source and drain electrodes of the transistor 131 is connected to the wiring 153, one of source and drain electrodes of the transistor 136, and the other of the electrodes of the capacitor 134. The gate electrode of the transistor 135 is connected to the wiring 140 and the other of the source and drain electrodes of the transistor 135. The one of the source and drain electrodes of the transistor 135 is connected to the gate electrode of the transistor 131 and the one of the electrodes of the capacitor 134. The gate electrode of the transistor 133 is connected to the wiring 240. One of the source and drain electrodes of the transistor 133 is connected to the gate electrode of the transistor 131, the one of the source and drain electrodes of the transistor 135, and the one of the electrodes of the capacitor 134. The other of the source and drain electrodes of the transistor 133 is connected to the GND (ground) electrode. A gate electrode of the transistor 136 is connected to the wiring 142. One of the source and drain electrodes of the transistor 136 is connected to the wiring 153, one of the source and drain electrodes of the transistor 131, and one of electrodes of the capacitor 134. The other of the source and drain electrodes of the transistor 136 is connected to the GND (ground) electrode.

Next, operation of the semiconductor device in FIG. 8 is described with reference to the timing chart in FIG. 7B.

The timing chart in FIG. 7B has the period T1, the period T2, the period T3, the period T4, the period T5, and the period T6. The signal IN1 is an input signal of the circuit 100 in a first stage. The signal IN2 is an input signal of the circuit 100 in a second stage. The signal CK1, the signal CK2, and the signal CK3 are input signals of the circuits 110, the circuits 120, and the circuits 130, respectively, included in the circuits 100 in the first stage and the second stage. The signal OUT1, the signal OUT2, and the signal OUT3 are output signals from the circuits 110, the circuits 120, and the circuits 130, respectively, included in the circuit 100 in the first stage. Then, the signal OUT1, the signal OUT2, and the signal OUT3 are inputted as scan line selection signals from a scan line driver circuit to corresponding scan lines.

First, operation of a semiconductor device in FIG. 8 in the period T1 is described. In the period T1, the signal IN1 is in the H level, the signal IN2 is in the L level, the signal CK1 is in the H level, the signal CK2 is in the L level, and the signal CK3 is in the L level. Then, the transistor 111 included in the circuit 110 is turned on; therefore, the signal OUT1 is in the H level, the signal OUT2 is in the L level, and the signal OUT3 is in the L level. At that time, the transistor 126 included in the circuit 120 is turned on and the signal OUT2 goes into the L level.

Next, in the period T2, the signal IN1 is in the H level, the signal IN2 is in the L level, the signal CK1 is in the L level, the signal CK2 is in the H level, and the signal CK3 is in the L level. Then, the transistor 121 included in the circuit 120 is turned on; therefore, the signal OUT1 is in the L level, the signal OUT2 is in the H level, and the signal OUT3 is in the L level. At that time, the transistor 111 included in the circuit 110 is kept on. Further, the transistor 136 included in the circuit 130 is turned on and the signal OUT3 goes into the L level.

Then, in the period T3, the signal IN1 is in the H level, the signal IN2 is in the L level, the signal CK1 is in the L level, the signal CK2 is in the L level, and the signal CK3 is in the H level. Then, the transistor 131 included in the circuit 130 is turned on; therefore, the signal OUT1 is in the L level, the signal OUT2 is in the L level, and the signal OUT3 is in the H level. At that time, the transistor 111 included in the circuit 110 and the transistor 121 included in the circuit 120 are kept on. Further, the transistor 116 included in the circuit 110 is turned on and the signal OUT1 goes into the L level.

Next, in the period T4, the signal IN1 is in the L level, the signal IN2 is in the H level, the signal CK1 is in the H level, the signal CK2 is in the L level, and the signal CK3 is in the L level. When the signal IN2 goes into the H level, the transistor 113 included in the circuit 110, the transistor 123 included in the circuit 120, and the transistor 133 included in the circuit 130 is turned on. The other of drain and source electrodes of each of these transistors is connected to the GND electrode, so that the potential of one of source and drain electrodes of each of these transistors goes into the L level. Therefore, the gate electrodes of the transistor 111, the transistor 121, and the transistor 131 connected to the one of the source and drain electrodes of the transistors 111, 121, and 131 go into the L level, whereby these transistors are turned off. Thus, in the period T4, the signal OUT1 can be kept in the L level event when the signal CK1 goes into the H level. Further, as in the period T1, since the signal CK1 is in the H level, the transistor 126 included in the circuit 120 is ON, the signal OUT2 is in the L level.

In the period T5 and the period T6, as in the period T4, in the case where the signal IN2 is in the H level, since the transistor 111, the transistor 121, and the transistor 131 are off, the signal OUT2 and the signal OUT3 can be kept in the L level even when the signal CK2 and the signal CK3 are in the H level. In addition, at that time, the signal OUT4, the signal OUT5, and the signal OUT6 outputted from the circuit 100 in the second stage sequentially go into the H level as in the case where the signal IN1 are inputted to the circuit 100 in the first stage. Further, the transistor 136 included in the circuit 130 is ON in the period T5 and the transistor 116 included in the circuit 110 is ON in the period T6, so that the signal OUT3 and the signal OUT1 go into the L level.

As thus described, the signal OUT1, the signal OUT2, and the signal OUT3 go into the L level by turning on the transistor 116 included in the circuit 110, the transistor 126 included in the circuit 120, and the transistor 136 included in the circuit 130; so that a defect in scan line selection can be suppressed.

Embodiment 6

This embodiment describes another example of a semiconductor device in which a plurality of signals can be obtained from one signal. In this embodiment, a connection relation between a transistor and a signal IN and a connection relation between the transistor and a signal CK in Embodiment 3 are switched.

First, a structure of a semiconductor device of this embodiment will be described with reference to FIG. 9.

The circuit 100 includes the circuit 110, the circuit 120, and the circuit 130. The circuit 110 includes the transistor 111, the circuit 112, and the capacitor 114. The circuit 120 includes the transistor 121, the circuit 122, and the capacitor 124. The circuit 130 includes the transistor 131, the circuit 132, and the capacitor 134. A signal IN, a signal CK1, a signal CK2, a signal CK3, a signal OUT1, a signal OUT2, and signal OUT3 are transmitted through the wiring 140, the wiring 141, the wiring 142, the wiring 143, the wiring 151, the wiring 152, and the wiring 153, respectively.

Next, a connection relation will be described.

The circuit 100 is connected to the wiring 140, the wiring 141, the wiring 142, and the wiring 143. The circuit 110 is connected to the wiring 140, the wiring 141, and the wiring 151. The circuit 120 is connected to the wiring 140, the wiring 142, and the wiring 152. The circuit 130 is connected to the wiring 140, the wiring 143, and the wiring 153. That is, the wiring 140 is connected to each of the circuit 110, the circuit 120, and the circuit 130.

Next, operation of a semiconductor device in FIG. 9 is described with reference to the timing chart in FIG. 6B.

The timing chart in FIG. 6B has the period T1, the period T2, and the period T3. The signal IN is an input signal of the circuit 100. The signal CK1, the signal CK2, and the signal CK3 are input signals to the circuit 110, the circuit 120, and the circuit 130, respectively. The signal OUT1, the signal OUT2, and the signal OUT3 are output signals from the circuit 110, the circuit 120, and the circuit 130, respectively.

First, operation of the semiconductor device in FIG. 9 in the period T1 is described. In the period T1, the signal IN is in the H level, the signal CK1 is in the H level, the signal CK2 is in the L level, and the signal CK3 is in the L level. Then, the transistor 111 included in the circuit 110 is turned on; therefore, the signal OUT1 is in the H level, the signal OUT2 is in the L level, and the signal OUT3 is in the L level.

Next, in the period T2, the signal IN is in the H level, the signal CK1 is in the L level, the signal CK2 is in the H level, and the signal CK3 is in the L level. Then, the transistor 121 included in the circuit 120 is turned on; therefore, the signal OUT1 is in the L level, the signal OUT2 is in the H level, and the signal OUT3 is in the L level.

Then, in the period T3, the signal IN is in the H level, the signal CK1 is in the L level, the signal CK2 is in the L level, and the signal CK3 is in the H level. Then, the transistor 131 included in the circuit 130 is turned on; therefore, the signal OUT1 is in the L level, the signal OUT2 is in the L level, and the signal OUT3 is in the H level.

Then, the signal OUT1, the signal OUT2, and the signal OUT3 outputted from the circuit 110, the circuit 120, and the circuit 130, respectively, are inputted as scan line selection signals from a scan line driver circuit to corresponding scan lines.

In this manner, a plurality of signals can be obtained from the signal IN. At this time, capacitive coupling of the capacitor 114, the capacitor 124, and the capacitor 134 included in the circuit 110, the circuit 120, and the circuit 130, respectively, makes the amplitude of the signal OUT1, the signal OUT2, and the signal OUT3 the same as that of the signal CK1, the signal CK2, and the signal CK3, respectively.

Further, each of potentials of respective gate electrodes of the transistor 111, the transistor 121, and the transistor 131 is increased by bootstrap operation in accordance with the respective signals OUT1, OUT2, and OUT3. That is, Vgs of a transistor can be increased or kept large, so that distortion of the signals OUT1 to OUT3 is decreased. Alternatively, rising times or falling times of the signals OUT1 to OUT3 can be shortened.

In addition, since a signal which has larger amplitude than the signal IN or a power supply voltage is not additionally needed, power consumption can be reduced.

Embodiment 7

This embodiment describes a specific example of Embodiment 4.

First, a structure of a semiconductor device of this embodiment will be described with reference to FIG. 10.

The circuit 100 includes the circuit 110, the circuit 120, and the circuit 130. The circuit 110 includes the transistor 111, the transistor 113, the transistor 115, and the capacitor 114. The circuit 120 includes the transistor 121, the transistor 123, the transistor 125, and the capacitor 124. The circuit 130 includes the transistor 131, the transistor 133, the transistor 135, and the capacitor 134. A signal IN, a signal CK1, a signal CK2, a signal CK3, a signal OUT1, a signal OUT2, and signal OUT3 are transmitted through the wiring 140, the wiring 141, the wiring 142, the wiring 143, the wiring 151, the wiring 152, and the wiring 153, respectively.

Next, a connection relation will be described.

The circuit 100 is connected to the wiring 140, the wiring 141, the wiring 142, and the wiring 143. The circuit 110 is connected to the wiring 140, the wiring 141, and the wiring 151. The circuit 120 is connected to the wiring 140, the wiring 142, and the wiring 152. The circuit 130 is connected to the wiring 140, the wiring 143, and the wiring 153. That is, the wiring 140 is connected to each of the circuit 110, the circuit 120, and the circuit 130.

The gate electrode of the transistor 111 included in the circuit 110 is connected to one of the source and drain electrodes of the transistor 115 and one of electrodes of the capacitor 114. One of the source and drain electrodes of the transistor 111 is connected to the wiring 140. The other of the source and drain electrodes of the transistor 111 is connected to the wiring 151, and the other of the electrodes of the capacitor 114. The gate electrode of the transistor 115 is connected to the wiring 141 and the other of the source and drain electrodes of the transistor 115. The one of the source and drain electrodes of the transistor 115 is connected to the gate electrode of the transistor 111 and the one of the electrodes of the capacitor 114. The gate electrode of the transistor 113 is connected to the wiring 142. One of the source and drain electrodes of the transistor 113 is connected to the gate electrode of the transistor 111, the one of the source and drain electrodes of the transistor 115, and the one of the electrodes of the capacitor 114. The other of the source and drain electrodes of the transistor 113 is connected to the GND (ground) electrode.

The gate electrode of the transistor 121 included in the circuit 120 is connected to one of the source and drain electrodes of the transistor 125 and one of electrodes of the capacitor 124. One of the source and drain electrodes of the transistor 121 is connected to the wiring 140. The other of the source and drain electrodes of the transistor 121 is connected to the wiring 152, and the other of the electrodes of the capacitor 124. The gate electrode of the transistor 125 is connected to the wiring 142 and the other of the source and drain electrodes of the transistor 125. The one of the source and drain electrodes of the transistor 125 is connected to the gate electrode of the transistor 121 and the one of the electrodes of the capacitor 124. The gate electrode of the transistor 123 is connected to the wiring 143. One of the source and drain electrodes of the transistor 123 is connected to the gate electrode of the transistor 121, the one of the source and drain electrodes of the transistor 125, and the one of the electrodes of the capacitor 124. The other of the source and drain electrodes of the transistor 123 is connected to the GND (ground) electrode.

The gate electrode of the transistor 131 included in the circuit 130 is connected to one of the source and drain electrodes of the transistor 135 and one of electrodes of the capacitor 134. One of the source and drain electrodes of the transistor 131 is connected to the wiring 140. The other of the source and drain electrodes of the transistor 131 is connected to the wiring 153, and the other of the electrodes of the capacitor 134. The gate electrode of the transistor 135 is connected to the wiring 143 and the other of the source and drain electrodes of the transistor 135. The one of the source and drain electrodes of the transistor 135 is connected to the gate electrode of the transistor 131 and the one of electrodes of the capacitor 134. The gate electrode of the transistor 133 is connected to the wiring 141. One of the source and drain electrodes of the transistor 133 is connected to the gate electrode of the transistor 131, the one of the source and drain electrodes of the transistor 135, and the one of the electrodes of the capacitor 134. The other of the source and drain electrodes of the transistor 133 is connected to the GND (ground) electrode.

Figure 10:
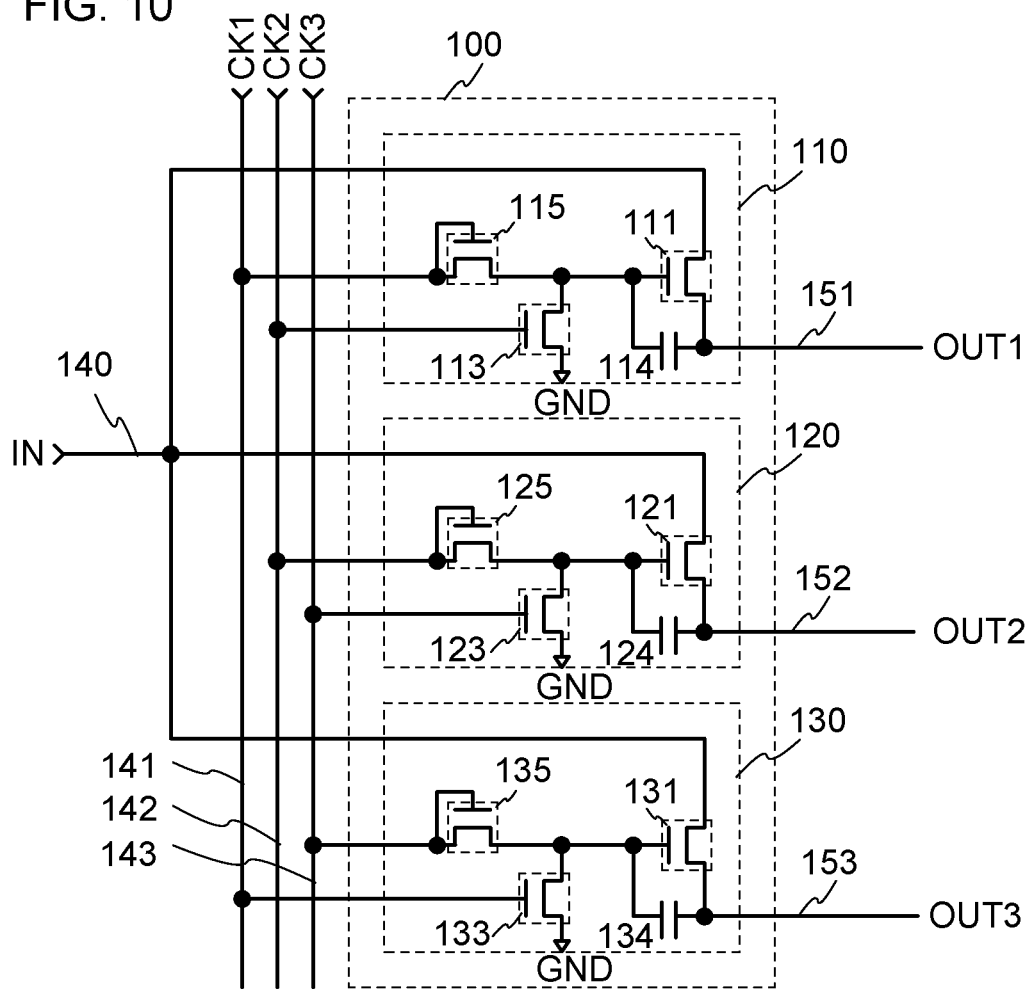
FIG. 10 is a circuit diagram for illustrating Embodiment 7.

Next, operation of the semiconductor device in FIG. 10 is described with reference to the timing chart in FIG. 6B.

The timing chart in FIG. 6B has the period T1, the period T2, and the period T3. The signal IN is an input signal of the circuit 100. The signal CK1, the signal CK2, and the signal CK3 are input signals to the circuit 110, the circuit 120, and the circuit 130, respectively. The signal OUT1, the signal OUT2, and the signal OUT3 are output signals from the circuit 110, the circuit 120, and the circuit 130, respectively. The signal OUT1, the signal OUT2, and the signal OUT3 are inputted as scan line selection signals from a scan line driver circuit to corresponding scan lines.

First, operation of the semiconductor device in FIG. 10 in the period T1 is described. In the period T1, the signal IN is in the H level, the signal CK1 is in the H level, the signal CK2 is in the L level, and the signal CK3 is in the L level. Then, the transistor 111 included in the circuit 110 is turned on; therefore, the signal OUT1 is in the H level, the signal OUT2 is in the L level, and the signal OUT3 is in the L level. At that time, the transistor 111 included in the circuit 110 is kept on.

Next, in the period T2, the signal IN1 is in the H level, the signal CK1 is in the L level, the signal CK2 is in the H level, and the signal CK3 is in the L level. Then, the transistor 121 included in the circuit 120 is turned on; therefore, the signal OUT1 is in the L level, the signal OUT2 is in the H level, and the signal OUT3 is in the L level. At that time, the transistor 113 included in the circuit 110 is turned on. Since the other of the source and drain electrodes of the transistor 113 is connected to the GND electrode, the potential of one of the source and drain electrodes of the transistor 113 goes into the L level. Therefore, the gate electrode of the transistor 111 connected to one of the source and drain electrodes of the transistor 113 goes into the L level, whereby the transistor 111 is turned off. Thus, the signal OUT1 can be kept in the L level even when the signal IN is in the H level in the period T2. Further, the transistor 121 included in the circuit 120 is kept on.

Then, in the period T3, the signal IN is in the H level, the signal CK1 is in the L level, the signal CK2 is in the L level, and the signal CK3 is in the H level. Then, the transistor 131 included in the circuit 130 is turned on; therefore, the signal OUT1 is in the L level, the signal OUT2 is in the L level, and the signal OUT3 is in the H level. At that time, the transistor 123 included in the circuit 120 is turned on. Since the other of the source and drain electrodes of the transistor 123 is connected to the GND electrode, the potential of one of the source and drain electrodes of the transistor 123 goes into the L level. Therefore, the gate electrode of the transistor 121 connected to one of the source and drain electrodes of the transistor 123 goes into the L level, whereby the transistor 121 is turned off. Thus, the signal OUT2 can be kept in the L level even when the signal IN is in the H level in the period T3. Further, the transistor 131 included in the circuit 130 is kept on.

Similarly, when the period proceeds to the next period, the transistor 131 is turned off with use of the signal CK1, so that the signal OUT3 can be kept in the L level.

In the case where a structure where the transistor 111, the transistor 121, and the transistor 131 are not turned off is used, the signal OUT1, the signal OUT2, and the signal OUT3 are in the H level during the signal IN is in the H level, which sometimes cause a defect in scan line selection.

Embodiment 8

This embodiment describes another specific example of Embodiment 4.

First, a structure of a semiconductor device of this embodiment will be described with reference to FIG. 11.

The circuit 100 includes the circuit 110, the circuit 120, and the circuit 130. The circuit 110 includes the transistor 111, the transistor 113, the transistor 115, the transistor 116, and the capacitor 114. The circuit 120 includes the transistor 121, the transistor 123, the transistor 125, the transistor 126, and the capacitor 124. The circuit 130 includes the transistor 131, the transistor 133, the transistor 135, the transistor 136, and the capacitor 134. A signal IN, a signal CK1, a signal CK2, a signal CK3, a signal OUT1, a signal OUT2, and signal OUT3 are transmitted through the wiring 140, the wiring 141, the wiring 142, the wiring 143, the wiring 151, the wiring 152, and the wiring 153, respectively.

Next, connection relation is described.

The circuit 100 is connected to the wiring 140, the wiring 141, the wiring 142, and the wiring 143. The circuit 110 is connected to the wiring 140, the wiring 141, and the wiring 151. The circuit 120 is connected to the wiring 140, the wiring 142, and the wiring 152. The circuit 130 is connected to the wiring 140, the wiring 143, and the wiring 153. That is, the wiring 140 is connected to each of the circuit 110, the circuit 120, and the circuit 130.

The gate electrode of the transistor 111 included in the circuit 110 is connected to one of the source and drain electrodes of the transistor 115 and one of the electrodes of the capacitor 114. One of the source and drain electrodes of the transistor 111 is connected to the wiring 140. The other of the source and drain electrodes of the transistor 111 is connected to the wiring 151, one of the source and drain electrodes of the transistor 116, and the other of the electrodes of the capacitor 114. The gate electrode of the transistor 115 is connected to the wiring 141 and the other of the source and drain electrodes of the transistor 115. The one of the source and drain electrodes of the transistor 115 is connected to the gate electrode of the transistor 111 and the one of the electrodes of the capacitor 114. The gate electrode of the transistor 113 is connected to the wiring 142. One of the source and drain electrodes of the transistor 113 is connected to the gate electrode of the transistor 111, the one of the source and drain electrodes of the transistor 115, and the one of the electrodes of the capacitor 114. The other of the source and drain electrodes of the transistor 113 is connected to the GND (ground) electrode. The gate electrode of the transistor 116 is connected to the wiring 143. The one of the source and drain electrodes of the transistor 116 is connected to the wiring 151, the other of the source and drain electrodes of the transistor 111, and the other of the electrodes of the capacitor 114. The other of the source and drain electrodes of the transistor 116 is connected to the GND (ground) electrode.

The gate electrode of the transistor 121 included in the circuit 120 is connected to one of the source and drain electrodes of the transistor 125 and one of electrodes of the capacitor 124. One of the source and drain electrodes of the transistor 121 is connected to the wiring 140. The other of the source and drain electrodes of the transistor 121 is connected to the wiring 152, one of the source and drain electrodes of the transistor 126, and the other of the electrodes of the capacitor 124. The gate electrode of the transistor 125 is connected to the wiring 142 and the other of the source and drain electrodes of the transistor 125. The one of the source and drain electrodes of the transistor 125 is connected to the gate electrode of the transistor 121 and the one of the electrodes of the capacitor 124. The gate electrode of the transistor 123 is connected to the wiring 143. One of the source and drain electrodes of the transistor 123 is connected to the gate electrode of the transistor 121, the one of the source and drain electrodes of the transistor 125, and the one of the electrodes of the capacitor 124. The other of the source and drain electrodes of the transistor 123 is connected to the GND (ground) electrode. The gate electrode of the transistor 126 is connected to the wiring 141. The one of the source and drain electrodes of the transistor 126 is connected to the wiring 152, the other of the source and drain electrodes of the transistor 121, and the other of the electrodes of the capacitor 124. The other of the source and drain electrodes of the transistor 126 is connected to the GND (ground) electrode.

The gate electrode of the transistor 131 included in the circuit 130 is connected to one of the source and drain electrodes of the transistor 135 and one of electrodes of the capacitor 134. One of the source and drain electrodes of the transistor 131 is connected to the wiring 140. The other of the source and drain electrodes of the transistor 131 is connected to the wiring 153, one of the source and drain electrodes of the transistor 136, and the other of the electrodes of the capacitor 134. The gate electrode of the transistor 135 is connected to the wiring 143 and the other of the source and drain electrodes of the transistor 135. The one of the source and drain electrodes of the transistor 135 is connected to the gate electrode of the transistor 131 and the one of the electrodes of the capacitor 134. The gate electrode of the transistor 133 is connected to the wiring 141. One of the source and drain electrodes of the transistor 133 is connected to the gate electrode of the transistor 131, the one of the source and drain electrodes of the transistor 135, and the one of the electrodes of the capacitor 134. The other of the source and drain electrodes of the transistor 133 is connected to the GND (ground) electrode. The gate electrode of the transistor 136 is connected to the wiring 142. The one of the source and drain electrodes of the transistor 136 is connected to the wiring 153, the other of the source and drain electrodes of the transistor 131, and the other of the electrodes of the capacitor 134. The other of the source and drain electrodes of the transistor 136 is connected to the GND (ground) electrode.

Figure 11:
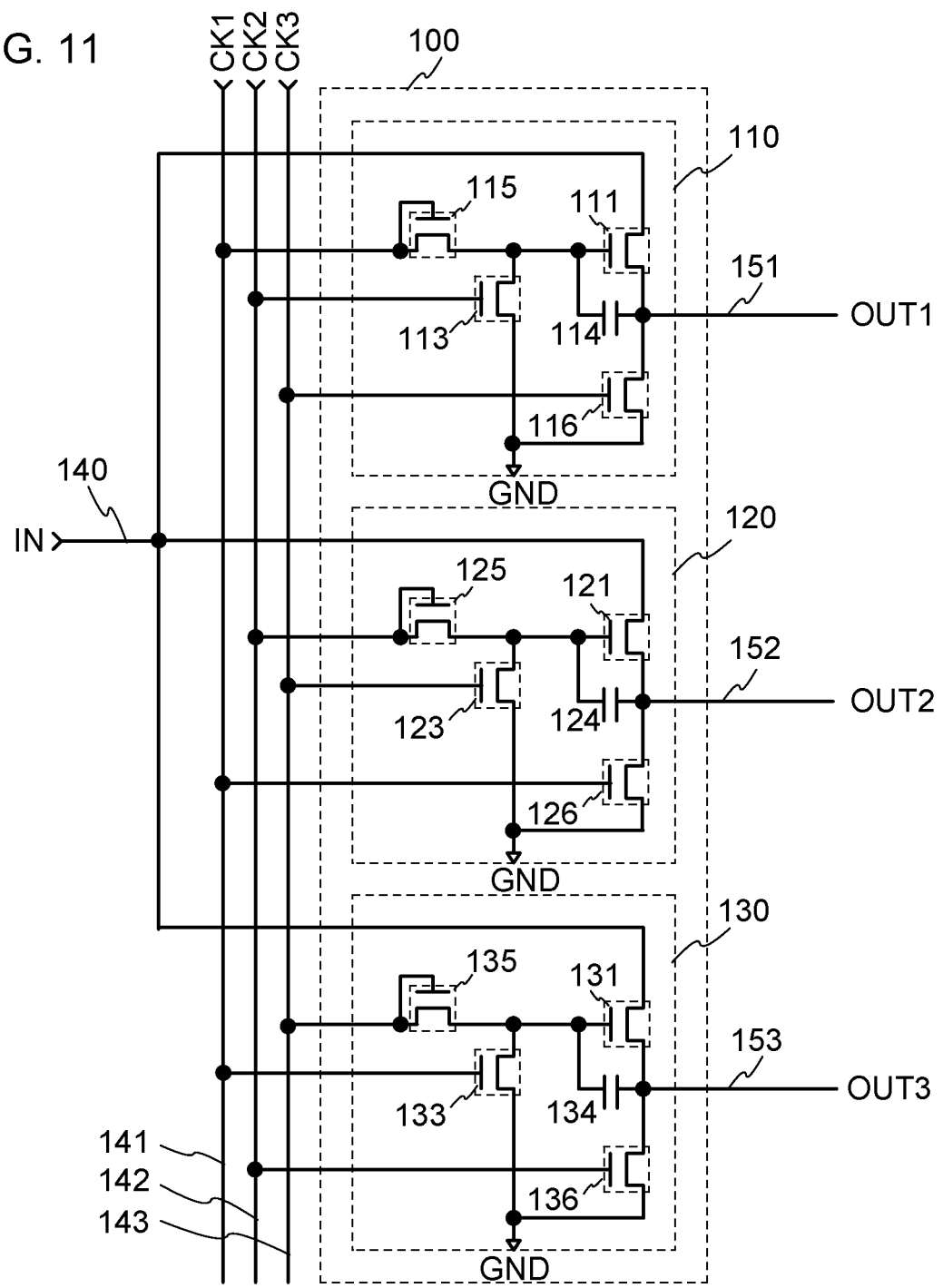
FIG. 11 is a circuit diagram for illustrating Embodiment 8.

Next, operation of the semiconductor device in FIG. 11 is described with reference to the timing chart in FIG. 6B.

The timing chart in FIG. 6B has the period T1, the period T2, and the period T3. The signal IN is an input signal of the circuit 100. The signal CK1, the signal CK2, and the signal CK3 are input signals to the circuit 110, the circuit 120, and the circuit 130, respectively. The signal OUT1, the signal OUT2, and the signal OUT3 are output signals from the circuit 110, the circuit 120, and the circuit 130, respectively.

First, operation of the semiconductor device in FIG. 11 in the period T1 is described. In the period T1, the signal IN is in the H level, the signal CK1 is in the H level, the signal CK2 is in the L level, and the signal CK3 is in the L level. Then, the transistor 111 included in the circuit 110 is turned on and the signal OUT1 goes into the H level, the signal OUT2 goes into the L level, and the signal OUT3 goes into the L level. At that time, the transistor 126 included in the circuit 120 is turned on and the signal OUT2 goes into the L level.

Next, in the period T2, the signal IN1 is in the H level, the signal CK1 is in the L level, the signal CK2 is in the H level, and the signal CK3 is in the L level. Then, the transistor 121 included in the circuit 120 is turned on and the signal OUT1 is in the L level, the signal OUT2 is in the H level, and the signal OUT3 is in the L level. At that time, the transistor 113 included in the circuit 110 is turned on. Since the other of the source and drain electrodes of the transistor 113 is connected to the GND electrode, the potential of one of the source and drain electrodes of the transistor 113 goes into the L level. Therefore, the gate electrode of the transistor 111 connected to one of the source and drain electrodes of the transistor 113 goes into the L level, whereby the transistor 111 is turned off. Thus, the signal OUT1 can be kept in the L level even when the signal IN is in the H level in the period T2. Further, the transistor 136 included in the circuit 130 is turned on, so that the signal OUT3 goes into L level.

Then, in the period T3, the signal IN is in the H level, the signal CK1 is in the L level, the signal CK2 is in the L level, and the signal CK3 is in the H level. Then, the transistor 131 included in the circuit 130 is turned on and the signal OUT1 is in the L level, the signal OUT2 is in the L level, and the signal OUT3 is in the H level. At that time, the transistor 123 included in the circuit 120 is turned on. Since the other of the source and drain electrodes of the transistor 123 is connected to the GND electrode, the potential of one of the source and drain electrodes of the transistor 123 goes into the L level. Therefore, the gate electrode of the transistor 121 connected to one of the source and drain electrodes of the transistor 123 goes into the L level, whereby the transistor 121 is turned off. Thus, the signal OUT2 can be kept in the L level even when the signal IN is in the H level in the period T3. Further, the transistor 116 included in the circuit 110 is turned on, so that the signal OUT1 goes into the L level.

Similarly, when the period proceeds to the next period, the transistor 131 is turned off with use of the signal CK1, so that the signal OUT3 can be kept in the L level.

As thus described, the signal OUT1, the signal OUT2, and the signal OUT3 go into the L level by turning on the transistor 116 included in the circuit 110, the transistor 126 included in the circuit 120, and the transistor 136 included in the circuit 130; so that a defect in scan line selection can be suppressed.

Embodiment 9

This embodiment describes a driver circuit to which a structure related to an embodiment of this invention is adopted.

Figure 12:
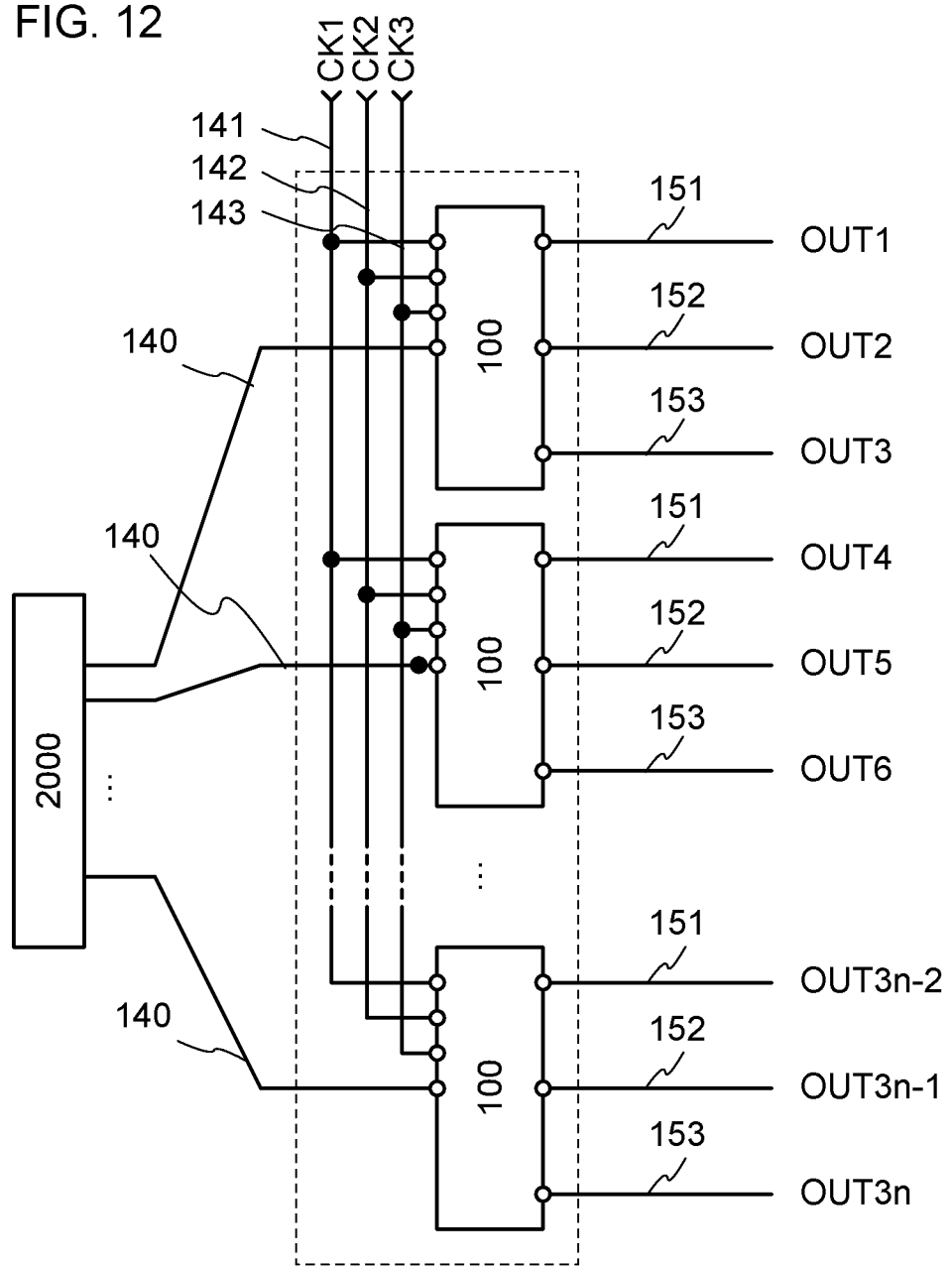
FIG. 12 is a circuit diagram for illustrating Embodiment 9.

First, a structure of a semiconductor device in this embodiment is described with the circuit 100 in FIG. 6A given for example and with reference to FIG. 12.

A shift register 2000 outputs a plurality of signals sequentially. The circuits 100 in a first stage to an n-th stage is a circuit related to an embodiment of this invention and, here, each output three signals which can be obtained from one signal here. Further, output signals from the shift register 2000 is transmitted through the wirings 140 to the circuits 100 in the first stage to the n-th stage. Signals OUT1 to OUT3 are transmitted through n groups of the respective wirings 151 to 153.

Next, a connection relation will be described.

The shift register 2000 is connected to the wiring 140. The circuit 100 is connected to the wiring 140, the wiring 151, the wiring 152, and the wiring 153.

Next, operation of the semiconductor device in FIG. 12 is described with reference to a timing chart in FIG. 13.

Figure 13:
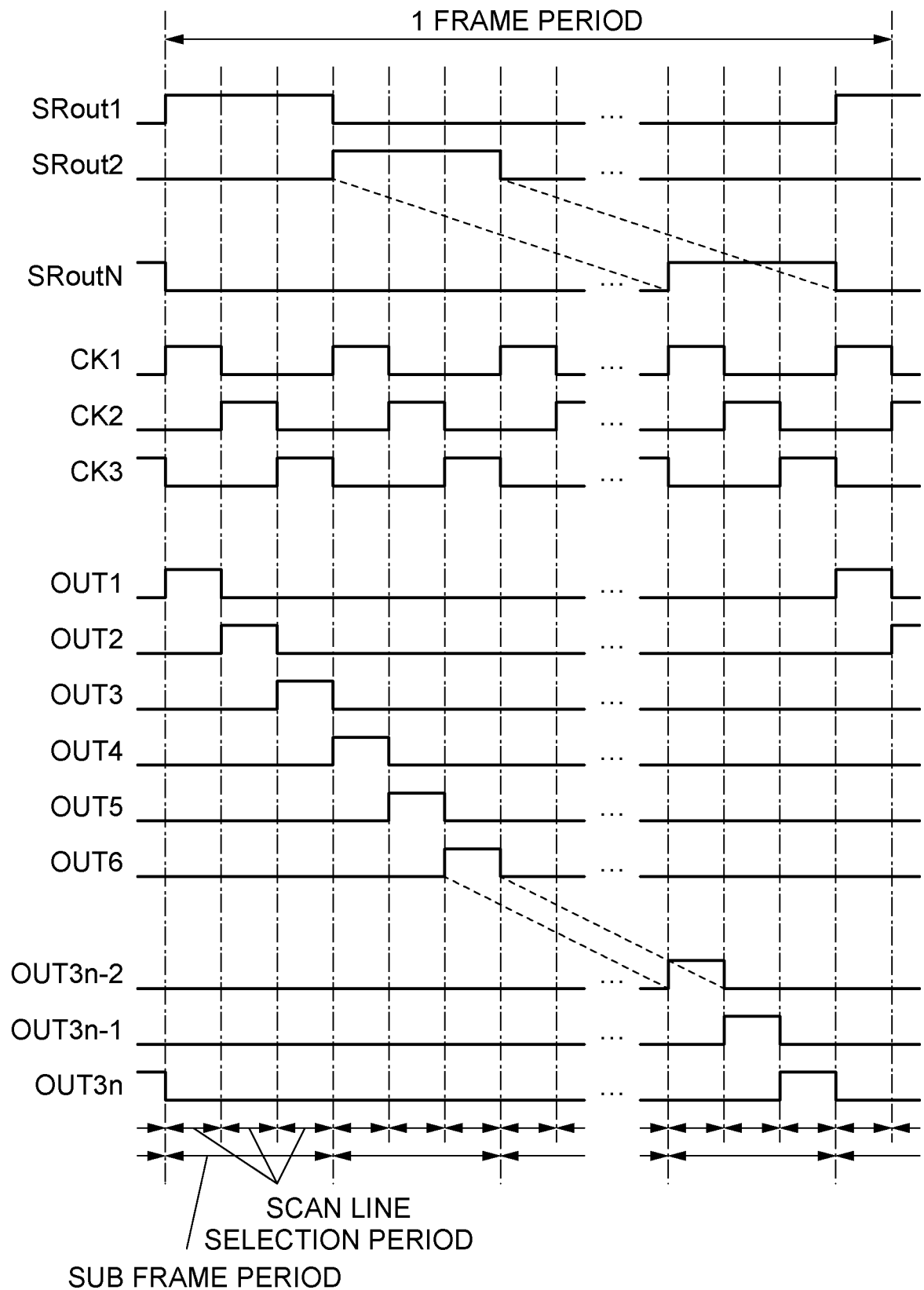
FIG. 13 is a timing chart illustrating Embodiment 9.

The timing chart in FIG. 13 shows one frame period of the driver circuit. A signal SRout1 is an input signal of the circuit 100 in the first stage. A signal SRout2 is an input signal of the circuit 100 in the second stage. A signal SRoutN is an input signal of the circuit 100 in the n-th stage. A period with a pulse of these signals SRout1 to SRoutN represents a sub-frame period. A signal CK1, a signal CK2, and a signal CK3 are input signals of each of the circuits 100 in the first stage to the n-th stage. A period with pulses of these signals CK1 to CK3 represents a scan line selection period. Signals OUT1 to OUT3$n$ are output signals of each of the circuit 100 in the first stage to the n-th stage.

A signal OUT goes into the H level only when the signal SRout and the signal CK which are sequentially inputted both go into the H level. That is, when the signals SRout1 to SRoutN are inputted in one frame period, the signals OUT1 to OUT3$n$ are outputted. Thus, scan lines 1 to 3$n$ can be controlled in one frame period. Further, the signal SRout and the signal CK are inputted and the signal OUT is outputted also in a second frame and its subsequent frames. In general, moving images are displayed by being processed in 60 frames per second.

Note that in this embodiment, a structure of a circuit which is provided on the output side of the shift register in a scan line driver circuit is described by giving the circuit 100 in FIG. 6A for example. However, the circuit 100 illustrated in FIG. 7A, FIG. 8, FIG. 9, FIG. 10 and FIG. 11 can be used for the semiconductor device related to an embodiment of this invention.

Embodiment 10

This embodiment describes an example of a cross-sectional structure of a display device.

Figure 14A:
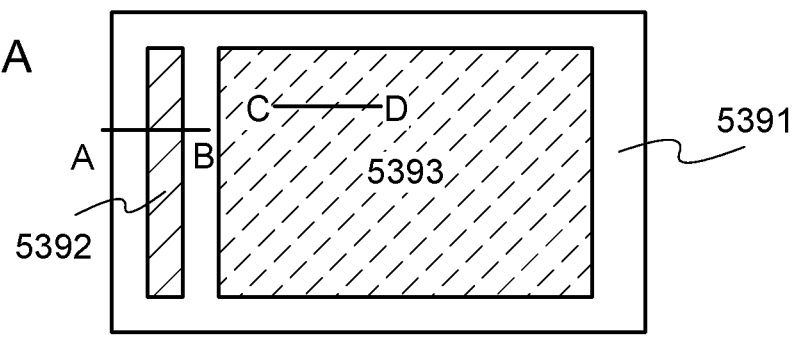
FIG. 14A is a top view of a liquid crystal display device and FIGS. 14B and 14C are cross-sectional views of the liquid crystal display device.

FIG. 14A illustrates an example of a top view of the display device. A driver circuit portion 5392 and a pixel portion 5393 are formed over a substrate 5391. An example of the driver circuit portion 5392 is a scan line driver circuit, a signal line driver circuit, or the like.

Figure 14B:
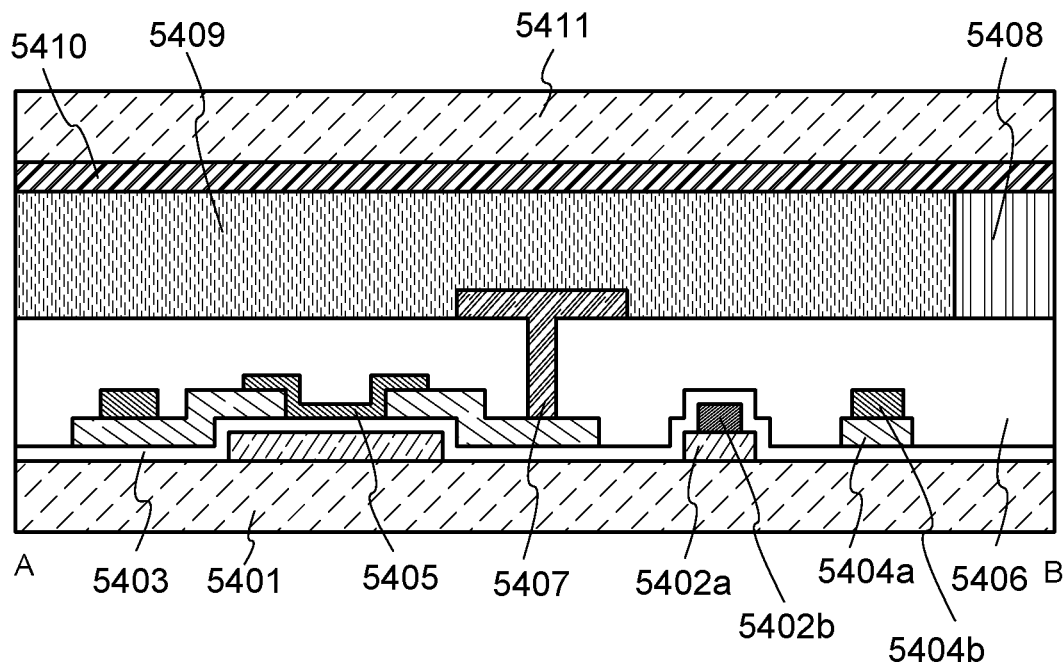

FIG. 14B illustrates an example of a cross-sectional view of the driver circuit portion 5392 (a cross section taken along line A-B in FIG. 14A). For example, FIG. 14B illustrates a substrate 5401, a conductive layer 5402$a$, a conductive layer 5402$b$, an insulating layer 5403, a conductive layer 5404$a$, a conductive layer 5404$b$, a semiconductor layer 5405, an insulating layer 5406, a conductive layer 5407, a liquid crystal layer 5408, an insulating layer 5409, a conduction layer 5410, and a substrate 5411. For example, the conductive layer 5402$a$ is formed over the substrate 5401. For example, the conductive layer 5402$b$ is formed over the conductive layer 5402$a$. For example, the insulating layer 5403 is formed over the substrate 5401, the conductive layer 5402$a$, and the conductive layer 5402$b$. For example, the conductive layer 5404$a$ is formed over the insulating layer 5403. For example, the conductive layer 5404$b$ is formed over the conductive layer 5404$a$. For example, the semiconductor layer 5405 is formed over the insulating layer 54013. For example, the insulating layer 5406 is formed over the insulating layer 5403, the conductive layer 5404$a$, the conductive layer 5404$b$, and the semiconductor layer 5405. For example, the conductive layer 5407 is formed in an opening portion of the insulating layer 5406 and over the insulating layer 5406. For example, the liquid crystal layer 5408 is formed over the insulating layer 5406. For example, the insulating layer 5409 is formed over the insulating layer 5406 and the conductive layer 5407. For example, the conductive layer 5410 is formed over the liquid crystal layer 5408 and the insulating layer 5409. For example, the substrate 5411 is formed over the insulating layer 5410.

Figure 14C:
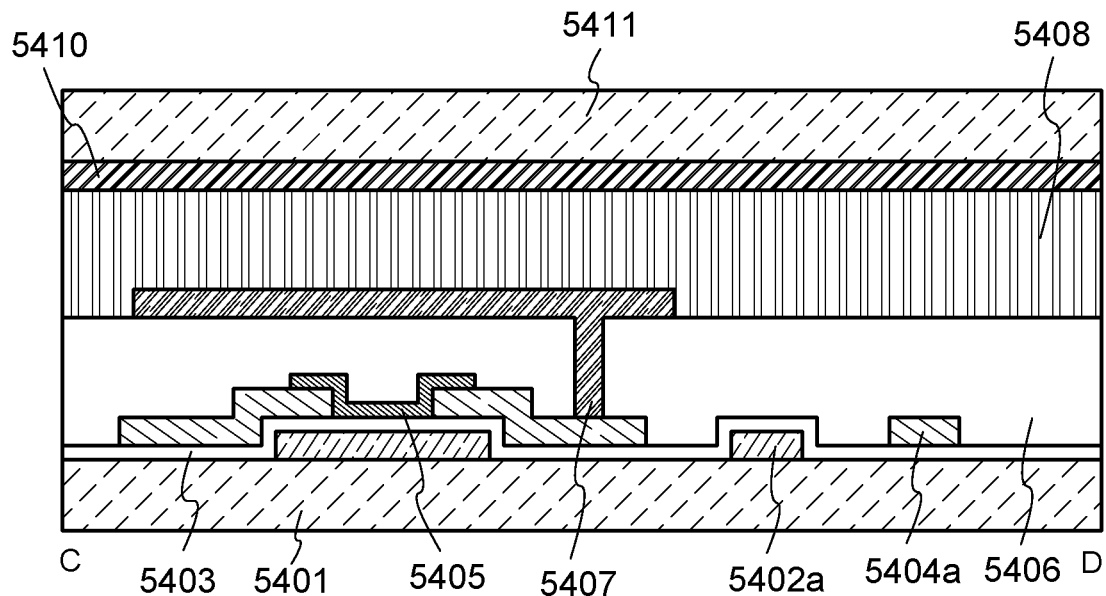

FIG. 14C illustrates an example of a cross-sectional view of the pixel portion 5393 (a cross section taken along line C-D in FIG. 14A). For example, FIG. 14C illustrates the substrate 5401, the conductive layer 5402$a$, the insulating layer 5403, the conductive layer 5404$a$, the semiconductor layer 5405, the insulating layer 5406, the conductive layer 5407, the liquid crystal layer 5408, the conduction layer 5410, and the substrate 5411. For example, the conductive layer 5402$a$ is formed over the substrate 5401. For example, the insulating layer 5403 is formed over the substrate 5401 and the conductive layer 5402$a$. For example, the conductive layer 5404$a$ is formed over the insulating layer 5403. For example, the semiconductor layer 5405 is formed over the insulating layer 5403. For example, the insulating layer 5406 is formed over the insulating layer 5403, the conductive layer 5404$a$, and the semiconductor layer 5405. For example, the conductive layer 5407 is formed in an opening portion of the insulating layer 5406 and over the insulating layer 5406. For example, the liquid crystal layer 5408 is formed over the insulating layer 5406 and the conduction layer 5407. For example, the conductive layer 5410 is formed over the liquid crystal layer 5408. For example, the substrate 5411 is formed over the insulating layer 5410.

For example, the conductive layer 5402$a$ and the conductive layer 5402$b$ can function as gate electrodes or gate wirings. For example, the insulating layer 5403 can function as a gate insulating layer. For example, the conductive layer 5404$a$ and the conductive layer 5404$b$ can function as wirings, electrodes of a transistor, electrodes of a capacitor, or the like. For example, the insulating layer 5406 can function as an interlayer film or a planarizing film. For example, the conductive layer 5407 can function as a wiring, a pixel electrode, a light-transmitting electrode, or a reflective electrode. For example, the insulating layer 5409 can function as a sealing material. For example, the conductive layer 5410 can function as a counter electrode, a common electrode, or a reflective electrode.

Here, for example, the conductive layer 5402a and the conductive layer 5404a can be formed using a light-transmitting material. For example, the conductive layer 5402b and the conductive layer 5404b can be formed using a material having higher conductivity material than a material used for the conductive layer 5402a and the conductive layer 5404a. For example, the conductive layer 5402b and the conductive layer 5404b can be formed using a light-blocking material. In this manner, the resistance of wirings can be reduced in the driver circuit portion 5392. Therefore, power consumption of the driver circuit can be reduced, driving frequency can be high, or a driving voltage can be low. Meanwhile, wirings, electrodes of a transistor, electrodes of a storage capacitor, and/or the like in the driver circuit portion 5392 can transmit light. That is, a light-transmitting region (an opening portion of a pixel) can be larger. Therefore, power consumption can be reduced or resolution of the pixel portion can be high. However, an example of this embodiment is not limited to this. For example, the conductive layer 5402a and the conductive layer 5404a can be formed using a light-blocking material. Alternatively, in the pixel portion 5393, a gate wiring can have a layered structure of the conductive layer 5402a and the conductive layer 5402b like a wiring of the driver circuit portion 5392. Moreover, for example, a source wiring can have a layered structure of the conductive layer 5404a and the conductive layer 5404b. In this manner, delay or distortion of a signal (e.g., a video signal or a scan line selection signal) inputted to a pixel can be small. In another example, one or both of the conductive layer 5402a or 5402b and the conductive layer 5404a or 5404b can be omitted. In another example, in one or both of a transistor portion of the driver circuit portion 5392 and a transistor portion of the pixel portion 5393, a gate electrode can have a layered structure of the conductive layer 5402a and the conductive layer 5402b. In another example, the conductive layer 5402b can be formed under the conductive layer 5402a. In another example, the conductive layer 5404b can be formed under the conductive layer 5404a. In another example, the semiconductor layer 5405 can be formed over the insulating layer 5403 and the conductive layer 5402a can be formed over the insulating layer 5403 and the semiconductor layer 5405.

Note that, for example, an oxide semiconductor can be used for a semiconductor layer. For example, an oxide semiconductor often has a light-transmitting property. When an oxide semiconductor is combined with a display device in this embodiment, the aperture ratio of a pixel can be improved. However, an example of this embodiment is not limited to this. For example, for the semiconductor layer, a single crystal semiconductor, a polycrystalline semiconductor, a microcrystalline (microcrystal or nanocrystal) semiconductor, an amorphous semiconductor, various non-single-crystal semiconductors, or the like can be used.

Figure 15A:
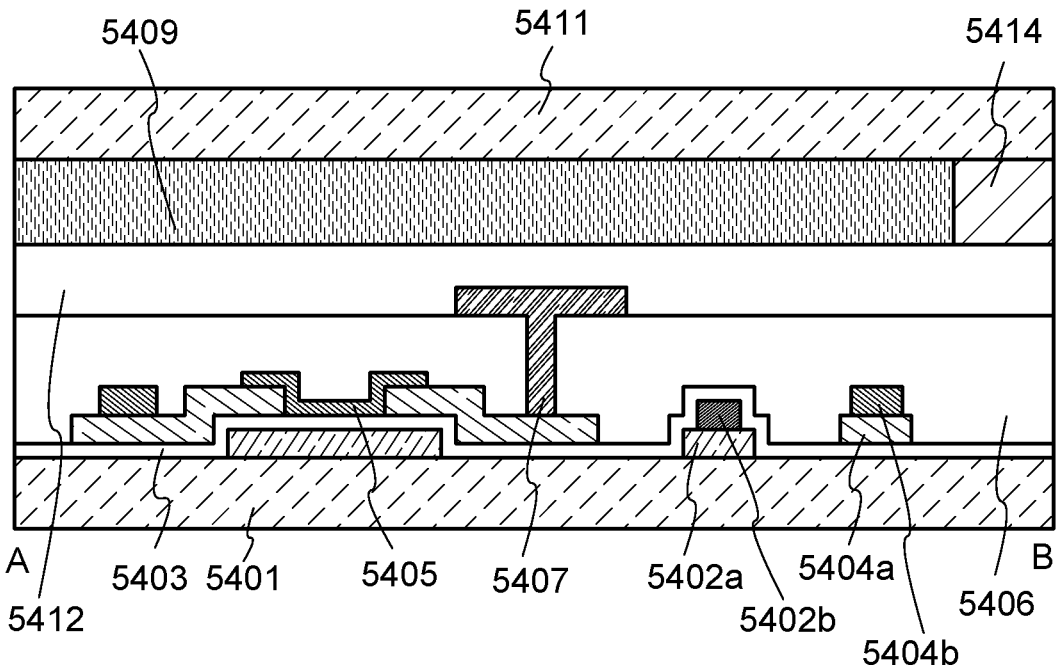
FIGS. 15A and 15B are cross-sectional views of a light-emitting element display device.
Figure 15B:
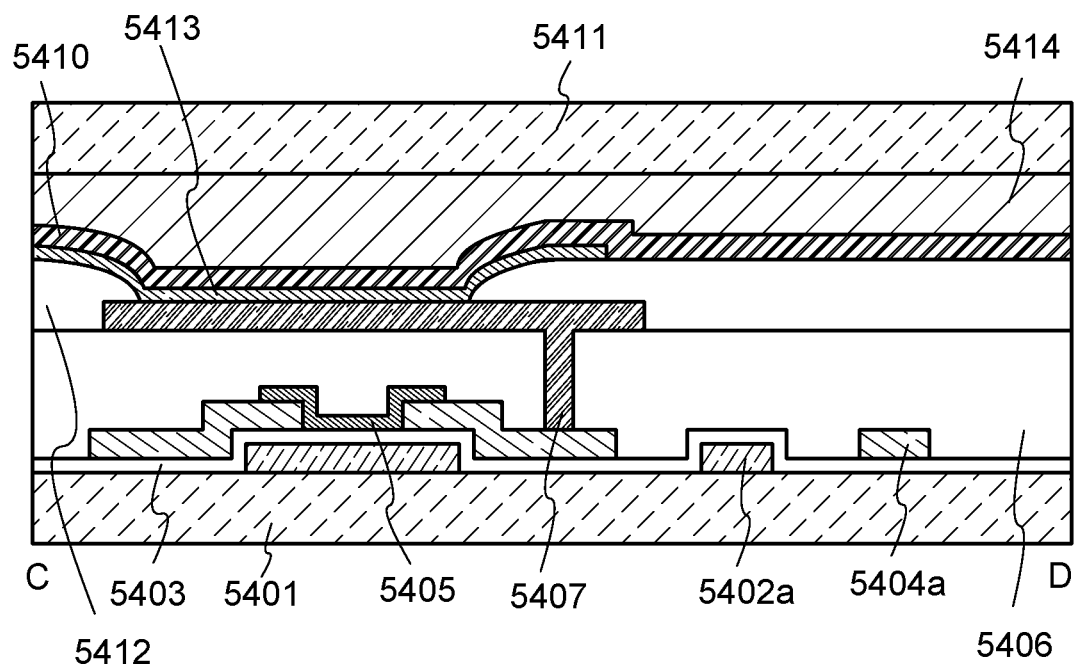

Note that, for example, a light-emitting element (e.g., an EL element) can be used as a display element. FIG. 15A illustrates an example of a cross-sectional view of the driver circuit portion 5392 in a display device in which a light-emitting element is used as a display element for example. FIG. 15A is different from FIG. 14B in that an insulating layer 5412 is formed over the insulating layer 5406 and the conduction layer 5407, the insulating layer 5409 and a filler 5414 are formed over the insulating layer 5412, and the like. FIG. 15B illustrates an example of a cross-sectional view of the pixel portion 5393 in a display device in which a light-emitting element is used as a display element. FIG. 15B is different from FIG. 14C in that the insulating layer 5412 is formed over the insulating layer 5406 and the conduction layer 5407, a light-emitting layer 5413 is formed over an opening portion of the insulating layer 5412, the conductive layer 5410 is formed over the insulating layer 5412 and the light-emitting layer 5413, the filler 5414 is formed over the conductive layer 5410, and the like. For example, the insulating layer 5412 can function as a partition wall. However, an example of this embodiment is not limited to this.

Figure 16A:
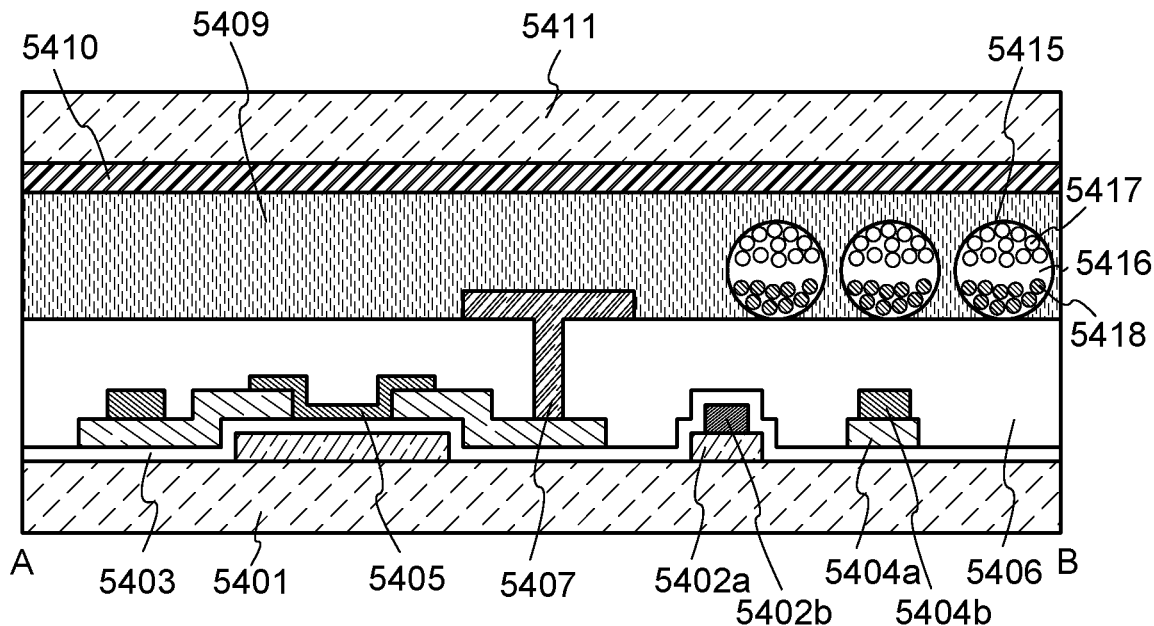
FIGS. 16A and 16B are cross-sectional views of an electronic paper.
Figure 16B:
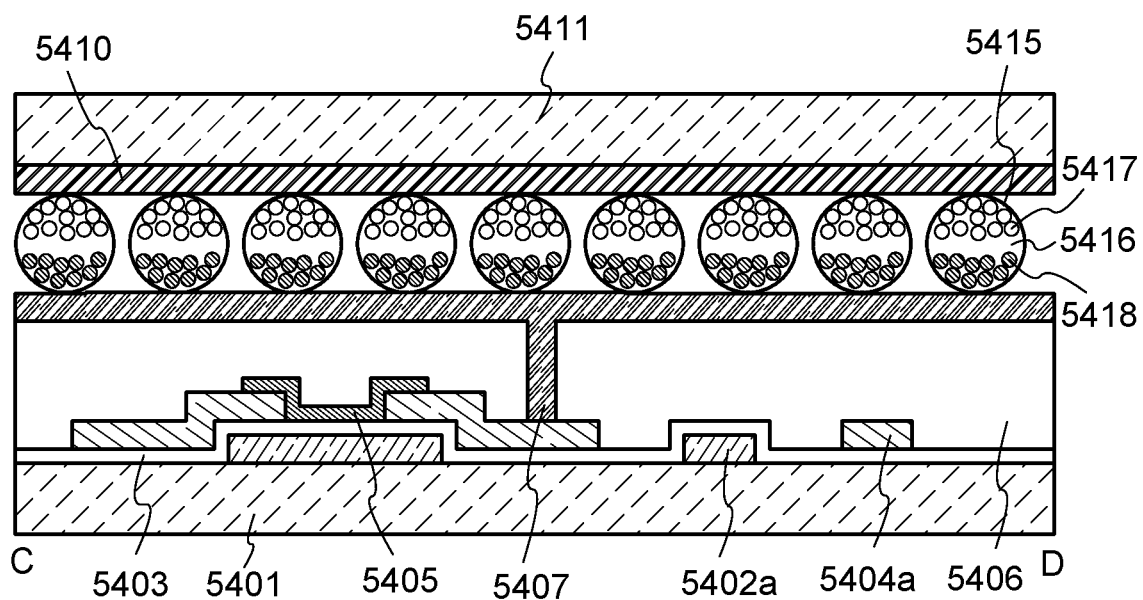

Note that, for example, an element (e.g., an electrophoresis element, a particle movement element, and electronic liquid powder) in which particle moves to perform display can be used as a display element. In such a manner, an electronic paper can be manufactured. FIG. 16A illustrates an example of a cross-sectional view of the driver circuit portion 5392 in a display device in which an electrophoresis element is used as a display element. In a part of the driver circuit portion 5392, an electrophoresis element is provided between the insulating layer 5406 and the conductive layer 5410. In addition, the insulating layer 5409 is formed so as to cover the electrophoresis element. FIG. 16B illustrates an example of a cross-sectional view of the pixel portion 5393 in a display device in which an electrophoresis element is used as a display element. The electrophoresis element is provided between the conductive layer 5407 and the conductive layer 5410. Note that, for example, the electrophoresis element includes a capsule 5415, liquid 5416, particles 5417, and particles 5418. The liquid 5416, the particles 5417, and the particles 5418 are in the capsule 5415 for example. For example, the liquid 5416 often has an insulating property and a light-transmitting property. One of the particles 5417 and the particles 5418 is positively charged and the other thereof is negatively charged in many cases. One of the particles 5417 and the particles 5418 is white and the other thereof is black in many cases. However, an example of this embodiment is not limited to this. For example, colors of the particles 5417 and the particles 5418 are not limited to white or black, and different colors can be used (e.g., red, green, blue, magenta, yellow, and cyan).

In the display device in this embodiment, an aperture rate of the pixel can be improved while performance of the driver circuit is improved. Further, when the structures described in Embodiments 3 to 9 are used for the driver circuit, power consumption can be reduced, driving frequency is improved, and resolution of the pixel portion can be high.

Embodiment 11

This embodiment describes examples of electronic devices.

FIGS. 17A to 17H and FIGS. 18A to 18D illustrate electronic devices. These electronic devices can include a housing 5000, a display portion 5001, a speaker 5003, an LED lamp 5004, operation keys 5005 (including a power switch or operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 17A:
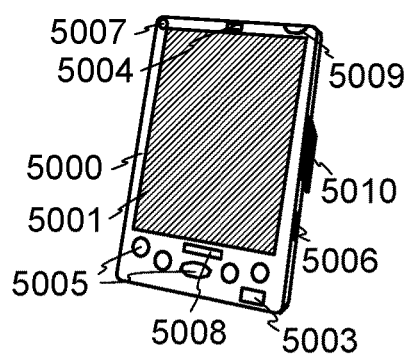
FIGS. 17A to 17H are diagrams each illustrating an example of an actual product.
Figure 17B:
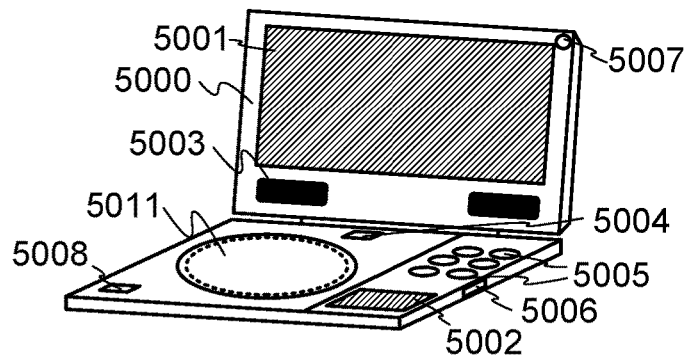
Figure 17C:
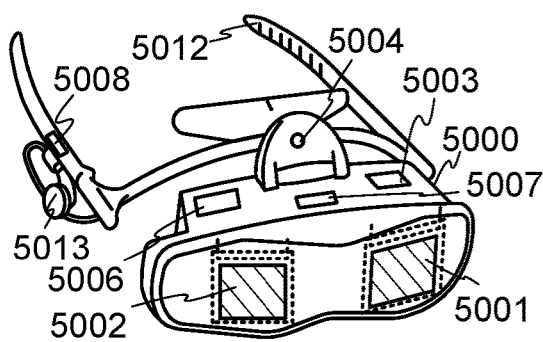
Figure 17D:
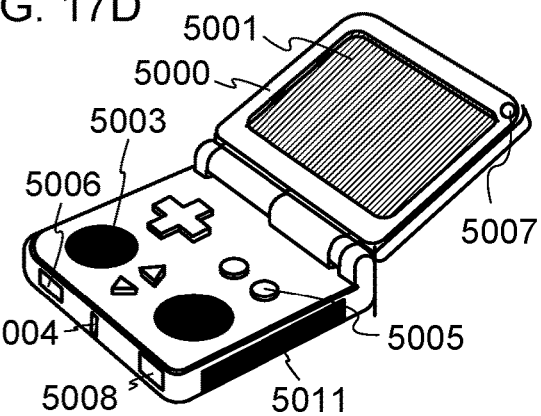
Figure 17E:
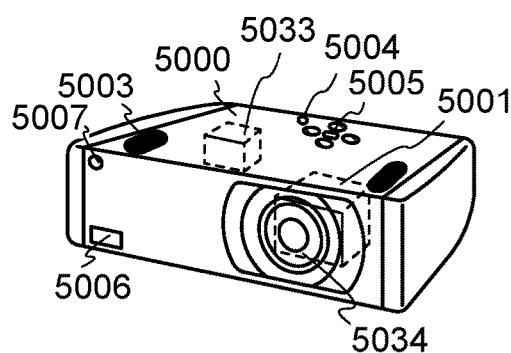
Figure 17F:
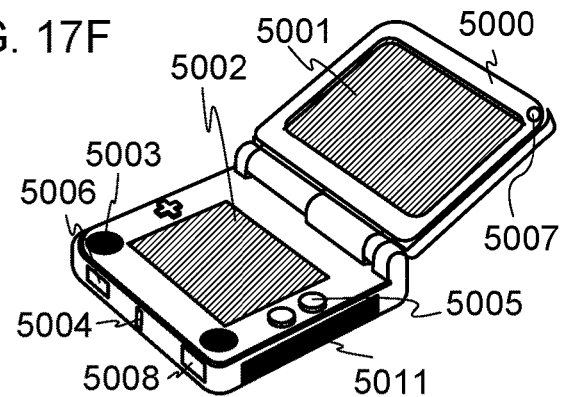
Figure 17G:
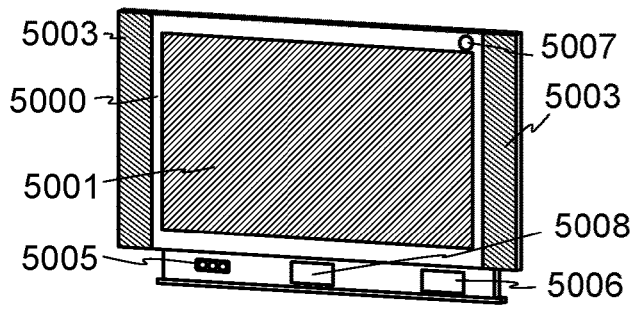
Figure 17H:
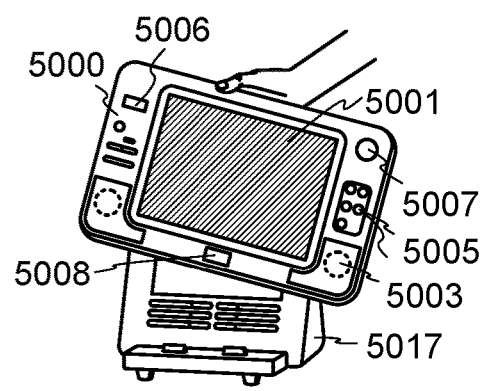
Figure 18A:
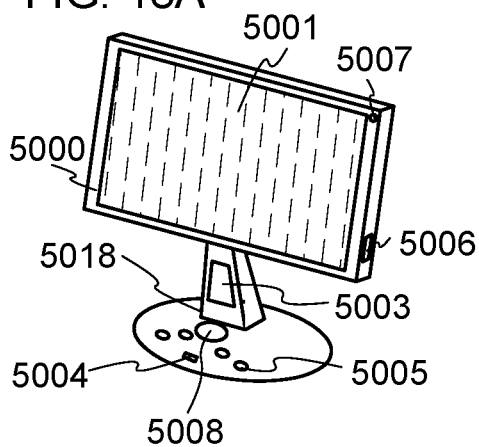
FIGS. 18A to 18H are diagrams each illustrating an example of an actual product.
Figure 18B:
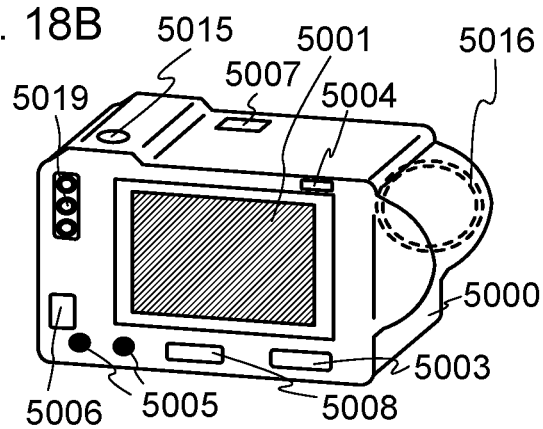
Figure 18C:
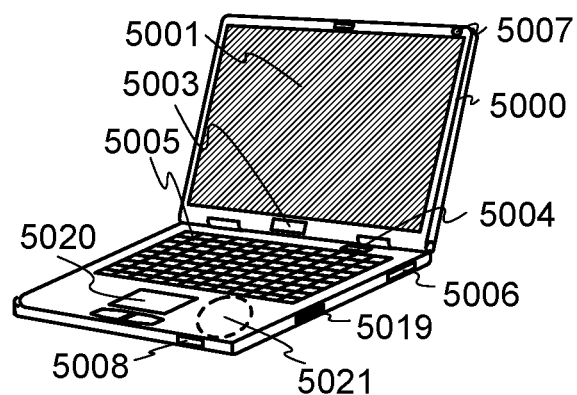
Figure 18D:
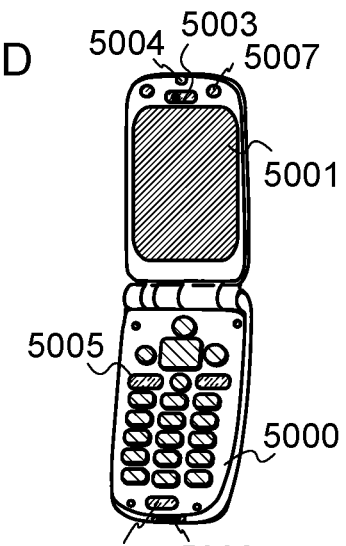

FIG. 17A illustrates a mobile computer which can include a switch 5009, an infrared port 5010, and the like in addition to the above objects. FIG. 17B illustrates a portable image reproducing device (e.g., a DVD reproducing device) provided with a memory medium, which can include a second display portion 5002, a memory medium reading portion 5011, and the like in addition to the above objects. FIG. 17C illustrates a goggle-type display which can include the second display portion 5002, a supporting portion 5012, an earphone 5013, and the like in addition to the above objects. FIG. 17D illustrates a portable game machine which can include the memory medium reading portion 5011 and the like in addition to the above objects. FIG. 17E illustrates a projector which can include a light source 5033, a projection lens 5034, and the like in addition to the above objects. FIG. 17F illustrates a portable game machine which can include the second display portion 5002, the memory medium reading portion 5011, and the like in addition to the above objects. FIG. 17G illustrates a television receiver which can include a tuner, an image processing portion, and the like in addition to the above objects. FIG. 17H illustrates a portable television receiver which can include a charger 5017 which can transmit and receive signals and the like in addition to the above objects. FIG. 18A illustrates a display which can include a supporting board 5018 and the like in addition to the above objects. FIG. 18B illustrates a camera which can include an external connecting port 5019, a shutter button 5015, an image receiver portion 5016, and the like in addition to the above objects. FIG. 18C illustrates a computer which can include a pointing device 5020, the external connecting port 5019, a reader/writer 5021, and the like in addition to the above objects. FIG. 18D illustrates a mobile phone which may include an antenna 5014, a tuner of 1 seg (one-segment partial reception service for mobile phones and mobile terminals), and the like in addition to the above objects.

The electronic devices shown in FIGS. 17A to 17H and FIGS. 18A to 18D can have a variety of functions. For example, a function of displaying a variety of information (a still image, a moving image, a text image, and the like) on a display portion, a touch panel function, a function of displaying a calendar, date, time, and the like, a function for controlling a process with a variety of software (programs), a wireless communication function, a function of being connected to a variety of computer networks with a wireless communication function, a function of transmitting and receiving a variety of data with a wireless communication function, a function of reading program or data stored in a memory medium and displaying the program or data on a display portion, and the like can be given. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiver portion can have a function of shooting a still image, a function of shooting a moving image, a function of automatically or manually correcting a shot image, a function of storing a shot image in a memory medium (an external memory medium or a memory medium incorporated in the camera), a function of displaying a shot image on the display portion, or the like. Note that functions which the electronic devices can include illustrated in FIGS. 17A to 17H and FIGS. 18A to 18D are not limited thereto, and the electronic devices can have a variety of functions.

The electronic devices described in this embodiment each include the display portion for displaying some sort of information. By a combination of the electronic device in this embodiment and the semiconductor device, shift register, or display device in Embodiments 1 to 4, improvement in reliability, improvement in yield, reduction in cost, increase in the size of the display portion, increase in the definition of the display portion, or the like can be achieved.

Next, applications of a semiconductor device will be described.

Figure 18E:
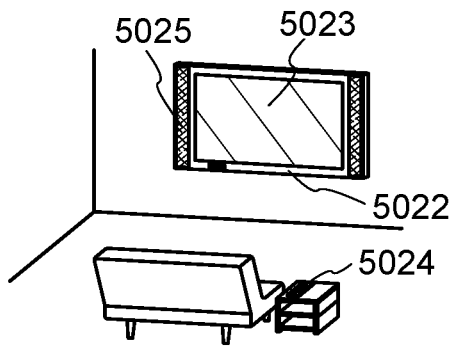

FIG. 18E illustrates an example in which a semiconductor device is provided so as to be integrated with a building. FIG. 18E illustrates a housing 5022, a display portion 5023, a remote controller device 5024 which is operation portion, a speaker 5025, and the like. The semiconductor device is incorporated in the building as a wall-hanging type, so that the semiconductor device can be provided without requiring a wide space.

Figure 18F:
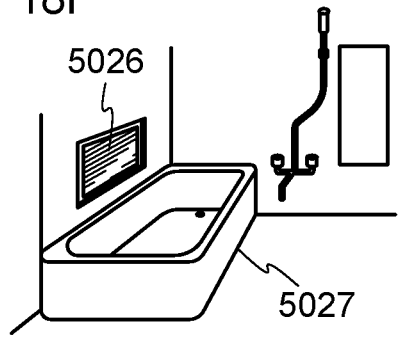

FIG. 18F illustrates another example in which a semiconductor device is provided so as to be integrated within a building. The display panel 5026 is integrated with a prefabricated bath 5027, so that a person who takes a bath can watch the display panel 5026.

Note that although this embodiment gives the wall and the prefabricated bath as examples of the building, this embodiment is not limited to them and the semiconductor device can be provided in a variety of buildings.

Next, an example in which the semiconductor device is provided so as to be integrated with a moving body will be described.

Figure 18G:
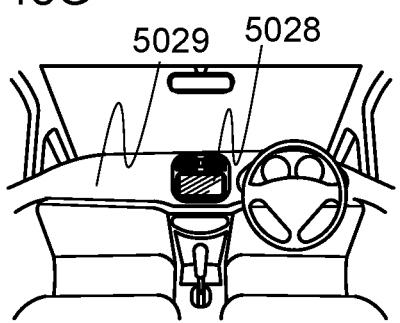

FIG. 18G illustrates an example in which the semiconductor device is provided in a vehicle. A display panel 5028 is provided in a body 5029 of the vehicle and can display information inputted from the operation of the body or the outside of the body on demand. Note that a navigation function may be provided.

Figure 18H:
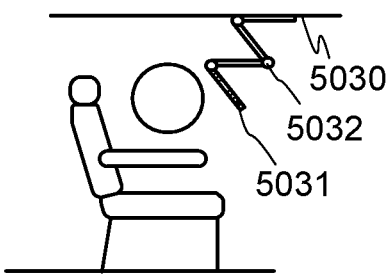

FIG. 18H illustrates an example in which the semiconductor device is provided so as to be integrated with a passenger airplane. FIG. 18H illustrates a usage pattern when a display panel 5031 is provided on a ceiling 5030 above a seat in the passenger airplane. The display panel 5031 is integrated with the ceiling 5030 through a hinge portion 5032, and a passenger can watch the display panel 5031 by extending and contracting the hinge portion 5032. The display panel 5031 has a function of displaying information when it is operated by the passenger.

Note that although this embodiment gives the body of the vehicle and the body of the plane as examples of the moving body, this embodiment is not limited to these examples. The display device can be provided for a variety of moving bodies such as a two-wheel motor vehicle, a four-wheel vehicle (including a car, bus, and the like), a train (including a monorail, a railway, and the like), and a ship.

This application is based on Japanese Patent Application serial No. 2009-172949 filed with Japan Patent Office on Jul. 24, 2009, the entire contents of which are hereby incorporated by reference.

The invention claimed is:

1. A display device comprising:
a shift register;
a first transistor;
a second transistor;
a third transistor; and
a fourth transistor,
wherein an output terminal of the shift register is electrically connected to one of a source and a drain of the first transistor,
wherein the other of the source and the drain of the first transistor is electrically connected to a gate of the second transistor,
wherein one of a source and a drain of the second transistor is electrically connected to a first wiring,
wherein the other of the source and a drain of the second transistor is electrically connected to a second wiring,
wherein the output terminal of the shift register is electrically connected to one of a source and a drain of the third transistor,
wherein the other of the source and the drain of the third transistor is electrically connected to a gate of the fourth transistor,
wherein one of a source and a drain of the fourth transistor is electrically connected to a third wiring, and
wherein the other of the source and a drain of the fourth transistor is electrically connected to a fourth wiring.

2. The display device according to claim 1, further comprising a capacitor,
wherein a first electrode of the capacitor is electrically connected to the gate of the second transistor, and
wherein a second electrode of the capacitor is electrically connected to the second wiring.

3. The display device according to claim 1,
wherein the first wiring is configured to transmit a first clock signal, and
wherein the third wiring is configured to transmit a second clock signal.

4. The display device according to claim 1,
wherein a gate of the first transistor is electrically connected to the output terminal of the shift register.

5. A display device comprising:
a shift register;
a first transistor;
a second transistor;
a third transistor;
a fourth transistor;
a first pixel; and
a second pixel,
wherein an output terminal of the shift register is electrically connected to one of a source and a drain of the first transistor,
wherein the other of the source and the drain of the first transistor is electrically connected to a gate of the second transistor,
wherein one of a source and a drain of the second transistor is electrically connected to a first wiring,
wherein the other of the source and a drain of the second transistor is electrically connected to a second wiring,
wherein the output terminal of the shift register is electrically connected to one of a source and a drain of the third transistor,
wherein the other of the source and the drain of the third transistor is electrically connected to a gate of the fourth transistor,
wherein one of a source and a drain of the fourth transistor is electrically connected to a third wiring,
wherein the other of the source and a drain of the fourth transistor is electrically connected to a fourth wiring,
wherein the second wiring is electrically connected to the first pixel, and
wherein the fourth wiring is electrically connected to the second pixel.

6. The display device according to claim 5, further comprising a capacitor,
wherein a first electrode of the capacitor is electrically connected to the gate of the second transistor, and
wherein a second electrode of the capacitor is electrically connected to the second wiring.

7. The display device according to claim 5,
wherein the first wiring is configured to transmit a first clock signal, and
wherein the third wiring is configured to transmit a second clock signal.

8. The display device according to claim 5,
wherein the a gate of the first transistor is electrically connected to the output terminal of the shift register.

9. A display device comprising:
a shift register;
a first transistor;
a second transistor;
a third transistor; and
a fourth transistor,
wherein an output terminal of the shift register is electrically connected to one of a source and a drain of the first transistor,
wherein the other of the source and the drain of the first transistor is electrically connected to a gate of the second transistor,
wherein one of a source and a drain of the second transistor is electrically connected to a first wiring,
wherein the other of the source and a drain of the second transistor is electrically connected to a first scan line,
wherein the output terminal of the shift register is electrically connected to one of a source and a drain of the third transistor,
wherein the other of the source and the drain of the third transistor is electrically connected to a gate of the fourth transistor,
wherein one of a source and a drain of the fourth transistor is electrically connected to a second wiring,
wherein the other of the source and a drain of the fourth transistor is electrically connected to a second scan line.

10. The display device according to claim 9, further comprising a capacitor,
wherein a first electrode of the capacitor is electrically connected to the gate of the second transistor, and
wherein a second electrode of the capacitor is electrically connected to the first scan line.

11. The display device according to claim 9,
wherein the first wiring is configured to transmit a first clock signal, and
wherein the second wiring is configured to transmit a second clock signal.

12. The display device according to claim 9,
wherein the a gate of the first transistor is electrically connected to the output terminal of the shift register.

* * * * *